United States Patent
Kitahira

(10) Patent No.: US 7,411,527 B2
(45) Date of Patent: Aug. 12, 2008

(54) NOISE SHAPING QUANTIZER

(75) Inventor: Naotake Kitahira, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/723,315

(22) Filed: Mar. 19, 2007

(65) Prior Publication Data

US 2007/0229335 A1  Oct. 4, 2007

(30) Foreign Application Priority Data

Mar. 20, 2006  (JP)  .............................. 2006-076319

(51) Int. Cl.
    *H30M 7/30*  (2006.01)
(52) U.S. Cl. .................. 341/76; 327/105; 327/167; 341/200
(58) Field of Classification Search ............... 341/76, 341/200; 327/167, 105; 708/271
    See application file for complete search history.

(56) References Cited

U.S. PATENT DOCUMENTS

| 5,124,703 | A |   | 6/1992 | Kaneaki et al. |
| 5,396,248 | A | * | 3/1995 | Miyazaki et al. ............ 341/200 |
| 5,508,647 | A | * | 4/1996 | Okamoto .................... 327/167 |
| 6,396,313 | B1 | * | 5/2002 | Sheen ......................... 327/105 |
| 7,143,125 | B2 | * | 11/2006 | Gradishar et al. ........... 708/271 |

FOREIGN PATENT DOCUMENTS

| JP | 6-83150 | 8/1988 |
| JP | 7-79257 | 2/1992 |
| JP | 8-2024 | 2/1992 |

OTHER PUBLICATIONS

Yasuyuki Matsuya et al., "A 17-bit Oversampling D-to-A Conversion Technology Using Multistage Noise Shaping", IEEE Journal of Solid State Circuit, Aug. 1989, vol. 24, No. 4, pp. 969-975.
Naotake Kitahira, U.S. Appl. No. 11/655,061, filed Jan. 19, 2007.

* cited by examiner

*Primary Examiner*—Jean B Jeanglaude
(74) *Attorney, Agent, or Firm*—Wenderoth, Lind & Ponack, L.L.P.

(57) ABSTRACT

A noise shaping quantizer having a first noise shaping quantization unit for applying a first noise shaping operation on an input signal. The first noise shaping quantization unit includes a local quantizer that quantizes the input signal and outputs an output signal; an error accumulator that accumulates at least a part of a value based on the output signal based on at least one of a value based on the input signal and the value based on the output signal, outputs the remaining part, and outputs at least a part of the accumulated value based on the output signal based on at least one of a value based on another input signal and a value based on another output signal at a later clock; an adder to which the output signal and the output of the error accumulator are inputted; a subtractor to which the input signal and the output of the adder are inputted; a delay element to which an output of the subtractor is inputted; and another adder that adds an output of the delay element and an input from external, and outputs the sum to the first local quantizer.

9 Claims, 41 Drawing Sheets

US 7,411,527 B2

NOISE SHAPING QUANTIZER

BACKGROUND OF THE INVENTION

1. Field of the Invention

The present invention relates generally to a quantizer, and more particularly, relates to a noise shaping quantizer.

2. Description of the Prior Art

The quantizer is a major component of any digital signal processing system. Quantization error unavoidably occurs during quantization by the quantizer. Various methods have therefore been used to reduce quantization error, at least in the frequency range of signals of necessary. One method of reducing quantization error is called noise shaping.

FIG. 1 is a block diagram of a multi stage noise shaping quantizer 101 having multiple stages of loops as taught in Patent Reference 1 (Japanese Patent Gazette No. 8-2024-B2). Adders 111 and 113, a first local quantizer 115, a limiter 117, a subtractor 119, and a delay element 121 render a main loop 103 in this multi stage noise shaping quantizer 101. The main loop 103 functions as a single integration noise shaping quantizer implementing first-order noise shaping. Another adder 123, a second local quantizer 125, a subtractor 127, and a feedback circuit 129 render a sub-loop 105. The sub-loop 105 functions as a multi-integration noise shaping quantizer implementing first, second, or higher order noise shaping.

Another delay element 131 and a subtractor 133 render a differentiator 107. The differentiator 107 differentiates the output of the sub-loop 105 corresponding to the noise shaping order of the main loop 103. The output of the main loop 103 and the output of the sub-loop 105 differentiated by the differentiator 107 are added by an adder 109 and outputted. Thus, a multi stage noise shaping quantizer is implemented of which noise shaping order is equal to "the noise shaping order of the sub-loop 105 plus 1." The transfer function H(z) of the feedback circuit 129 in this example provides the sub-loop 105 with a second-order or higher noise shaping characteristic. The output of the feedback circuit 129 in the sub-loop 105 is inputted to the adder 113 of the main loop 103. As a result, the output of the feedback circuit 129 is added to the input to the first local quantizer 115 (that is, the output of the adder 111). The multi stage noise shaping quantizer 101 thus can suppress the quantization error inputted to the sub-loop 105 by adding or subtracting a specific value to or from the input to the first local quantizer 115 based on the output of the feedback circuit 129, and thus enables the sub-loop 105 to operate normally. The first local quantizer 115 then performs quantizing operation to the input, which is equal to the output of the adder 111 plus the output of the feedback circuit 129, and outputs the resultant to the limiter 117. The limiter 117 checks the condition of the differentiator 107, and limits the value of the signal outputted from the limiter 117 based on the condition of the differentiator 107.

The magnitude of the quantization error occurred in the main loop 103 is less than or equal to the range of values of signals inputted to the first local quantizer 115 at the clock (clock cycle) when the limiter 117 does not operate. At the clock when the limiter 117 operates, however, the magnitude of the quantization error occurred in the main loop 103 is greater than the quantization error inferred to occur at the clock when the limiter 117 does not operate. Therefore, the value of the signal inputted to the first local quantizer 115 by way of the delay element 121 and the adder 111 at the clocks after the limiter 117 operates increases, and as a consequence, the first local quantizer 115 may overflow.

FIG. 2 describes the relationship between the value range which may be inputted to the first local quantizer 115 and the actual signal examples actually inputted to the first local quantizer 115. How the first local quantizer 115 in the multi stage noise shaping quantizer 101 in FIG. 1 overflows is described with reference to FIG. 2. The input range 151 of values that can be inputted to the first local quantizer 115 includes the input signal portion 163 such as an audio signal, quantization error portion 161, the feedback output portion 159 from the sub-loop 105, and a signal margin portion 157. The signal margin portion 157 is provided to allow for limit error in the operation of the limiter 117. On the other hand, the input signal 165 to the first local quantizer 115 includes the input signal portion 163, the quantization error portion 161, the feedback output portion 159 of the sub-loop 105, and the limit error portion 155. As a result, the actual input signal 165 to the first local quantizer 115 may exceed the input range 151 of the first local quantizer 115, and an overflow portion 153 may result. This overflow portion 153 is also fed back after one clock. The overflow portion 153 that is fed back is then gradually eliminated over a number of clocks.

The likelihood of an overflow occurring can obviously be suppressed by increasing the size of the margin 157. However, the other portions 159, 161, and 163 must be decreased as the signal margin portion 157 is increased. This narrows the bandwidth that can be used for the input signal portion 163. As a result, the dynamic range of the first local quantizer 115 is also reduced.

Patent Reference 1: Japanese patent gazette No. 8-2024-B2

Non-Patent Reference 1: "A 17-bit oversampling D-to-A conversion technology using multistage noise shaping", Matsuya, Yasuyuki et al., IEEE Journal of Solid State Circuit, Vol. 24, No. 4, August, 1989, pp. 969-975

SUMMARY OF THE INVENTION

If a 0-dB input continues for some period of time with this multi stage noise shaping quantizer 101, the limiter 117 operates frequently and limit error occurs frequently. If limit error occurs frequently, the value of the signal inputted to the first local quantizer 115 in the following clocks rises, and positive feedback is thus applied to the limit error. As a result, the quantizer 101 may overflow or oscillate. It is therefore essential to set a sufficient signal margin portion 157 in the quantizer 101 to prevent such overflow or oscillation.

The Noise shaping quantizer according to the present invention enables stable operation and maintains a good distortion factor without overflowing or oscillating even when, for example, 0 dB input continues and limit error or other error occurs frequently in the noise shaping operation.

The noise shaping quantizer according to another aspect of the invention operates stably and maintains a good distortion factor without overflowing or oscillating without providing a signal margin portion 157 as described above or at least setting a smaller margin than is required by the prior art described above.

A noise shaping quantizer according to a first aspect of the invention has a first noise shaping quantization unit which applies a first noise shaping operation on an input signal. The first noise shaping quantization unit includes: a local quantizer which quantizes the input signal and outputs an output signal; an error accumulator which accumulates at least a part of a value based on the output signal based on at least one of a value based on the input signal and a value based on the output signal, outputs the remaining part, and outputs at least a part of the accumulated value which is based on the output value based on at least one of a value based on another input signal and a value based on another output signal at a later clock; a subtractor to which the input signal and the output of the error accumulator are inputted; a delay element to which the output of the subtractor is inputted; and a first adder which adds the output of the delay element and an input from external, and outputs the sum to the local quantizer.

Preferably, the first noise shaping quantization unit also has an error detector which detects quantization error occurring during quantization by the local quantizer; and the value based on the output signal includes the quantization error in the quantization by the local quantizer, the quantization error being detected by the error detector.

In another preferred aspect of the invention the first noise shaping quantization unit also has a limiter which limits an output amplitude of the output signal; and the value based on the output signal includes limit error from output amplitude limiting by the limiter.

In another aspect of the invention the first noise shaping quantization unit also has an overflow error detector which checks the input signal, subtracts an overflow amount which causes the local quantizer to overflow from the input signal, outputs the subtracted input signal to the local quantizer, and outputs the overflow amount to the error accumulator; and the value based on the input signal includes the overflow amount.

In another aspect of the invention the first noise shaping quantization unit also has an overflow detector which checks the input signal and outputs to the error accumulator a signal denoting whether the local quantizer is in an overflow condition; and the value based on the input signal includes the signal denoting whether the local quantizer is in the overflow condition.

Yet further preferably, the noise shaping quantizer additionally has a second noise shaping quantization unit to which error occurring in the first noise shaping operation is inputted and which applies a second noise shaping operation to the inputted error; a differentiator which differentiates an output of the second noise shaping quantization unit according to the shaping order of the first noise shaping quantization unit; and a second adder which adds an output of the first noise shaping quantization unit and an output of the differentiator, and outputs a result. The second noise shaping quantization unit outputs as feedback output to the first noise shaping quantization unit a value based on the second noise shaping operation. The first noise shaping quantization unit further includes a limiter which limits an output amplitude of the output signal, the limiter limits an output amplitude of the value based on the output signal based on the output of the differentiator. In this aspect of the invention the value based on the output signal includes limit error produced by output amplitude limiting by the limiter, and the feedback output.

In the noise shaping quantizer according to this aspect of the invention the first noise shaping quantization unit also preferably has an overflow error detector which checks the input signal, subtracts an overflow amount which causes the local quantizer to overflow from the input signal, outputs the subtracted input signal to the local quantizer, and outputs the overflow amount to the error accumulator; and the value based on the input signal includes the overflow amount.

In the noise shaping quantizer according to this aspect of the invention the first noise shaping quantization unit also has an overflow detector which checks the input signal and outputs to the error accumulator a signal denoting whether the local quantizer is in an overflow condition; and the value based on the input signal includes the signal denoting whether the local quantizer is in the overflow condition.

Yet further preferably, the first noise shaping quantization unit also has an amplitude controller which limits a size of a portion of the limit error occurring during output amplitude limiting by the limiter that is inputted to the second noise shaping quantization unit based on the output of the differentiator and the feedback output.

The noise shaping quantizer according to the present invention has a means (an error accumulator (error accumulation circuit)) for accumulating and appropriately outputting at a later clock a part of a quantity flowing through the noise shaping quantizer. Said means enables the noise shaping quantizer of the invention to operate stable and maintain a good distortion factor without overflowing or oscillating even under conditions in which errors occur frequently.

The noise shaping quantizer of the invention operates stably and maintains a good distortion factor without using the margin that is required by the prior art to accommodate a rise in error in the quantizer or at the very least using a smaller margin than is needed by the prior art. The noise shaping quantizer of the invention can therefore operate stably and maintain a good distortion factor while affording a higher dynamic range in the input signal than the prior art. Other objects and attainments together with a fuller understanding of the invention will become apparent and appreciated by referring to the following description and claims taken in conjunction with the accompanying drawings.

BRIEF DESCRIPTION OF THE DRAWINGS

These and other objects, aspects and embodiments of the present invention will more fully apparent as the following description is read in light of the attached drawings wherein.

DETAILED DESCRIPTION OF THE PREFERRED EMBODIMENTS

The noise shaping quantizer according to the present invention temporarily accumulates errors that occur during the noise shaping operation, and feeds back the temporarily accumulated errors during a later clock in which the local quantizer operation is stable. This improves the operating stability of the noise shaping quantizer, and reduces the distortion factor of the output signal.

Preferred embodiments of the present invention are described below with reference to the accompanying figures.

First Embodiment

The first embodiment of the invention includes a multi stage noise shaping quantizer, variations thereof, and a noise shaping quantizer with a single integration stage.

(Multi Stage Noise Shaping Quantizer)

Figure 3:
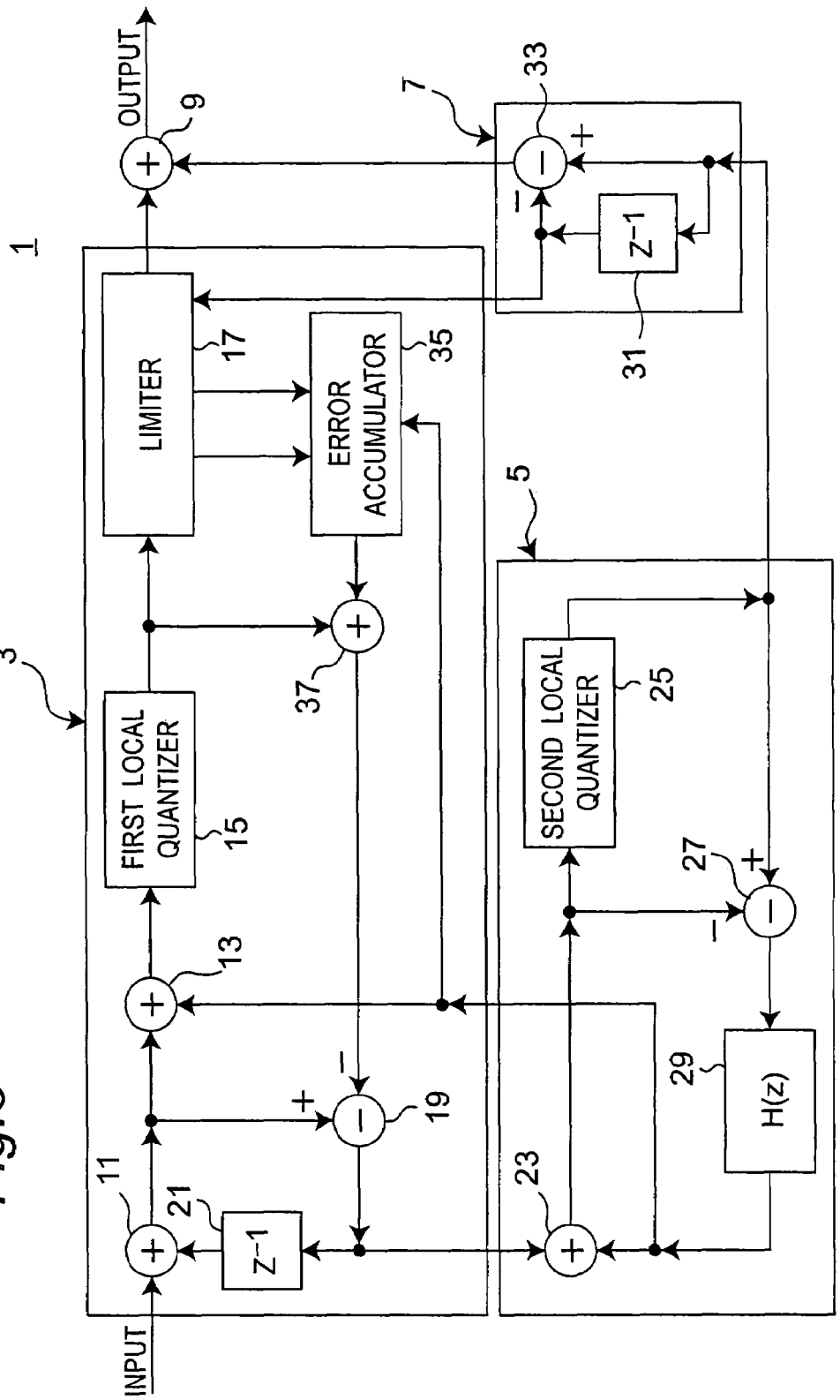
FIG. 3 is a block diagram of a multi stage noise shaping quantizer according to a first embodiment of the invention.

FIG. 3 is a block diagram of a multi stage noise shaping quantizer 1 according to a first embodiment of the invention. This multi stage noise shaping quantizer 1 has a main loop 3, a sub-loop 5, a differentiator 7, and an adder 9.

The main loop 3 includes an adder 11, an adder 13, a first local quantizer 15, a limiter 17, an error accumulator 35, an adder 37, a subtractor 19, and a delay element 21, and renders a single integration noise shaping quantizer (first noise shaping quantizer) for first-order noise shaping.

The sub-loop 5 includes an adder 23, a second local quantizer 25, a subtractor 27, and a feedback circuit 29, and renders a multi-integration noise shaping quantizer (second noise shaping quantizer) with first, second, or higher order noise shaping.

The differentiator 7 includes a delay element 31 and a subtractor 33. The differentiator 7 differentiates the output of the sub-loop 5 according to the noise shaping order of the main loop 3, and outputs to the adder 9.

The adder 9 sums the output of the main loop 3 and the output of the sub-loop 5 differentiated by the differentiator 7, and outputs the result.

The multi stage noise shaping quantizer 1 thus arranged renders a multi stage noise shaping quantizer for (noise shaping order of the sub-loop 5+1)-order noise shaping.

The operation of the feedback circuit 29 in the sub-loop 5 is described first. The transfer function H(z) of the feedback circuit 29 can be set so that the sub-loop 5 is of the second or higher noise shaping order. This transfer function H(z) could be as defined in equation 1, for example.

$$H(z) = \frac{-2z^{-1} + 2.5z^{-2} - z^{-3}}{1 - z^{-1} + 0.5z^{-2}} \quad (1)$$

In equation (1) the coefficient of all factors of transfer function H(z) is 2, 1, 0.5 or the sum or difference of any combination of these values. The transfer function H(z) with these coefficients can be achieved using only a bit shifter and adder/subtractor. Using this transfer function H(z) is therefore convenient because it also enables reducing the size of the circuit. The gain of this transfer function H(z) is also flat in the high frequency band outside the audible frequency band if the input is an audio signal, and the gain-frequency characteristic is substantially equal to the maximum gain of 2.64. Using this transfer function H(z) enables effective noise shaping particularly for high quantization error values. This also makes this transfer function H(z) (equation (1)) particularly convenient. This aspect of the invention returns the output from the feedback circuit 29 to the main loop 3 as feedback output from the sub-loop 5 to the main loop 3.

The adder 13 of the main loop 3 adds the input to the first local quantizer 15 by a predetermined value based on the feedback output of the sub-loop 5. This changes the value of the signal input to the first local quantizer 15, changes the value (quantization error produced by the first local quantizer 15 and limit error produced by the limiter 17) of the signal output to the sub-loop 5, and causes the sub-loop 5 to operate stably. Note that this "quantization error" denotes the difference between the input and output values resulting from quantization (such as quantization by the first local quantizer 15), and the "limit error" denotes the difference between the input and output values due to amplitude limiting (such as limiting the output amplitude of the limiter 17 relative to the input to the limiter 17).

If the feedback output from the sub-loop 5 to the main loop 3 is a high positive value, for example, the adder 13 adds a high positive value to the input signal to the first local quantizer 15. The first local quantizer 15 then quantizes this sum of the adder 11 output plus this high positive value. To simplify, it will be understood that the subtractor 19 outputs a high negative value if the effect of the operation of the limiter 17 and the error accumulator 35 is ignored. A high negative value is therefore input to the adder 23 and the input to the sub-loop 5 gradually decreases. Operation of the sub-loop 5 is thus stabilized.

Before the feedback output of the sub-loop 5 is inputted to the adder 13 and the error accumulator 35 the feedback output could be multiplied by a multiplier not shown and then input to the adder 13 and the error accumulator 35.

The sub-loop 5 could also include an integrator not shown. In this case the feedback output of the sub-loop 5 could be the output of the integrator.

This aspect of the invention adds or subtracts a predetermined value determined by the feedback output of the sub-loop 5 to the input signal to the first local quantizer 15 (that is, the signal output by the adder 11). However, this arrangement could be replaced by shifting the quantization table of the first local quantizer 15 according to the feedback output of the sub-loop 5 to achieve the same effect stabilizing the operation of the sub-loop 5.

More specifically, the same effect of stabilizing the operation of the sub-loop 5 can be achieved using a method of controlling the value of the signal output from the main loop 3 to the sub-loop 5 based on the feedback output from the sub-loop 5 to the main loop 3.

Quantization by the first local quantizer 15 and amplitude limiting the output of the first local quantizer 15 by the limiter 17 are described next.

The first local quantizer 15 quantizes the sum of the output of the adder 11 plus a value determined by the output of the feedback circuit 29, and outputs the result to the limiter 17. The limiter 17 takes the output of the first local quantizer 15, limits the amplitude range of the output value based on the condition of the differentiator 7, and preferably the condition of the delay element 31, and outputs the amplitude-limited value to the adder 9 and the error accumulator 35. The limiter 17 limits the value of the output from the main loop 3 so that the sum of the value of the output of the differentiator 7 and the value of the output from the main loop 3 to the adder 9 does not exceed the output resolution of the multi stage noise shaping quantizer 1.

The effect of output amplitude limiting by the limiter 17 is to variably control the range of values outputted from the limiter 17 according to the condition of the differentiator 7. The range of output values is therefore increased when the range of values that are outputted can be increased, and this expanded range of output values is beneficially used for signal output from the main loop 3.

The limiter 17 outputs to the adder 9 after limiting the output of the first local quantizer 15 to a predetermined value range (amplitude) by thus limiting the output amplitude, and at the same time outputs the error (limit error) occurring during this output amplitude limiting operation to the error accumulator 35. The limiter 17 also has a function for determining the sign of the output value of the first local quantizer 15, and has a function for outputting this sign to the error accumulator 35 as a first local quantizer output sign signal. The sign of the output of the first local quantizer 15 and the sign of the output of the limiter 17 to the adder 9 are always the same. The limiter 17 can therefore simply determine the sign of the limiter 17 outputted to the adder 9 and output the result as a first local quantizer output sign signal to the error accumulator 35.

The operation of the error accumulator 35 is described next. The feedback output from the sub-loop 5 to the main loop 3 is also inputted to the error accumulator 35, which determines the value of the output to the adder 37 based on the feedback output to the error accumulator 35. As a result, the limit error produced by the output amplitude limiting of the limiter 17 can be appropriately fed back to the main loop 3 and the sub-loop 5 so that the first local quantizer 15 and the second local quantizer 25 do not overflow. The first and second local quantizers 15 and 25 are thus prevented from overflowing, and the dynamic range of the input signal (such as an audio signal) that is quantized by the first local quantizer 15 can be increased.

The error accumulator 35 takes the limit error from the limiter 17 and outputs the received limit error to the adder 37 at a later clock. The error accumulator 35 can adjust the amount of limit error outputted to the adder 37 at each clock. To make this adjustment, the error accumulator 35 can temporarily store the limit error produced by the limiter 17, and determines the sign of the input from the limiter 17 and the sign of the feedback output of the feedback circuit 29 in the sub-loop 5. Based on these signs, the error accumulator 35 determines at each clock whether to output the accumulated limit error to the adder 37 and determines the output level if the limit error is to be outputted, and then outputs accordingly to the adder 37. The error accumulator 35 thus temporarily stores the limit error, determines the output level of the limit error at each clock, and outputs the limit error to the adder 37 accordingly.

The operation of the error accumulator 35 is described in further detail below with reference to FIG. 3, FIG. 4, and FIG. 5.

Figure 4:
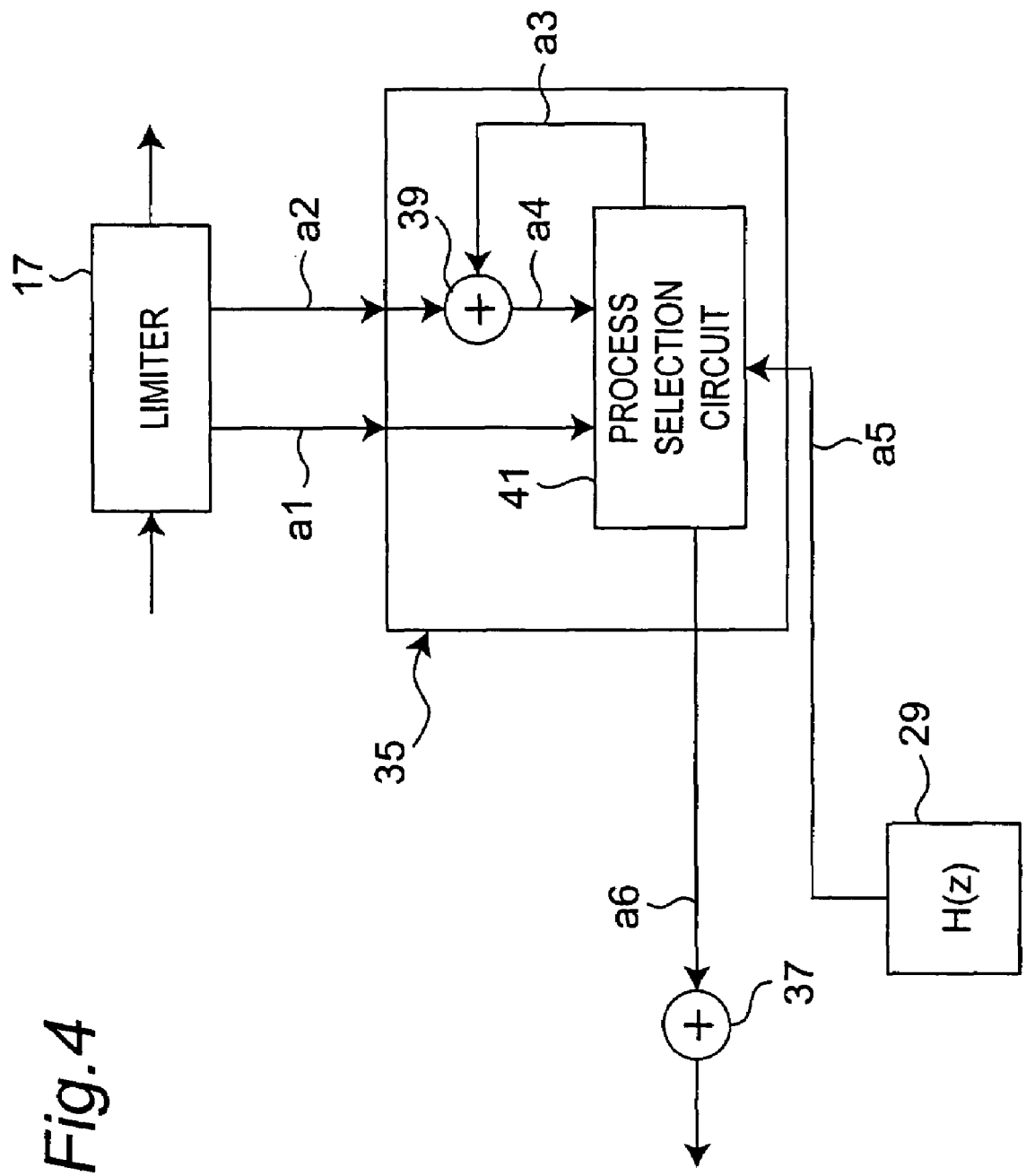
FIG. 4 is a block diagram of the error accumulator in the first embodiment of the invention.

FIG. 4 is a block diagram showing the error accumulator 35 in detail. As shown in FIG. 4, the error accumulator 35 has an adder 39 and a process selection circuit 41. The limit error (new limit error) a2 outputted from the limiter 17 and the limit error (cumulative limit error) a3 currently stored by the process selection circuit 41 are inputted to the adder 39, which adds the inputs and outputs the sum as the updated cumulative limit error a4 to the process selection circuit 41. The first local quantizer output sign signal a1 outputted from the limiter 17, the feedback output a5 of the sub-loop 5, and the updated cumulative limit error a4 outputted from the adder 39 are inputted to the process selection circuit 41. Based on these inputs the process selection circuit 41 determines the level of limit error a6 outputted to the adder 37, and based on this level outputs the limit error a6 to the adder 37.

FIG. 5(a) shows the input range 51 that can be inputted to the first local quantizer 15 without causing the quantizer to overflow and the components (portions) in this range, and (b) and (c) show examples of input signals actually inputted to the first local quantizer 15. How the value of the limit error a6 output from the error accumulator 35 to the adder 37, and more specifically the limit error a6 outputted from the process selection circuit 41 to the adder 37, is determined is described more specifically below.

Figure 1:
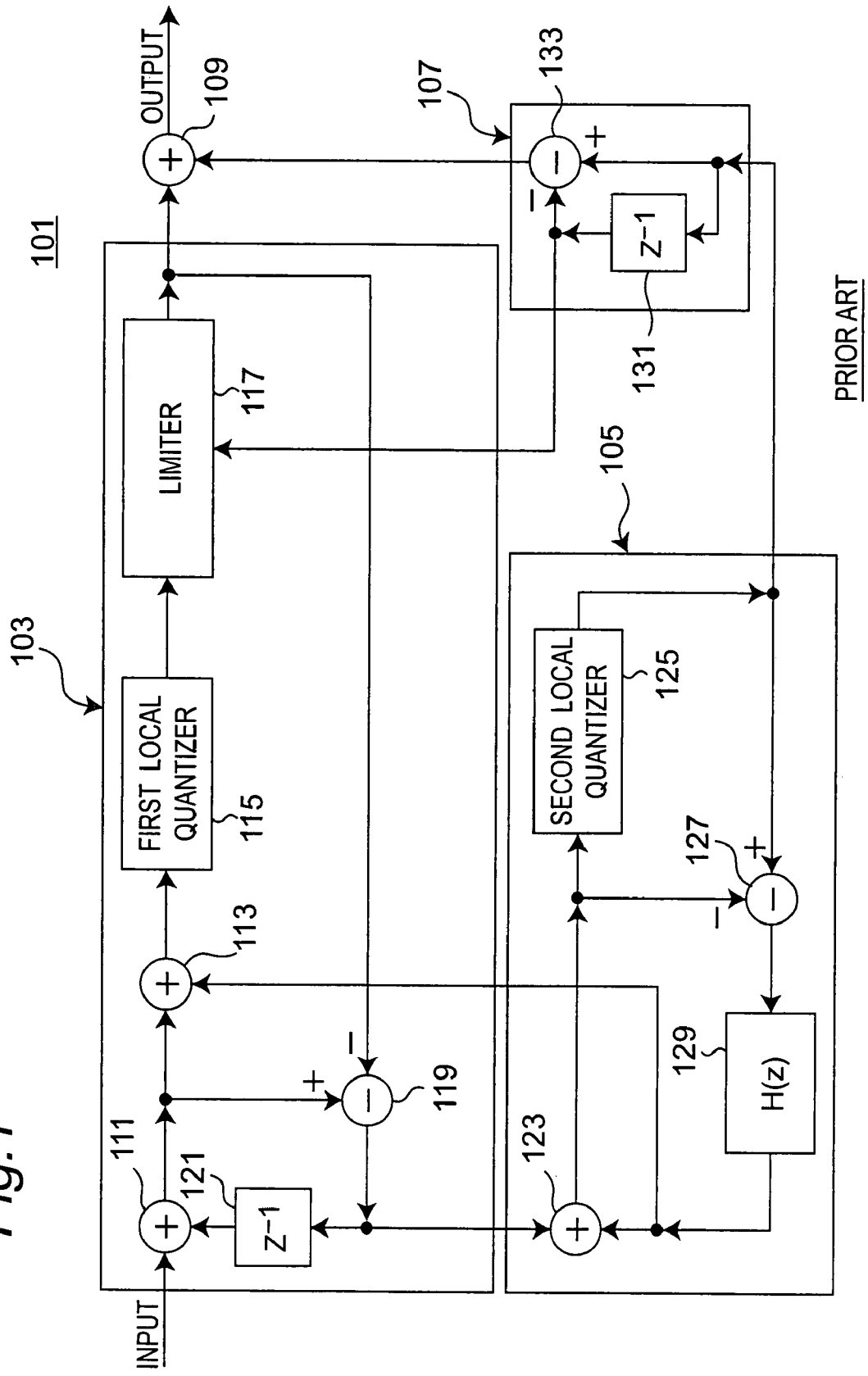
FIG. 1 is a block diagram of a multi stage noise shaping quantizer according to the prior art.
Figure 2:
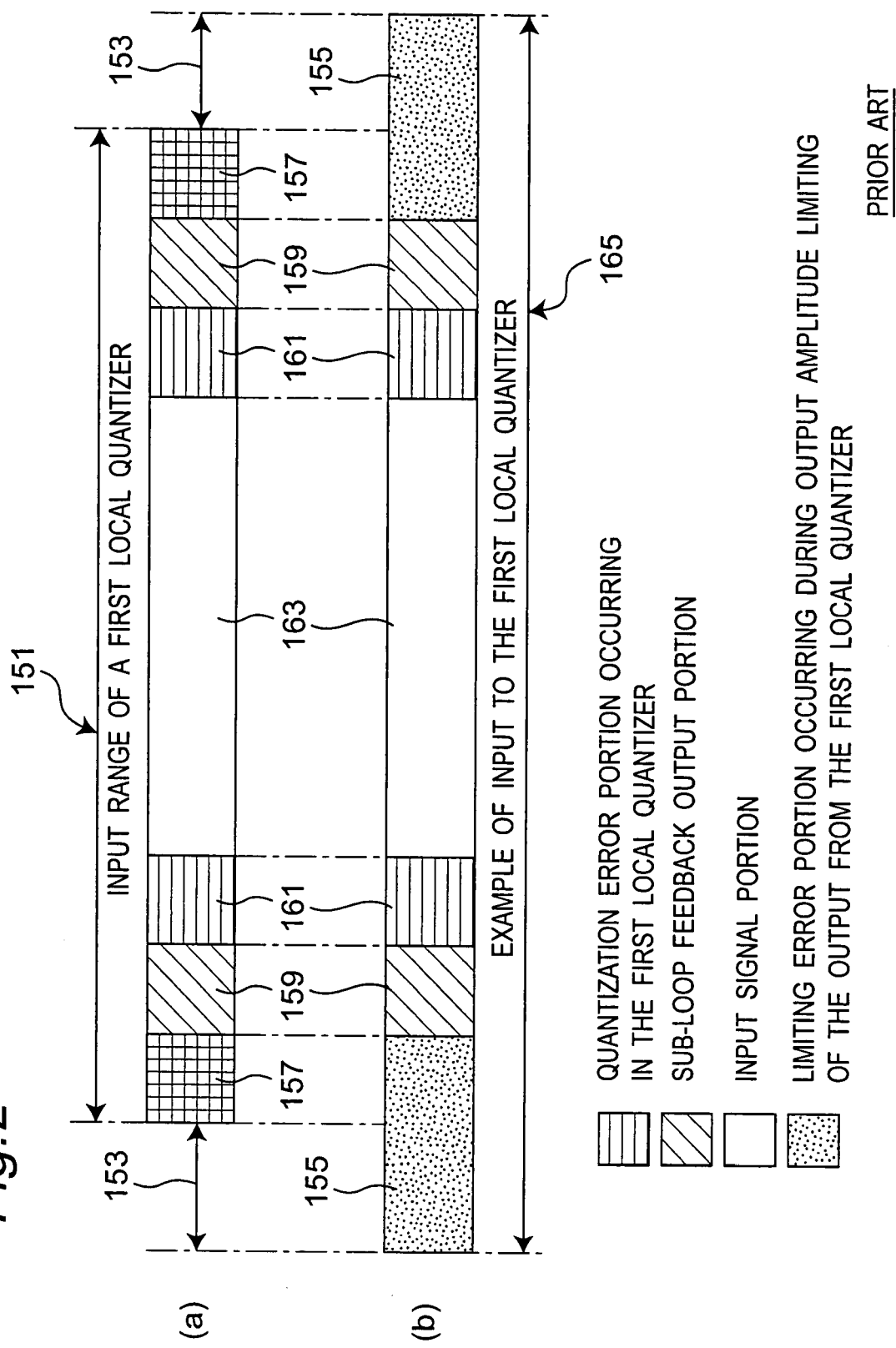
FIG. 2 describes the input/output relationship of the local quantizer in the main loop according to the prior art.

The input range 51 includes an input signal portion 63 such as an audio signal, a quantization error portion 61, and a feedback output portion 59 from the sub-loop 5. The input range 51 could also include a margin but the margin in this example is zero. More specifically, this embodiment of the invention does not set a margin anticipating the limit error in the operation of the limiter 117 as does the prior art described in FIG. 2. As a result, the range allocated to the input signal portion 63, for example, can be increased compared with the prior art.

FIGS. 5(b) and (c) are examples of the signals inputted to the first local quantizer 15 when the feedback output from the sub-loop 5 and the output from the adder 11 are the same sign, and when the feedback output from the sub-loop 5 and the output from the adder 11 are opposite sign, respectively.

Referring to FIG. 5(b), when the feedback output from the sub-loop 5 and the output from the adder 11 are the same sign, the input to the first local quantizer 15 includes the input signal portion 63 such as an audio signal, a quantization error portion 61, and a feedback output portion 59 from the sub-loop 5. The input range 51 is filled by these three portions. If limit error caused by the output amplitude limiting by the limiter 17 is then additionally input to the first local quantizer 15, the first local quantizer 15 will overflow. To prevent the first local quantizer 15 from overflowing in this case, the error accumulator 35 therefore outputs zero to the adder 37 or does not output.

If the feedback output from the sub-loop 5 and the output from the adder 11 are opposite sign, the feedback output from the sub-loop 5 is added to the output from the adder 11 by the adder 13 and the resulting sum is within the bounds of the input signal portion 63. The feedback output portion 59 is therefore not used in this case and is left. To prevent the first local quantizer 15 from overflowing in this case, the error accumulator 35 outputs limit error within the bounds of the feedback output portion 59 from the accumulated limit error to the adder 37. Therefore, as shown in FIG. 5(c), when the feedback output from the sub-loop 5 and the output from the adder 11 are opposite sign, the input to the first local quantizer 15 includes the input signal portion 63 such as an audio signal, the quantization error portion 61, and a limit error portion 55.

Conditions determining the output level from the error accumulator 35 to the adder 37 in order to prevent the first local quantizer 15 from overflowing are considered above. Conditions determining the output level from the error accumulator 35 to the adder 37 in order to prevent the second local quantizer from overflowing are considered below.

The magnitude of the value (the output of the subtractor 19 in the main loop 3 (that is, the sum of the quantization error of the main loop 3 and the limit error output from the error accumulator 35 (referred to below as the "sub-loop input range"))) that can be inputted from the main loop 3 to the adder 23 without causing the second local quantizer 25 to overflow can be determined by a value which is obtained by dividing the input range to the second local quantizer 25 by the gain of the feedback circuit 29 of the sub-loop 5.

The error accumulator 35 determines the output level to the adder 37 that will not cause the second local quantizer 25 to overflow based on a predetermined sub-loop input range and whether the sign denoted by the first local quantizer output sign signal (the sign of the output of the first local quantizer 15) and the sign of the feedback output from the sub-loop 5 are the same or different.

If the sign denoted by the first local quantizer output sign signal and the sign of the feedback output from the sub-loop 5 are the same, the limit error occurring from output amplitude limiting by the limiter 17 and the feedback output from the sub-loop 5 are the same polarity. The error accumulator 35 can therefore determine the level of the output limit error based on feedback from the sub-loop 5 so that the limit error outputted to the adder 37 does not exceed the range obtained by subtracting the feedback from the sub-loop input range.

If the sign denoted by the first local quantizer output sign signal and the sign of the feedback output from the sub-loop 5 are different, the limit error occurring from output amplitude limiting by the limiter 17 and the feedback output from the sub-loop 5 are opposite polarity. In this case it is not necessary to consider the feedback output from the sub-loop 5, and the error accumulator 35 can determine the level of the output limit error so that the limit error outputted to the adder 37 does not exceed the sub-loop input range.

Based on these conditions, the error accumulator 35, or more particularly the process selection circuit 41 of the error accumulator 35, determines the range of outputs to the adder 37 that will not cause the first local quantizer 15 to overflow and the range of outputs to the adder 37 that will not cause the second local quantizer 25 to overflow.

If the first and second local quantizers 15 and 25 are determined to be stable (the sign denoted by the first local quantizer output sign signal and the sign of the feedback output from the sub-loop 5 are opposite), the process selection circuit 41 determines whether the absolute value of the output to the adder 37 that prevents the first local quantizer 15 from overflowing or the absolute value of the output to the adder 37 that prevents the second local quantizer 25 from overflowing is smaller, sets the output a6 to the lesser of these absolute values, and then outputs this limit error a6 to the adder 37. The process selection circuit 41 thus determines the range of outputs a6 to the adder 37 based on the sign denoted by the first local quantizer output sign signal and the sign of the feedback output a5 from the sub-loop 5 so that neither of the first and second local quantizers 15 and 25 overflows, and determines the output a6 from the error accumulator 35 to the adder 37.

This embodiment of the invention determines the output a6 from the error accumulator 35 to the adder 37 using values that can be predetermined when designing the circuit. However, if the process selection circuit 41 is arranged so that the process selection circuit 41 can determine the range of outputs a6 to the adder 37 at each clock by referencing the actual value of the feedback output a5 from the sub-loop 5, the range of values that can be outputted to the adder 37 can be determined more precisely. This is because the margin of the feedback output portion 59 of the first local quantizer 15 in the main loop 3 can be more accurately determined by using the actual feedback output a5 of the sub-loop 5. At the same time, the range of values that can be outputted from the main loop 3 to the adder 23 of the sub-loop 5 can also be determined more precisely.

The operation of the error accumulator 35 is described in further detail below with reference to the flow chart in FIG. 6.

In step S101, the error accumulator 35 (more specifically the adder 39) gets the limit error from output amplitude limiting by the limiter 17 as the new limit error a2.

In step S103, the error accumulator 35 (more specifically the adder 39) adds this new limit error a2 and the currently stored limit error (cumulative limit error) a3 to get the updated cumulative limit error a4.

In step S105, the error accumulator 35 (more specifically the process selection circuit 41) limits the updated cumulative limit error a4 to a predetermined value range and accumulates the limited updated cumulative limit error. The predetermined value range used here is the range from the maximum value to the minimum value that can be stored by the process selection circuit 41. The limiting operation of this step can be skipped if the updated cumulative limit error a4 is within this predetermined range of values.

In step S107, the error accumulator 35 (more specifically the process selection circuit 41) compares the updated cumulative limit error a4 with the cumulative limit error to get the value of the new limit error. If the process selection circuit 41 determines that the difference between the updated cumulative limit error a4 and the cumulative limit error a3 is zero, the process selection circuit 41 determines that the limiter does not operate (step S107 returns No), and control goes to step S109. If the difference is a non-zero value, the process selection circuit 41 knows that the limiter 17 operates (step S107 returns Yes) and control goes to step S117.

In step S109, the error accumulator 35 (more specifically the process selection circuit 41) compares the sign denoted by the first local quantizer output sign signal a1 and the sign of the feedback output a5 from the sub-loop 5, and determines if they are opposite. If the signs are opposite (step S109 returns Yes), control goes to step S111. If they are the same sign (step s109 returns No), control goes to step S117.

In step S111, the error accumulator 35 (more specifically the process selection circuit 41) compares the range of output values to the adder 37 that will not cause the first local quantizer 15 and the second local quantizer 25 to overflow in the case that the sign denoted by the first local quantizer output sign signal a1 and the sign of the feedback output a5 from the sub-loop 5 are different with the updated cumulative limit error. If the updated cumulative limit error is outside this range of outputs to the adder 37 (step S111 returns Yes), control goes to step S113. If the updated cumulative limit error is not outside the range of outputs to the adder 37 (step S111 returns No), control goes to step S115.

In step S113, the error accumulator 35 (the process selection circuit 41) outputs as the limit error a6 outputted to the adder 37 the value that is closest to the updated cumulative limit error and is in the range of output values to the adder 37 that will not cause the first local quantizer 15 and the second local quantizer 25 to overflow when the sign denoted by the first local quantizer output sign signal a1 and the sign of the feedback output a5 from the sub-loop 5 are opposite. The process selection circuit 41 also stores the difference of the updated cumulative limit error minus the output limit error as the cumulative limit error.

In step S115, the error accumulator 35 (more specifically the process selection circuit 41) outputs the total updated cumulative limit error as the output a6 to the adder 37. The process selection circuit 41 also stores zero as the cumulative limit error.

In step S117, the error accumulator 35 (more specifically the process selection circuit 41) outputs zero to the adder 37 or does not output. This is because if step S117 is called the first and second local quantizers 15 and 25 are unstable and could overflow. Note that the decision of step S107 is not essential.

By arranging the error accumulator 35 to operate in this way, the first local quantizer 15 can be prevented from overflowing as a result of output amplitude limiting by the limiter 17, and the main loop 3 can be kept stable. The new limit error a2 produced by the output amplitude limiting of the limiter 17 is temporarily stored by the error accumulator 35 and output appropriately at a later clock. Deterioration in the distortion factor of the signal output from the adder 9 is thus also prevented.

The process of limiting the value range of the updated cumulative limit error in step S105 is to prevent from delaying the timing at which the accumulated limit error is returned to the adder 37 due to the frequent operating of the limiter 17 and causing the limit error a6 to become noise. The quantizer 1 can operate normally without running the process of step S105 as long as the limiter 17 does not operate frequently.

This aspect of the invention effectively prevents the first local quantizer 15 from overflowing. A predetermined value determined by the value of the feedback output a5 from the feedback circuit 29 in the sub-loop 5 is therefore added or subtracted from the output of the adder 11 to optimize the value outputted from the main loop 3 to the adder 23 and thereby enable the sub-loop 5 to operate normally. The stability of the main loop 3 and the sub-loop 5 is thus dramatically improved.

Furthermore, by suitably limiting the value outputted from the main loop 3 to the adder 23 in the sub-loop 5, the second noise shaping quantization unit (sub-loop 5) can operate stably.

This aspect of the invention also stabilizes the main loop 3 by appropriately controlling the limit error and quantization error fed back to the main loop 3. The margin portion of the input range 51 for the first local quantizer 15 can also be eliminated, or the size of the margin portion relative to the input range 51 can be minimized. The proportion of the input range 51 to the first local quantizer 15 that is allocated to the input signal portion 63 (such as an audio signal) can therefore be increased, and the dynamic range of the input signal can be increased.

(Variation of the Multi Stage Noise Shaping Quantizer)

Figure 7:
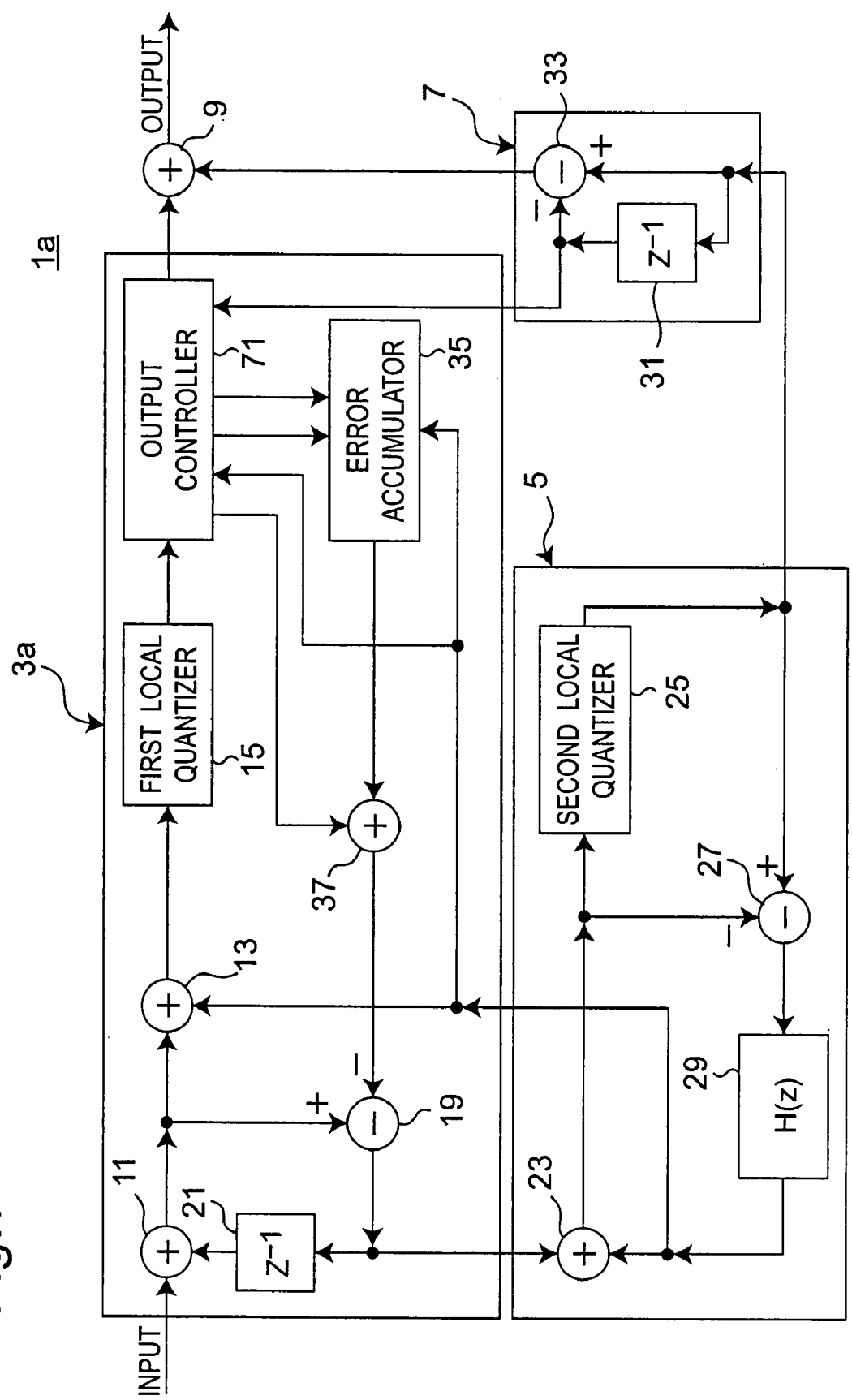
FIG. 7 is a block diagram of a variation of the first embodiment of the invention.

FIG. 7 is a block diagram of a multi stage noise shaping quantizer 1a according to a variation of the first embodiment of the invention. This multi stage noise shaping quantizer 1a is described below with reference to FIG. 7. The main loop 3a of this multi stage noise shaping quantizer 1a uses an output controller 71 instead of a limiter 17. As described below, this output controller 71 has a limiter 17 and an amplitude controller 73. Relative to the object of this invention, this multi stage noise shaping quantizer 1a is as effective or is more effective than the multi stage noise shaping quantizer 1 described above.

Figure 8:
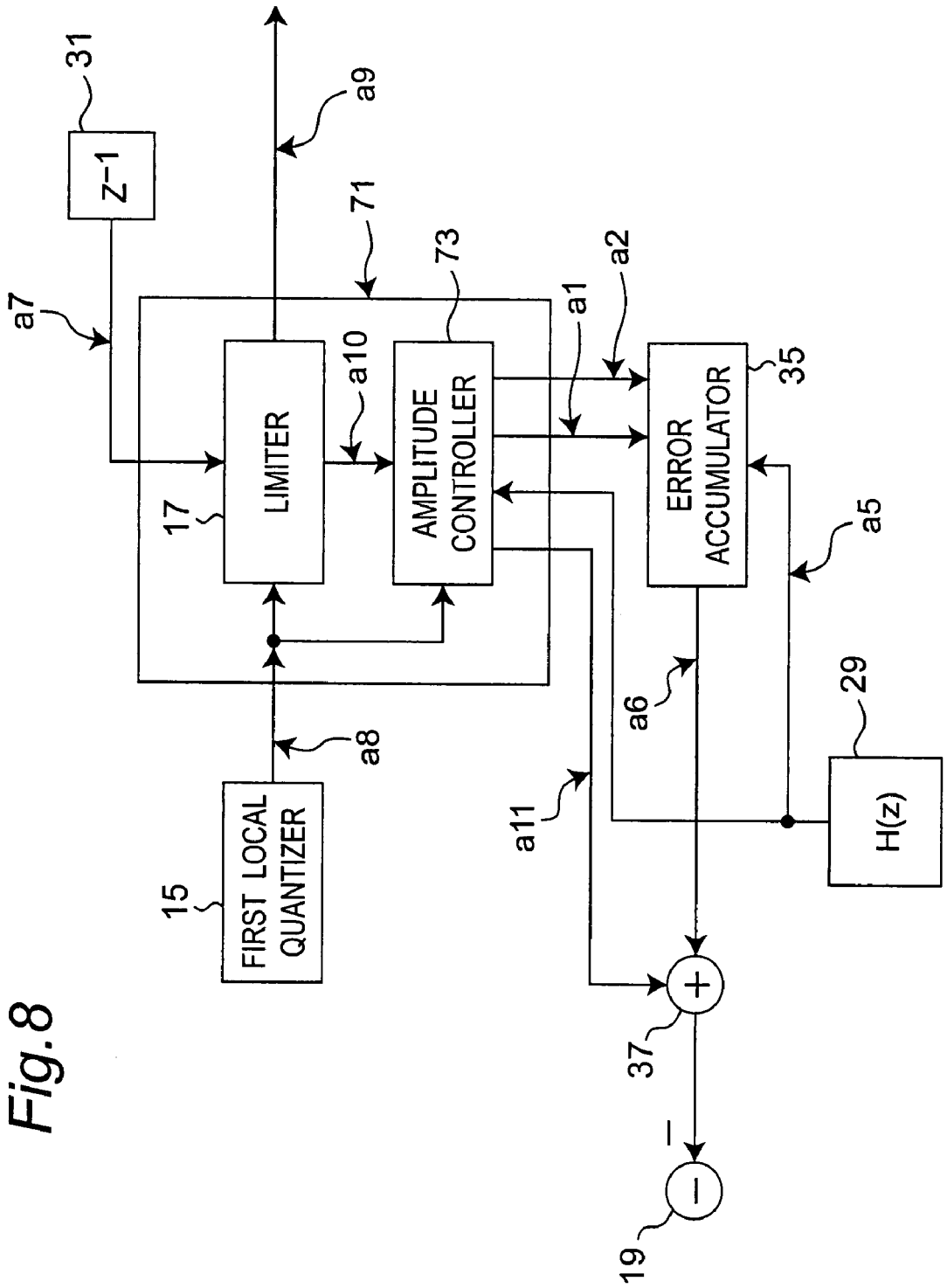
FIG. 8 is a block diagram of the output controller in a variation of the first embodiment of the invention.

FIG. 8 is a detailed block diagram of the output controller 71. As shown in FIG. 8, the output controller 71 has a limiter 17 and an amplitude controller 73.

The limiter 17 limits the output amplitude of the output a8 of the first local quantizer 15 based on the output a7 from the differentiator 7 or the delay element 31 to determine the output a9 to the adder 9. Based on the condition a7 of the differentiator 7 (the value from the delay element 31), the limiter 17 controls the maximum and minimum of the values inputted from the first local quantizer 15 and outputs the controlled value to the adder 9 so that the sum of the output value from the differentiator 7 and the output a9 to the adder 9 does not exceed the output resolution of the multi stage noise shaping circuit. As a result, the output of the first local quantizer 15 can be variably expanded according to the output value of the differentiator 7.

The input a8 to the limiter 17, a signal a10 denoting the operating condition of the limiter 17, and the feedback output a5 from the sub-loop 5 are inputted to the amplitude controller 73. The amplitude controller 73 computes the limit error produced by the limiter 17 from the input a8 to the limiter 17 and the signal a10 denoting the operating condition of the limiter 17. The amplitude controller 73 also gets information relating to the sign of the feedback output a5 from the feedback output a5 inputted from the sub-loop 5. Based on the sign of the output a8 from the first local quantizer 15 and the feedback output a5 from the sub-loop 5, the amplitude controller 73 then determines if an overflow will occur if the limit error is applied to the main loop 3a and the sub-loop 5. Based on the result, the amplitude controller 73 outputs limit error within the range that will not cause the main loop 3a and the sub-loop 5 to overflow as the output a11 to the adder 37, and outputs the remaining limit error to the error accumulator 35 as the new limit error a2.

The amplitude controller 73 determines the limit error output to the adder 37 using the same basic process determining the limit error output of the error accumulator 35 in the multi stage noise shaping quantizer 1 described above. More specifically, the amplitude controller 73 outputs limit error to the adder 37 in a range of values that will not cause the main loop 3a and sub-loop 5 to overflow based on whether the sign of the feedback output a5 of the sub-loop 5 and the sign of the output from the adder 11 are the same or different. The limit error not outputted from the amplitude controller 73 to the adder 37 is outputted to the error accumulator 35 as the new limit error (a2) as in the multi stage noise shaping quantizer 1 described above.

Figure 9:
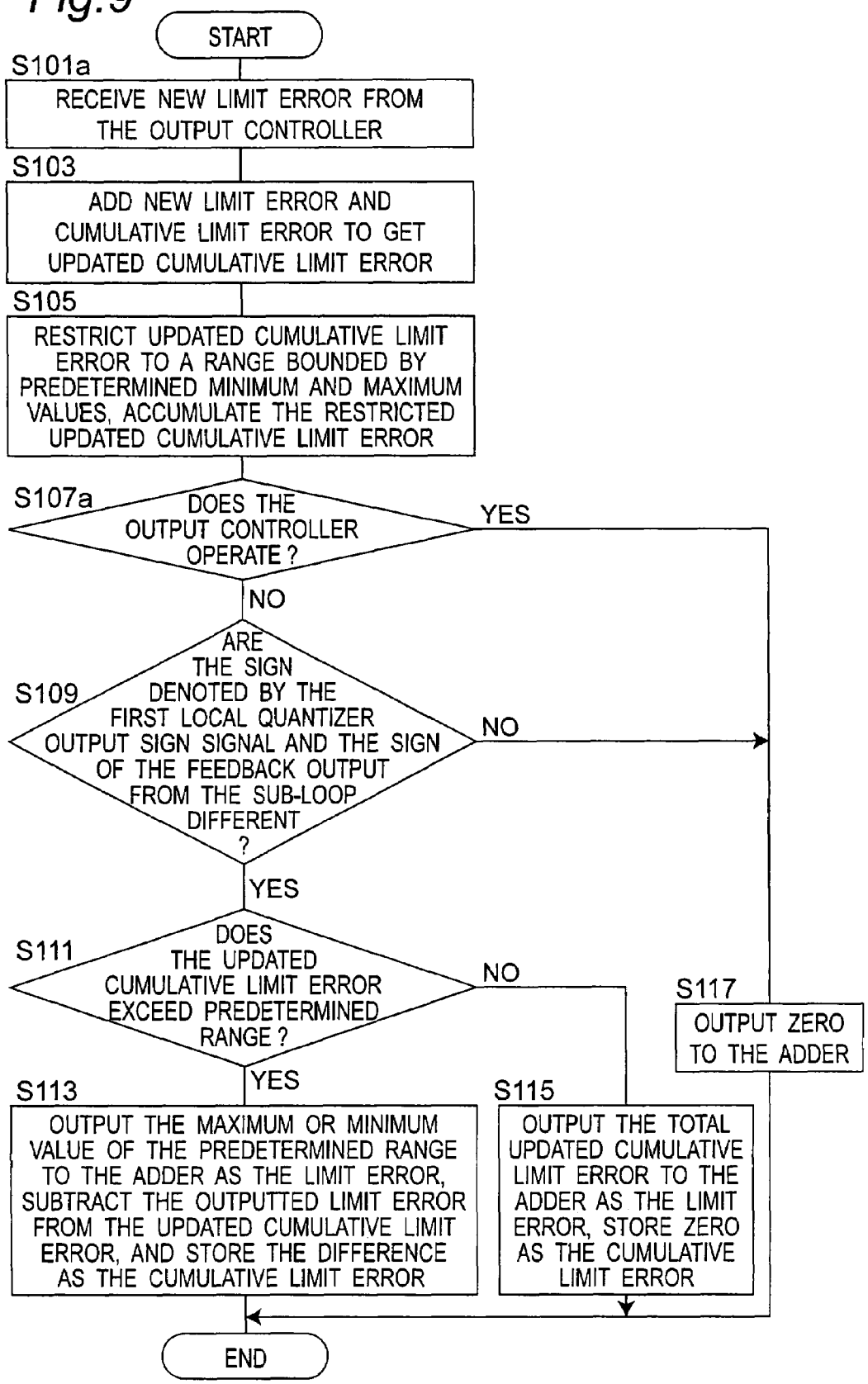
FIG. 9 is a flow chart describing the operation of this variation of the first embodiment of the invention.

FIG. 9 is a flow chart describing the operation of the error accumulator 35 in this multi stage noise shaping quantizer 1a. Steps that are the same as in the flow chart shown in FIG. 6 describing the operation of the error accumulator 35 in the multi stage noise shaping quantizer 1 described above are identified by the same reference numerals and further description thereof is omitted.

Figure 6:
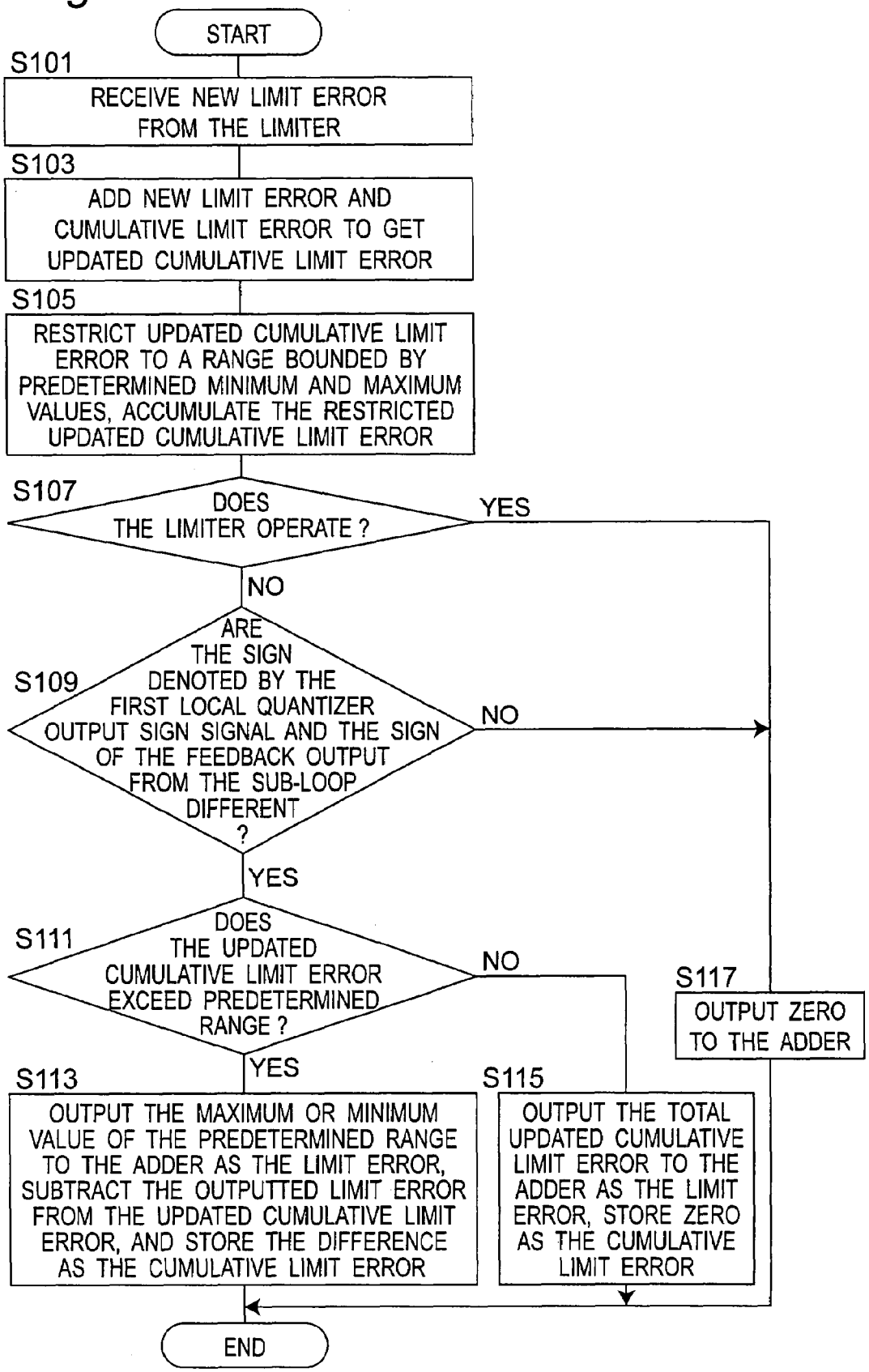
FIG. 6 is a flow chart describing the operation of the multi stage noise shaping quantizer according to the first embodiment of the invention.

Step S101 and step S107 in FIG. 6 are changed to step S101a and step S107a, respectively, in FIG. 9 to describe the operation of the error accumulator 35. The output of the error accumulator 35 to the adder 37 is also based on the operating condition of the output controller 71 in this aspect of the invention.

In step S101a the error accumulator 35 gets the new limit error a2 outputted by the output controller 71.

In step S107a, the error accumulator 35 compares the updated cumulative limit error with the cumulative limit error to get the value of the new limit error. If the difference between the updated cumulative limit error and the cumulative limit error is zero, the process selection circuit 41 determines that the output controller 71 does not operate (step S107a returns No) and control goes to step S109. If this difference is a non-zero value, the process selection circuit 41 determines that the output controller 71 operates (step S107a returns Yes), and control goes to step S117.

By using an output controller 71 having an amplitude controller 73, the multi stage noise shaping quantizer 1a according to this embodiment of the invention outputs a part of the limit error resulting from output amplitude limiting by the limiter 17 according to the condition of the main loop 3a and the sub-loop 5. The amount of limit error accumulated in the error accumulator 35 can therefore be reduced and a good signal distortion factor can be maintained.

(Single-integration Noise Shaping Quantizer)

This embodiment of the invention has been described using multi stage noise shaping quantizers 1 and 1a by way of example, but the invention can also be used in a single integration noise shaping quantizer having a single loop.

Figure 10:
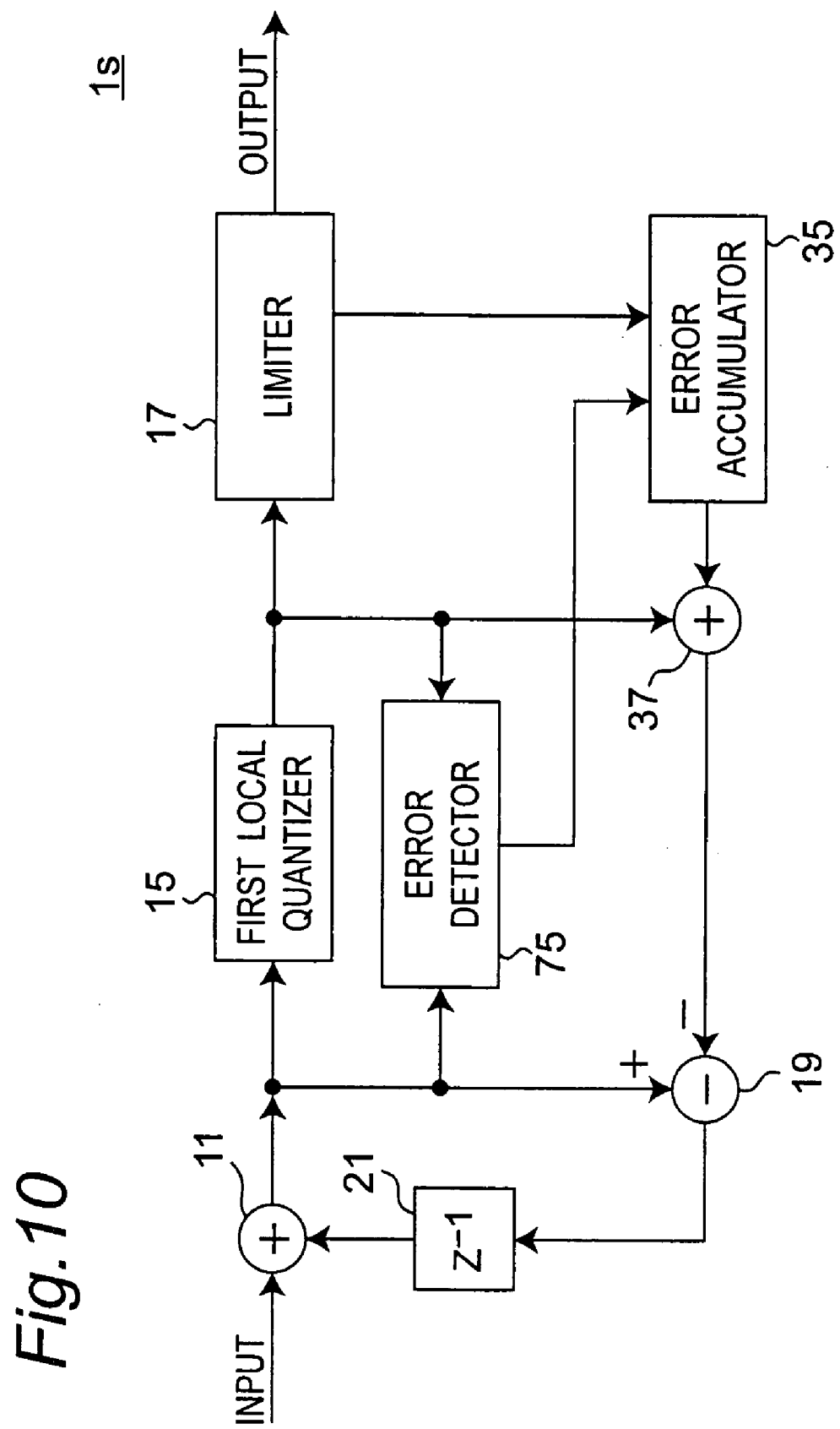
FIG. 10 is a block diagram of the single integration noise shaping quantizer in the first embodiment of the invention.

FIG. 10 is a block diagram of a single integration noise shaping quantizer 1s. This single integration noise shaping quantizer 1s has the same effect as the multi stage noise shaping quantizers 1 and 1a described above with respect to the object of the invention. This single integration noise shaping quantizer 1s is described below. Note that like parts in FIG. 10 and FIG. 3 are identified by the same reference numerals and further description thereof is omitted.

The single integration noise shaping quantizer 1s shown in FIG. 10 differs from the multi stage noise shaping quantizer 1 shown in FIG. 3 in that there is no sub-loop and no feedback from a sub-loop to the error accumulator 35, an error detector 75 for detecting quantization error occurring during quantization by the first local quantizer is added, the output from the error detector 75 is inputted to the error accumulator 35, and the limiter 17 does not input a first local quantizer output sign signal to the error accumulator 35.

This single integration noise shaping quantizer 1s has an adder 11, a first local quantizer 15, a limiter 17, an error accumulator 35, an error detector 75 for detecting quantization error produced by the first local quantizer 15, an adder 37, a subtractor 19, and a delay element 21, and is a single integration noise shaping quantizer affording first-order noise shaping.

The operation of the error detector 75 is described next. The error detector 75 either detects the sign of the quantization error from the first local quantizer 15 by comparing the two inputs or detects the value of the quantization error of the first local quantizer 15 by calculating the difference of the two inputs.

Figure 11:
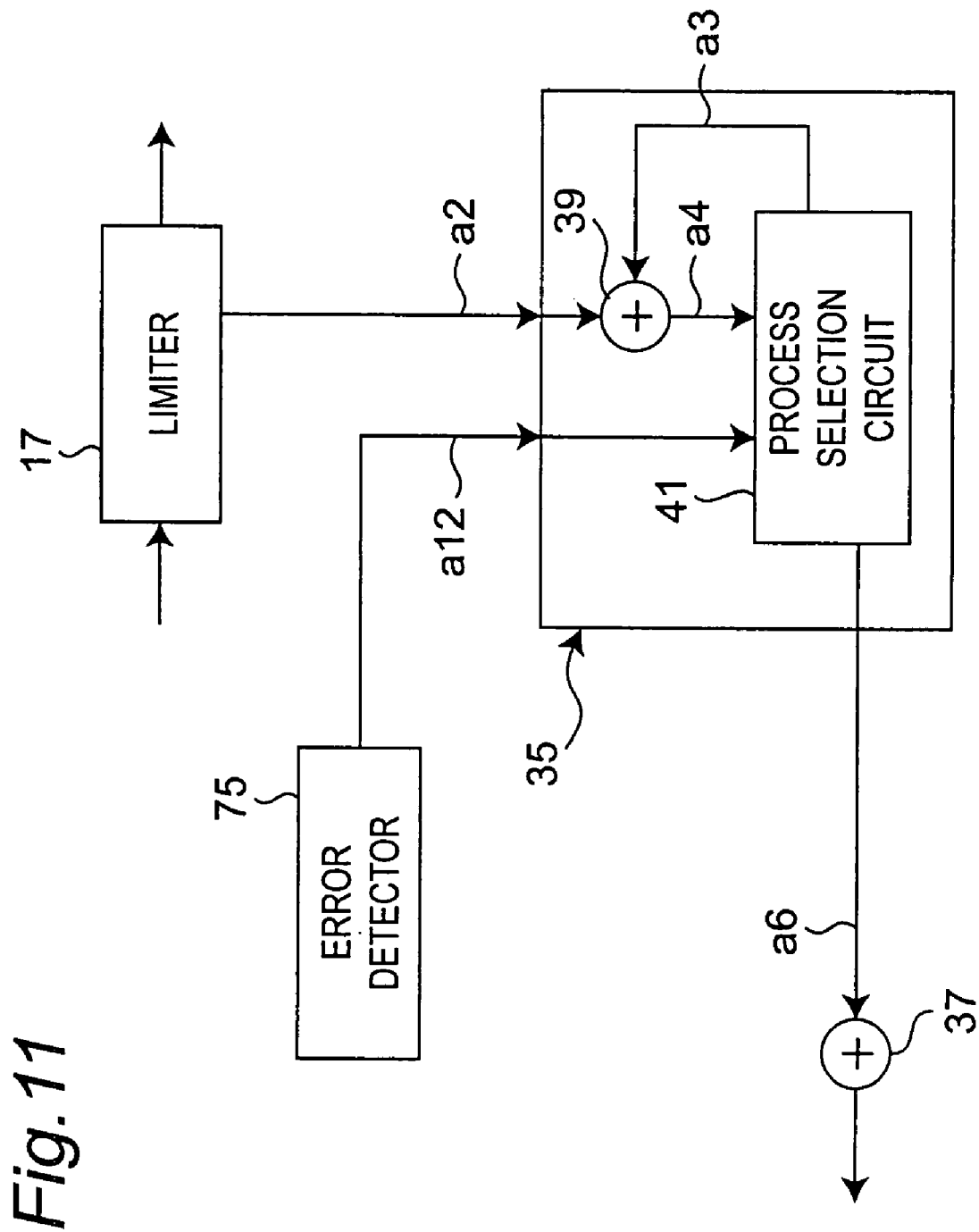
FIG. 11 is a block diagram of the error accumulator of the single integration noise shaping quantizer in the first embodiment of the invention.

FIG. 11 is a block diagram of the error accumulator 35. Like parts in FIG. 11 and the error accumulator 35 shown in FIG. 4 are identified by the same reference numerals and further description thereof is omitted. The operation of the error accumulator 35 differs according to whether the error detector 75 detects the sign of the quantization error from the first local quantizer 15 or calculates the value of the quantization error from the first local quantizer 15. Operation of the error accumulator 35 is therefore described for both cases.

This error accumulator 35 has an adder 39 and a process selection circuit 41. This error accumulator 35 differs from the error accumulator 35 shown in FIG. 4 in that this error accumulator 35 determines the output a6 based on the output a2 from the limiter 17 and the output a12 from the error detector 75.

The operation of the error accumulator 35 when the error detector 75 detects the sign of the quantization error from the first local quantizer 15 is described first. The error accumulator 35 first determines if the cumulative limit error a3 accumulated from the limiter 17 in previous clocks equals the updated cumulative limit error a4. If the new limit error a2 is determined to be zero, the error accumulator 35 determines that the limiter 17 is not operating. The error accumulator 35 then compares the sign of the updated cumulative limit error with the sign denoted by the quantization error sign signal a12 inputted from the error detector 75 and determines if the signs are the same or different. If the signs are different, the error accumulator 35 outputs the limit error a6 to the adder 37.

If the signs are the same or if the limiter 17 is determined to have operated, the error accumulator 35 does not output the limit error a6 to the adder 37.

If the signs are different, the value of the limit error a6 outputted by the error accumulator 35 to the adder 37 is less than or equal to the quantization error portion 77 described below with reference to FIG. 12. Note that the process determining if the limiter 17 operates or not is not essential.

FIG. 12(a) shows the input range 51 that can be inputted to the single integration noise shaping quantizer is without causing the quantizer to overflow and the components (portions)

in this range, and (b) and (c) show examples of input signals actually inputted to the first local quantizer 15. How the value of the limit error a6 outputted from the error accumulator 35 to the adder 37 is determined is described more specifically below with reference to FIG. 12. The input range 51 includes an input signal portion 63 such as an audio signal and a quantization error portion 61. The input range 51 could also include a margin portion but the margin portion in this example is zero. As a result, the range allocated to the input signal portion 63, for example, can be increased compared with the prior art.

As will be known from FIG. 12(b), the error accumulator 35 does not output the limit error a6 to the adder 37 when the sign of the quantization error and the sign of the updated cumulative limit error are the same. This is because the entire input range 51 is already used for the input signal portion 63 and the quantization error portion 61. If the limit error is also inputted to the single integration noise shaping quantizer is in this situation, the first local quantizer 15 may overflow. In order to prevent the first local quantizer 15 from overflowing, the error accumulator 35 therefore outputs zero to the adder 37 or does not output anything.

As will be known from FIG. 12(c), if the sign of the quantization error and the sign of the updated cumulative limit error are different, the error accumulator 35 outputs limit error a6 to the adder 37 within the bounds of the quantization error portion 61.

Figure 13:
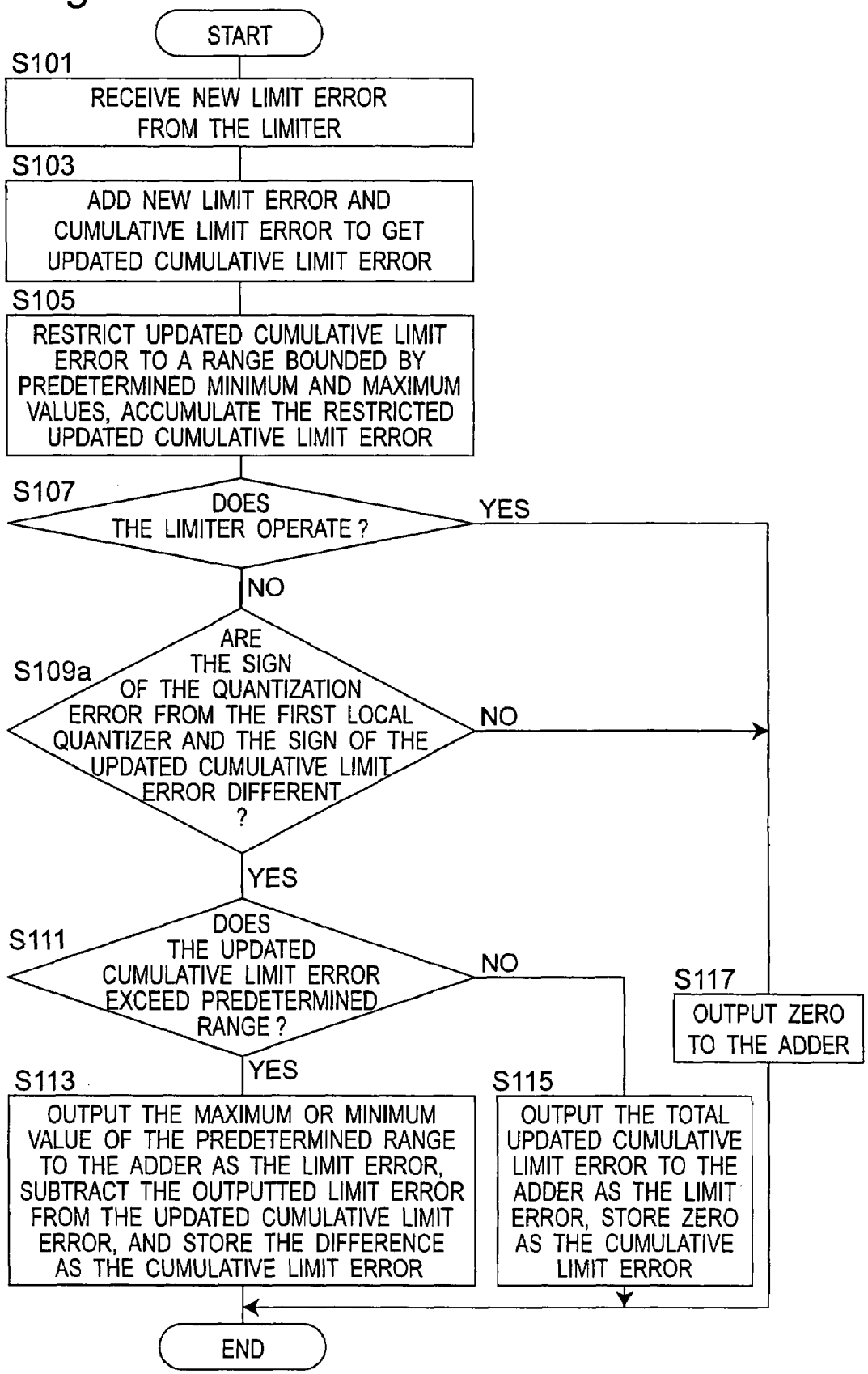
FIG. 13 is a flow chart describing the operation of the single integration noise shaping quantizer in the first embodiment of the invention.

FIG. 13 is a flow chart describing the operation of the error accumulator 35 when the error detector 75 detects the sign of the quantization error from the first local quantizer 15. Identical steps in FIG. 13 and the flow chart shown in FIG. 6 are identified by the same reference numerals and further description thereof is omitted.

In step S109a, the error accumulator 35 compares the sign denoted by the quantization error sign signal received from the error detector 75 and the sign of the updated cumulative limit error. If the signs are the same (step S109a returns No), control goes to step S117. If the signs are different (step S109a returns Yes), control goes to step S111.

Step S109a more specifically compares the sign of the limit error accumulated in the process selection circuit 41 (either the updated cumulative limit error or the cumulative limit error) and the sign of the quantization error from the first local quantizer 15, and determines if the quantization error portion 61 of the input range 51 is used.

The steps other than step S109a are the same as shown in FIG. 6.

The operation of the error accumulator 35 when the error detector 75 calculates the value of the quantization error from the first local quantizer 15 is described next. The margin is again assumed to be zero in this case.

The error accumulator 35 reads the quantization error value signal a12 inputted from the error detector 75, and compares the quantization error indicated by the quantization error value signal a12 and the size of the quantization error portion 61. If the quantization error indicated by signal a12 does not exceed the quantization error portion 61, the error accumulator 35 subtracts the quantization error denoted by signal a12 from the quantization error portion 61 to determine the amount of limit error that can be outputted to the adder 37, and outputs limit error a12 to the adder 37 within the range of values that will not exceed the updated cumulative limit error.

If the error accumulator 35 determines by comparing the quantization error denoted by the quantization error value signal a12 and the size of the quantization error portion 61 that the quantization error denoted by signal a12 exceed the quantization error portion 61, the error accumulator 35 outputs a compensation output to the adder 37 so that the quantization error of the first local quantizer 15 is within the bounds of the quantization error portion 61, and adds a value corresponding to this compensation output to the limit error accumulated by the error accumulator 35. The value of this compensation output is determined by subtracting the quantization error portion 61 from the quantization error of the first local quantizer 15.

Figure 14:
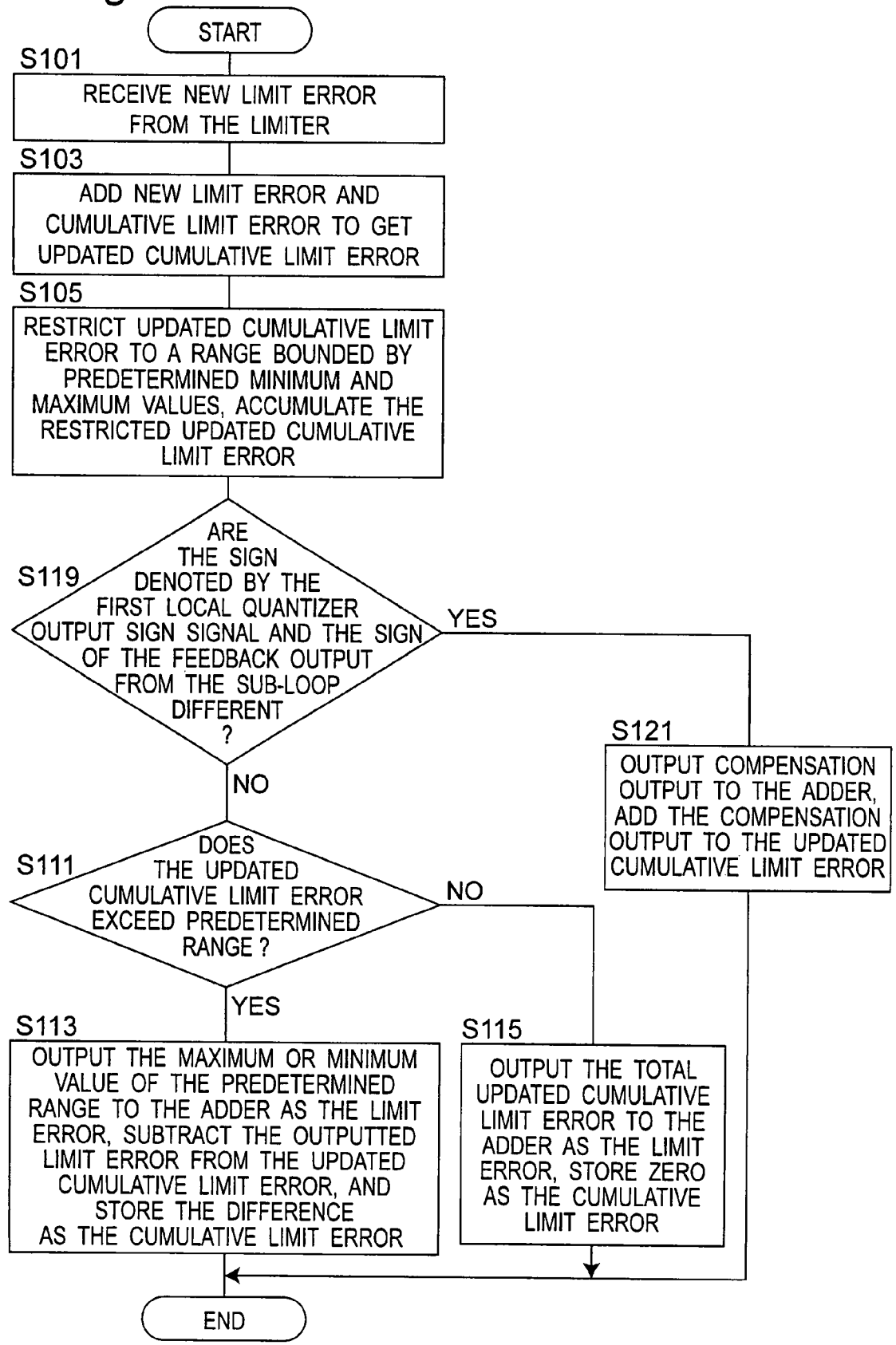
FIG. 14 is a flow chart describing the operation of the single integration noise shaping quantizer in the first embodiment of the invention.

FIG. 14 is a flow chart describing the operation of the error accumulator 35 when the error detector 75 calculates the value of the quantization error from the first local quantizer 15. Steps that are the same in FIG. 14 and the flow chart in FIG. 6 are identified by the same reference numerals and further description thereof is omitted.

Step S107 in FIG. 6 is omitted from the flow chart in FIG. 14.

In step S119, the error accumulator 35 compares the value denoted by the quantization error value signal received from the error detector 75 and the size of the quantization error portion 61 of the input range 51 to the first local quantizer 15. If the value denoted by the quantization error value signal is determined to exceed the size of the quantization error portion 61 (step S119 returns Yes), control goes to step S121. If the value denoted by the quantization error value signal is determined to not exceed the size of the quantization error portion 61 (step S119 returns No), control goes to step S111. In this step the error accumulator 35 determines whether to output at least a part of the accumulated limit error to the adder 37 at the same clock.

In step S121, the error accumulator 35 outputs the compensation output to the adder 37 so that the quantization error produced by the first local quantizer 15 is within the bounds of the quantization error portion 61, and adds a value corresponding to the compensation output to the updated cumulative error.

As described above, the error accumulator 35 in this single integration noise shaping quantizer 1s can accumulate the limit error resulting from output amplitude limiting by the limiter 17 and the quantization error produced by the first local quantizer 15. Based on the sign of the accumulated limit error and the sign or value of the quantization error, the accumulated limit error is then fed back to the first local quantizer 15. As a result, the loop can be kept stable and a drop in the signal distortion factor can be suppressed by appropriately feeding back the limit error caused by output amplitude limiting or the compensation output at a later clock.

In addition, by controlling the error that is fed back and stabilizing the loop, the margin portion of the input range 51 to the first local quantizer 15 can also be eliminated, or the size of the margin relative to the input range 51 can be minimized. The proportion of the input range 51 to the first local quantizer 15 that is allocated to the input signal portion 63 can therefore be increased, and the dynamic range of the input signal, such as an audio signal, can be increased.

Second Embodiment

The second embodiment of the invention includes a multi stage noise shaping quantizer and a single integration noise shaping quantizer. Like parts in this and the preceding embodiments are identified by the same reference numerals and further description thereof is omitted.

(Multi Stage Noise Shaping Quantizer)

Figure 15:
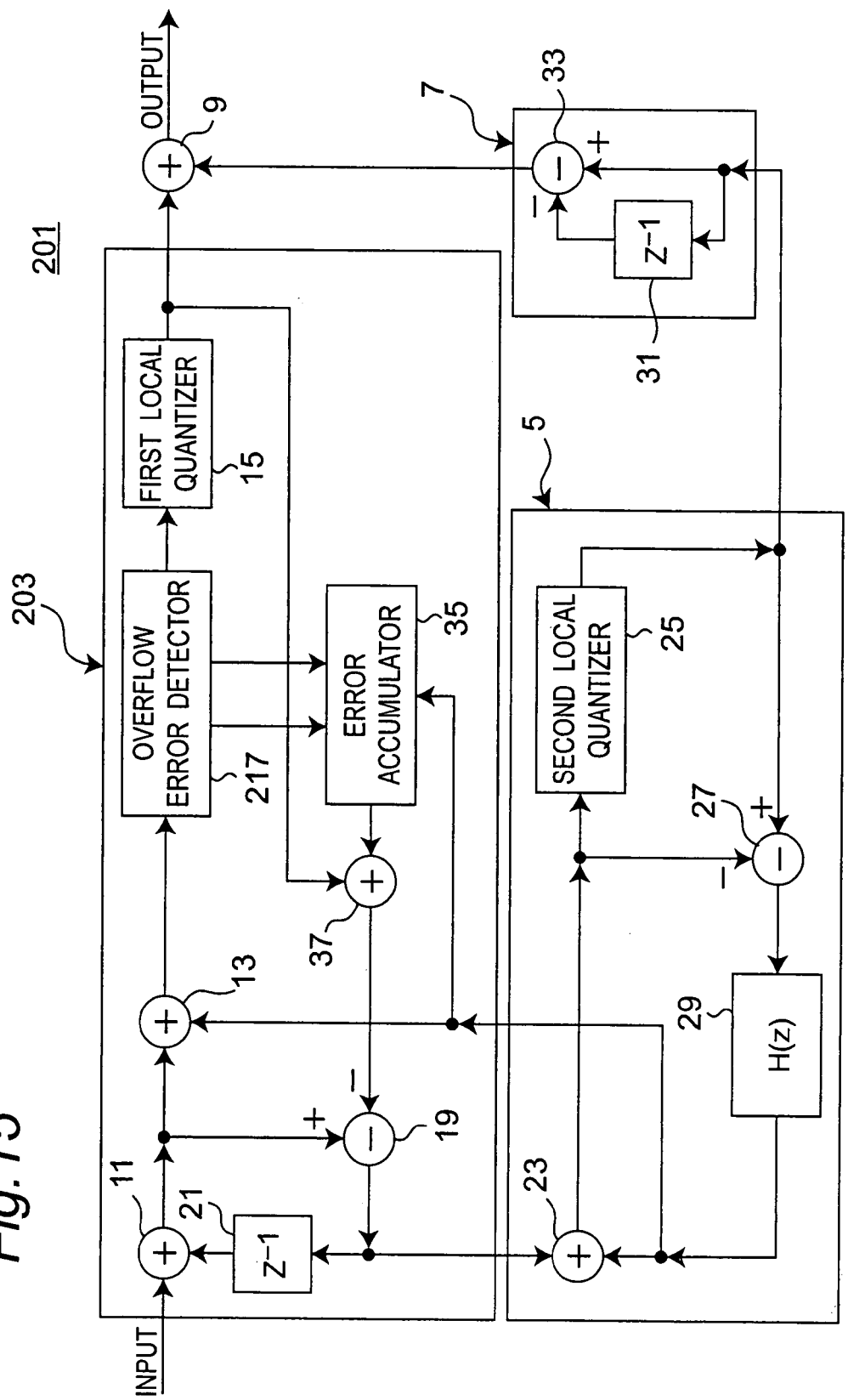
FIG. 15 is a block diagram of a multi stage noise shaping quantizer according to a second embodiment of the invention.

FIG. 15 is a block diagram showing a multi stage noise shaping quantizer 201 according to this second embodiment of the invention. This multi stage noise shaping quantizer 201 has a main loop 203, a sub-loop 5, a differentiator 7, and an adder 9.

The main loop 203 includes an adder 11, an adder 13, an overflow error detector (overflow error detection circuit) 217, a first local quantizer 15, an error accumulator 35, an adder 37, a subtractor 19, and a delay element 21, and renders a single integration noise shaping quantizer affording first-order noise shaping (a first noise shaping quantization unit).

The multi stage noise shaping quantizer 201 thus arranged is a multi stage noise shaping quantizer affording (the noise shaping order of the sub-loop 5+1)-order noise shaping.

The overflow error detector (overflow error detection circuit) 217 in the main loop 203 takes the output from the adder 13 to detect whether the first local quantizer 15 will overflow based on the adder 13 output in advance of the occurrence of the overflow in the first local quantizer 15. More specifically, the overflow error detector 217 determines that the first local quantizer 15 will overflow if the output of the adder 13 exceeds the input range 51 (see FIG. 5) of the first local quantizer 15. If the overflow error detector 217 determines that the first local quantizer 15 will overflow, the overflow error detector 217 divides the output of the adder 13 into an overflow error component and an output component to the first local quantizer 15. The output to the first local quantizer 15 must be a value within the input range 51 of the first local quantizer 15, and the sum of the output to the first local quantizer 15 (output component) and the overflow error component must be equal to the output of the adder 13. The overflow error detector 217 then outputs the overflow error (overflow error component) to the error accumulator 35.

Regardless of whether overflow is detected, the overflow error detector 217 also determines the sign of the output value to the first local quantizer 15 (that is, the sign of the output signal from the first local quantizer 15), and outputs a signal denoting the sign of the first local quantizer 15 output (first local quantizer output sign signal) to the error accumulator 35. This first local quantizer output sign signal denotes the operating condition of the first local quantizer 15.

The error accumulator 35 in this embodiment of the invention accumulates the overflow error outputted from the overflow error detector 217. The error accumulator 35 then appropriately controls and outputs the accumulated overflow error to the adder 37 based on the operating condition of the first local quantizer 15 (the first local quantizer output sign signal and overflow error), and the sign of the feedback signal from the feedback circuit 29 in the sub-loop 5.

The operation of the error accumulator 35 is described in further detail below with reference to FIG. 15, FIG. 16, and FIG. 5.

Figure 16:
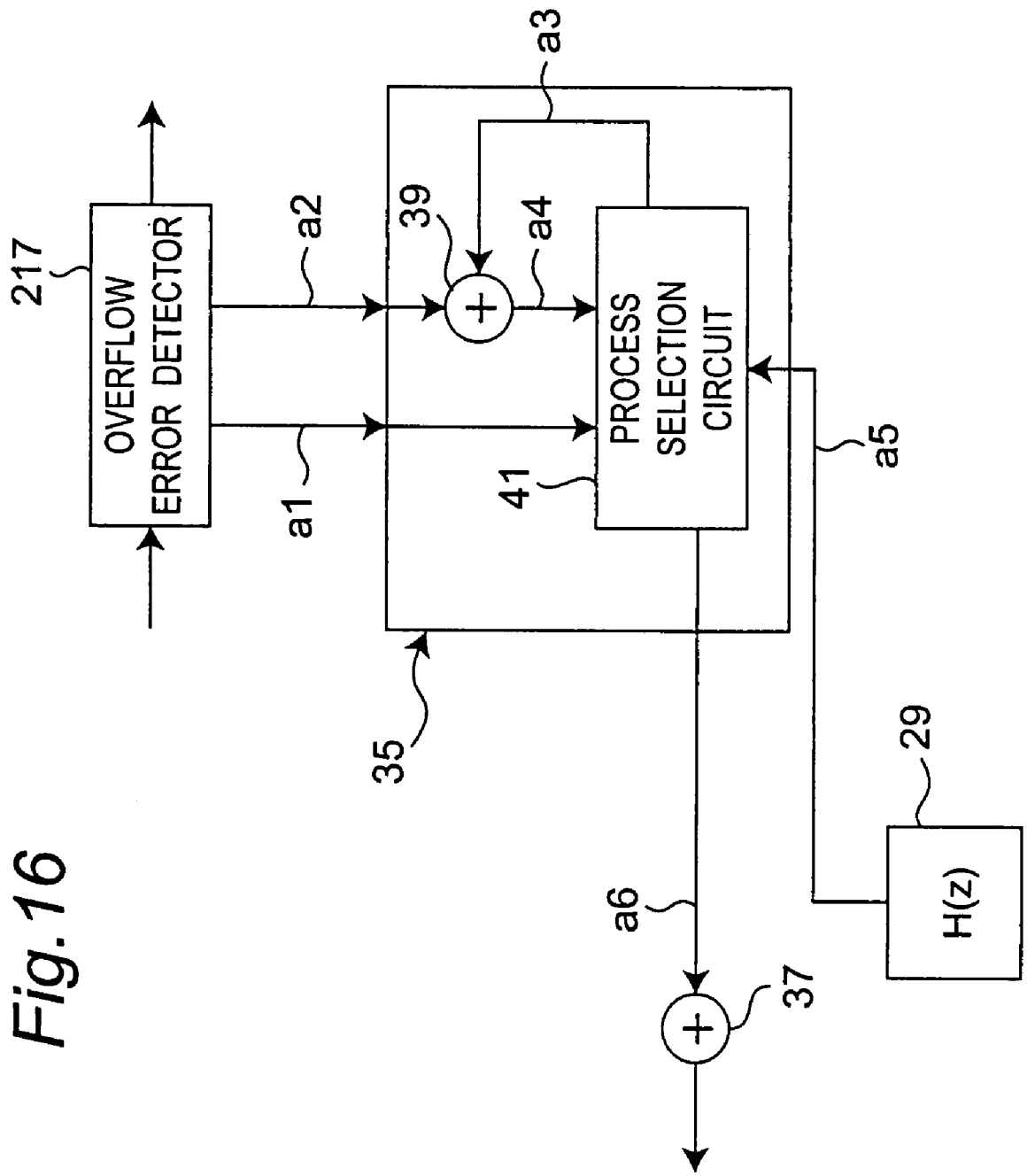
FIG. 16 is a block diagram of the error accumulator in the second embodiment of the invention.

FIG. 16 is a block diagram showing the error accumulator 35 in detail. As shown in FIG. 16 the error accumulator 35 has an adder 39 and a process selection circuit 41. The overflow error (new limit error) a2 outputted from the overflow error detector 217 and the overflow error (cumulative overflow error) a3 currently stored by the process selection circuit 41 are inputted to the adder 39, which adds the inputs and outputs the sum as the updated cumulative overflow error a4 to the process selection circuit 41. The first local quantizer output sign signal a1 outputted from the overflow error detector 217, the feedback output a5 of the sub-loop 5, and the updated cumulative limit error a4 outputted from the adder 39 are inputted to the process selection circuit 41. Based on these inputs the process selection circuit 41 determines the level of overflow error a6 outputted to the adder 37, and based on this level outputs the overflow error a6 to the adder 37.

How the value of the output a6 from the error accumulator 35 to the adder 37, and more specifically the value of the output a6 from the process selection circuit 41 to the adder 37, is determined is described more specifically below.

Figure 5:
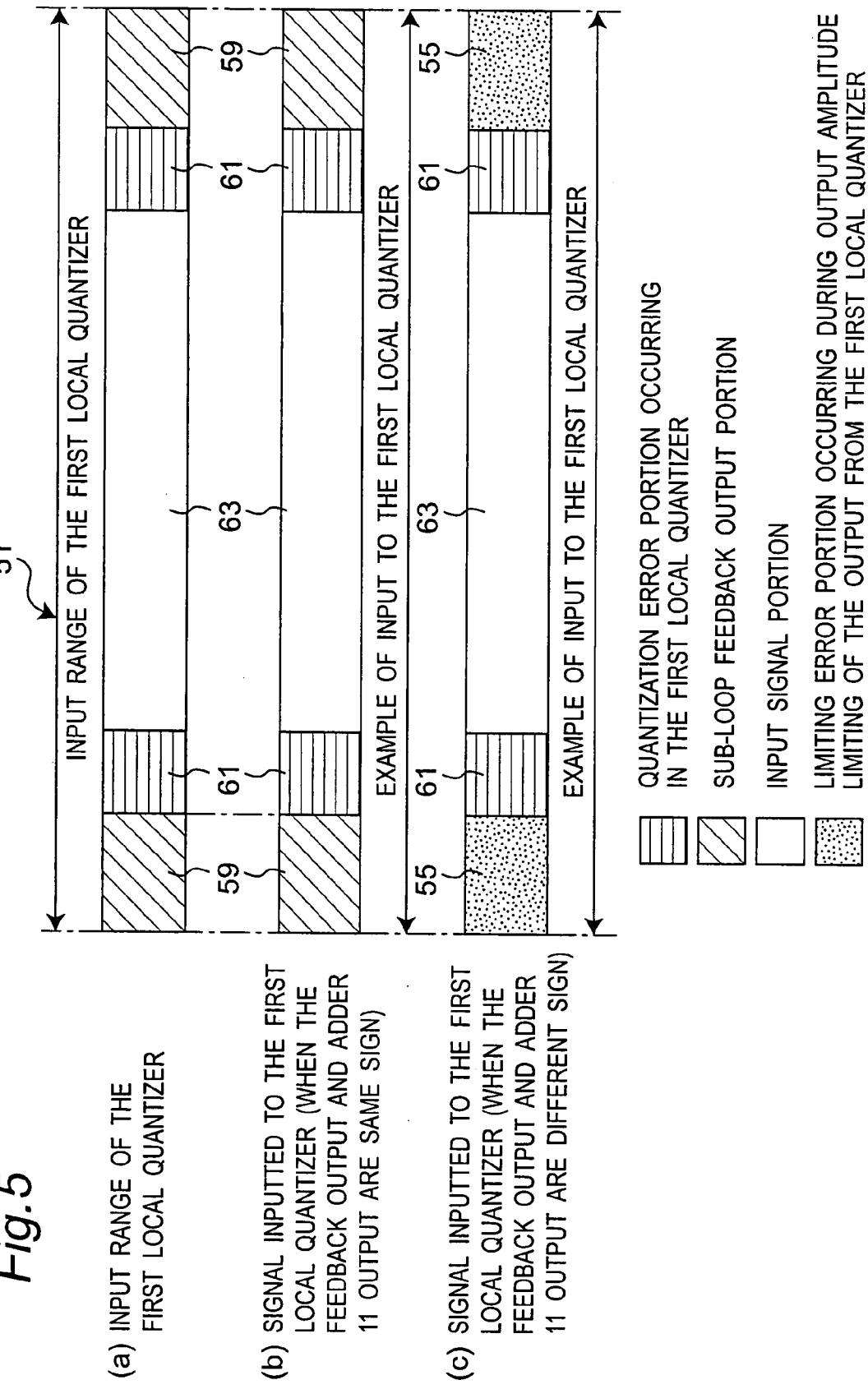
FIG. 5 describes the input/output relationship of a first local quantizer in the first embodiment of the invention.

Referring to FIG. 5(*b*), when the feedback output from the sub-loop 5 and the output from the adder 11 are the same sign, the input to the first local quantizer 15 includes the input signal portion 63 such as an audio signal, a quantization error portion 61, and a feedback output portion 59 from the sub-loop 5. The input range 51 is filled by these three portions. If the overflow error stored by the error accumulator 35 is then additionally inputted to the first local quantizer 15, the first local quantizer 15 will overflow. To prevent the first local quantizer 15 from overflowing in this case, the error accumulator 35 therefore outputs zero to the adder 37 or does not output. In other words, if the first local quantizer output sign signal a1 and the feedback output a5 from the sub-loop 5 are the same sign, the error accumulator 35 sets the output a6 to the adder 37 to zero.

If the feedback output from the sub-loop 5 and the output from the adder 11 are opposite sign, the feedback output from the sub-loop 5 is added to the output from the adder 11 by the adder 13 and the resulting sum is within the bounds of the input signal portion 63. The feedback output portion 59 is therefore not used in this case and is left. To prevent the first local quantizer 15 from overflowing in this case, the error accumulator 35 outputs overflow error within the bounds of the feedback output portion 59 from the accumulated overflow error to the adder 37. Therefore, as shown in FIG. 5(*c*), when the feedback from the sub-loop 5 and the output from the adder 11 are opposite sign, the input to the first local quantizer 15 includes the input signal portion 63 such as an audio signal, the quantization error portion 61, and the overflow error portion (which corresponds to the limit error portion 55). In other words, if the first local quantizer output sign signal a1 and the feedback output a5 from the sub-loop 5 are opposite sign, the error accumulator 35 outputs accumulated overflow error within the limits of the feedback output portion 59 to the adder 37.

Conditions determining the output level from the error accumulator 35 to the adder 37 in order to prevent the first local quantizer 15 from overflowing are considered above. Conditions determining the output level from the error accumulator 35 to the adder 37 in order to prevent the second local quantizer from overflowing are considered below.

The magnitude of the value (the output of the subtractor 19 in the main loop 3 (that is, the sum of the quantization error of the main loop 203 and the overflow error outputted from the error accumulator 35 (referred to below as the "sub-loop input range"))) that can be inputted from the main loop 203 to the adder 23 without causing the second local quantizer 25 to overflow can be determined by a value which is obtained by dividing the input range to the second local quantizer 25 by the gain of the feedback circuit 29 of the sub-loop 5.

The error accumulator 35 determines the output level to the adder 37 that will not cause the second local quantizer 25 to overflow based on a predetermined sub-loop input range and whether the sign denoted by the first local quantizer output sign signal (the sign of the output of the first local quantizer 15) and the sign of the feedback output from the sub-loop 5 are the same or different.

If the sign denoted by the first local quantizer output sign signal and the sign of the feedback output from the sub-loop 5 are the same, the overflow error outputted by the overflow error detector 217 and the feedback output from the sub-loop 5 are the same polarity. The error accumulator 35 can therefore determine the level of the output overflow error (which corresponds to the limit error) based on feedback from the sub-loop 5 so that the overflow error output to the adder 37 does not exceed the range obtained by subtracting the feedback from the sub-loop input range.

If the sign denoted by the first local quantizer output sign signal and the sign of the feedback output from the sub-loop 5 are different, the overflow error outputted by the overflow error detector 217 and the feedback output from the sub-loop 5 are opposite polarity. In this case it is not necessary to consider the feedback output from the sub-loop 5, and the error accumulator 35 can determine the level of the output overflow error so that the overflow error output to the adder 37 does not exceed the sub-loop input range.

Based on these conditions, the error accumulator 35, or more particularly the process selection circuit 41 of the error accumulator 35, determines the range of outputs to the adder 37 that will not cause the first local quantizer 15 to overflow and the range of outputs to the adder 37 that will not cause the second local quantizer 25 to overflow.

If the first and second local quantizers 15 and 25 are determined to be stable (the sign denoted by the first local quantizer output sign signal and the sign of the feedback output from the sub-loop 5 are opposite), the process selection circuit 41 determines whether the absolute value of the output to the adder 37 that prevents the first local quantizer 15 from overflowing or the absolute value of the output to the adder 37 that prevents the second local quantizer 25 from overflowing is smaller, sets the output a6 to the lesser of these absolute values, and then outputs this overflow error a6 to the adder 37. The process selection circuit 41 thus determines the range of outputs a6 to the adder 37 based on the sign denoted by the first local quantizer output sign signal and the sign of the feedback output a5 from the sub-loop 5 so that neither of the first and second local quantizers 15 and 25 overflows, and determines the output a6 from the error accumulator 35 to the adder 37.

This embodiment of the invention determines the output a6 from the error accumulator 35 to the adder 37 using values that can be predetermined when designing the circuit. However, if the process selection circuit 41 is arranged so that the process selection circuit 41 can determine the range of outputs a6 to the adder 37 at each clock by referencing the actual value of the feedback output a5 from the sub-loop 5, the range of values that can be outputted to the adder 37 can be determined more precisely. This is because the margin of the feedback output portion 59 of the first local quantizer 15 in the main loop 203 can be more accurately determined by using the actual feedback output a5 of the sub-loop 5. At the same time, the range of values that can be outputted from the main loop 203 to the adder 23 of the sub-loop 5 can also be determined more precisely.

The operation of the error accumulator 35 is described in further detail below with reference to the flow chart in FIG. 17.

In step S201, the error accumulator 35 (more specifically the adder 39) receives the overflow error outputted by the overflow error detector 217 as the new overflow error a2.

In step S203, the error accumulator 35 (more specifically the adder 39) adds this new overflow error a2 and the currently stored overflow error (cumulative overflow error) a3 to get the updated cumulative overflow error a4.

In step S205, the error accumulator 35 (more specifically the process selection circuit 41) limits the updated cumulative overflow error a4 to a predetermined value range and stores the limited updated cumulative overflow error. The predetermined value range used here is the range from the maximum value to the minimum value that can be stored by the process selection circuit 41. The limiting operation of this step can be skipped if the updated cumulative overflow error a4 is within this predetermined range of values.

In step S207, the error accumulator 35 (more specifically the process selection circuit 41) compares the updated cumulative overflow error a4 with the cumulative overflow error to get the value of the new overflow error. If the process selection circuit 41 determines that the difference between the updated cumulative overflow error a4 and the cumulative overflow error a3 is zero, the process selection circuit 41 determines that the limiter does not operate (step S207 returns No), and control goes to step S109. If the difference is a non-zero value, the process selection circuit 41 knows that the overflow error detector 217 detects an overflow (step S207 returns Yes) and control goes to step S117.

In step S109, the error accumulator 35 (more specifically the process selection circuit 41) compares the sign denoted by the first local quantizer output sign signal a1 and the sign of the feedback output a5 from the sub-loop 5, and determines if they are opposite. If the signs are opposite (step S109 returns Yes), control goes to step S211. If they are the same sign (step s109 returns No), control goes to step S117.

In step S211, the error accumulator 35 (more specifically the process selection circuit 41) compares the range of output values to the adder 37 that will not cause the first local quantizer 15 and the second local quantizer 25 to overflow in the case that the sign denoted by the first local quantizer output sign signal a1 and the sign of the feedback output a5 from the sub-loop 5 are different with the updated cumulative overflow error. If the updated cumulative overflow error is outside the range of outputs to the adder 37 (step S211 returns Yes), control goes to step S213. If the updated cumulative overflow error is not outside the range of outputs to the adder 37 (step S211 returns No), control goes to step S215.

In step S213, the error accumulator 35 (more specifically the process selection circuit 41) outputs as the limit error a6 output to the adder 37 the value that is closest to the updated cumulative overflow error and is in the range of output values to the adder 37 that will not cause the first local quantizer 15 and the second local quantizer 25 to overflow when the sign denoted by the first local quantizer output sign signal a1 and the sign of the feedback output a5 from the sub-loop 5 are opposite. The process selection circuit 41 also stores the difference of the updated cumulative overflow error minus the output overflow error as the cumulative overflow error.

In step S215, the error accumulator 35 (more specifically the process selection circuit 41) outputs the total updated cumulative overflow error as the output a6 to the adder 37. The process selection circuit 41 also stores zero as the cumulative overflow error.

In step S117, the error accumulator 35 (more specifically the process selection circuit 41) outputs zero to the adder 37 or does not output. This is because if step S117 is called the first and second local quantizers 15 and 25 are unstable and could overflow. Note that the decision of step S207 is not essential.

By arranging the error accumulator 35 to operate in this way, the first local quantizer 15 can be prevented from overflowing and the main loop 203 can be kept stable. The new overflow error a2 resulting from the overflow error detector 217 operation is temporarily stored by the error accumulator 35 and outputted appropriately at a later clock. Deterioration in the distortion factor of the signal output from the adder 9 is thus also prevented.

The process of limiting the value range of the updated cumulative overflow error (which corresponds to the updated cumulative limit error) in step S205 is to prevent from delaying the timing at which the accumulated overflow error is returned to the adder 37 due to the frequent operating of the overflow error detector 217 and causing the overflow error a6 to become noise. The quantizer 201 can operate normally without running the process of step S205 as long as the overflow error detector 217 does not operate frequently.

This aspect of the invention effectively prevents the first local quantizer 15 from overflowing. A predetermined value determined by the value of the feedback output a5 from the feedback circuit 29 in the sub-loop 5 is therefore added or subtracted from the output of the adder 11 to optimize the value outputted from the main loop 203 to the adder 23 and thereby enable the sub-loop 5 to operate normally. The stability of the main loop 203 and the sub-loop 5 is thus dramatically improved.

Furthermore, by suitably limiting the value outputted from the main loop 203 to the adder 23 in the sub-loop 5, the second noise shaping quantization unit (sub-loop 5) can operate stably.

This aspect of the invention also stabilizes the main loop 203 by appropriately controlling the quantization error fed back to the main loop 203. The margin portion of the input range 51 of the first local quantizer 15 can also be eliminated, or the size of the margin relative to the input range 51 can be minimized. The proportion of the input range 51 to the first local quantizer 15 that is allocated to the input signal portion 63 (such as an audio signal) can therefore be increased, and the dynamic range of the input signal can be increased.

(Single-integration Noise Shaping Quantizer)

This embodiment of the invention has been described using a multi stage noise shaping quantizer 201 by way of example, but the invention can also be used in a single integration noise shaping quantizer having a single loop.

Figure 18:
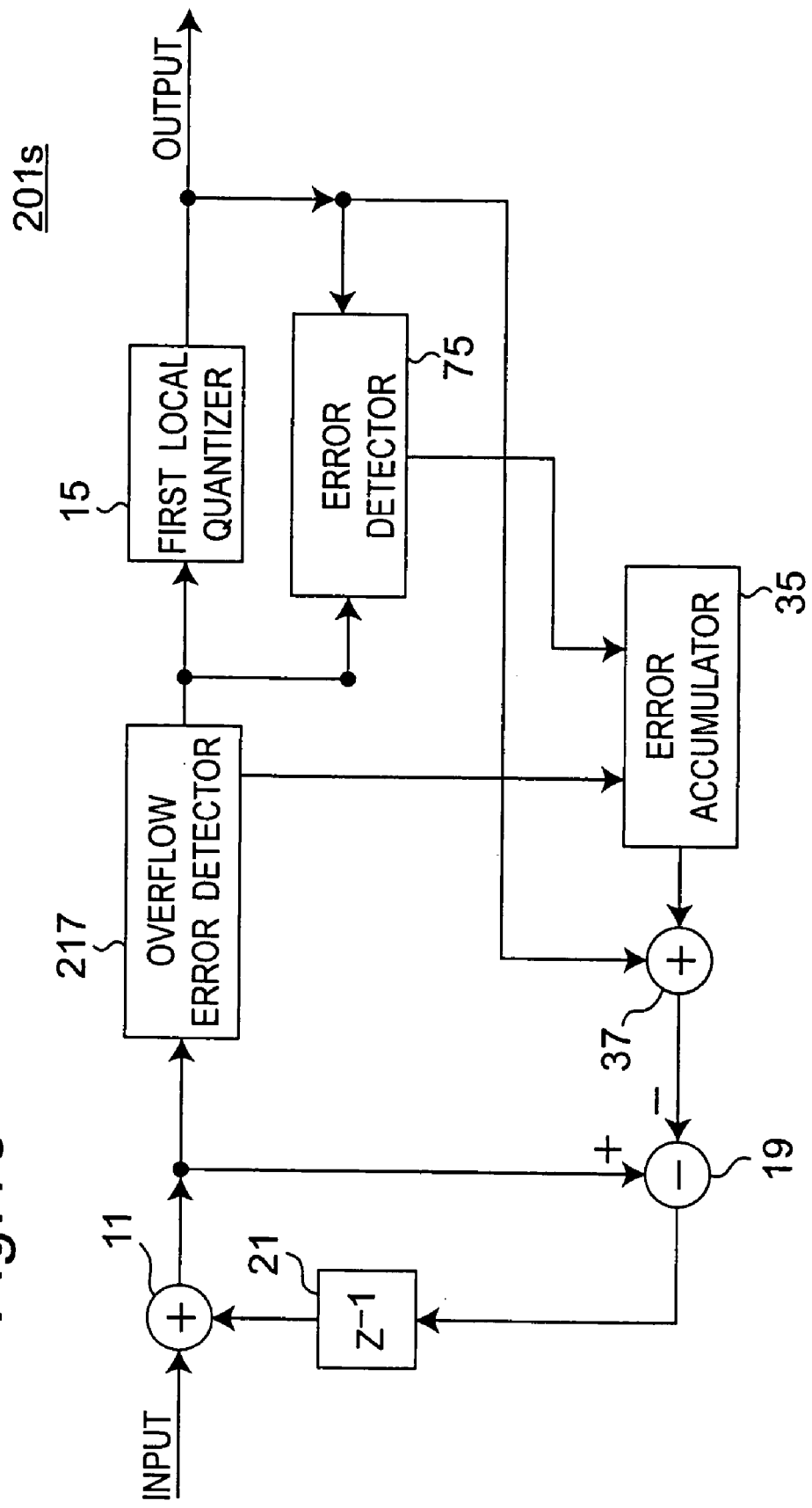
FIG. 18 is a block diagram of the single integration noise shaping quantizer in the second embodiment of the invention.

FIG. 18 is a block diagram of a single integration noise shaping quantizer 201s. This single integration noise shaping quantizer 201s has the same effect as the multi stage noise shaping quantizer 201 described above with respect to the object of the invention. This single integration noise shaping quantizer 201s is described below. Note that like parts in FIG. 18 and FIG. 15 are identified by the same reference numerals and further description thereof is omitted.

The single integration noise shaping quantizer 201s shown in FIG. 18 differs from the multi stage noise shaping quantizer 201 shown in FIG. 15 in that there is no sub-loop and no feedback from a sub-loop to the error accumulator 35, an error detector 75 for detecting quantization error occurring during quantization by the first local quantizer is added, the output from the error detector 75 is inputted to the error accumulator 35, and the overflow error detector 217 does not input a first local quantizer output sign signal to the error accumulator 35.

This single integration noise shaping quantizer 201s has an overflow error detector 217, an adder 11, a first local quantizer 15, an error accumulator 35, an error detector 75 for detecting quantization error produced by the first local quantizer 15, an adder 37, a subtractor 19, and a delay element 21, and is a single integration noise shaping quantizer affording first-order noise shaping.

The operation of the error detector 75 is as described in the preceding embodiment and further description thereof is omitted here.

Figure 19:
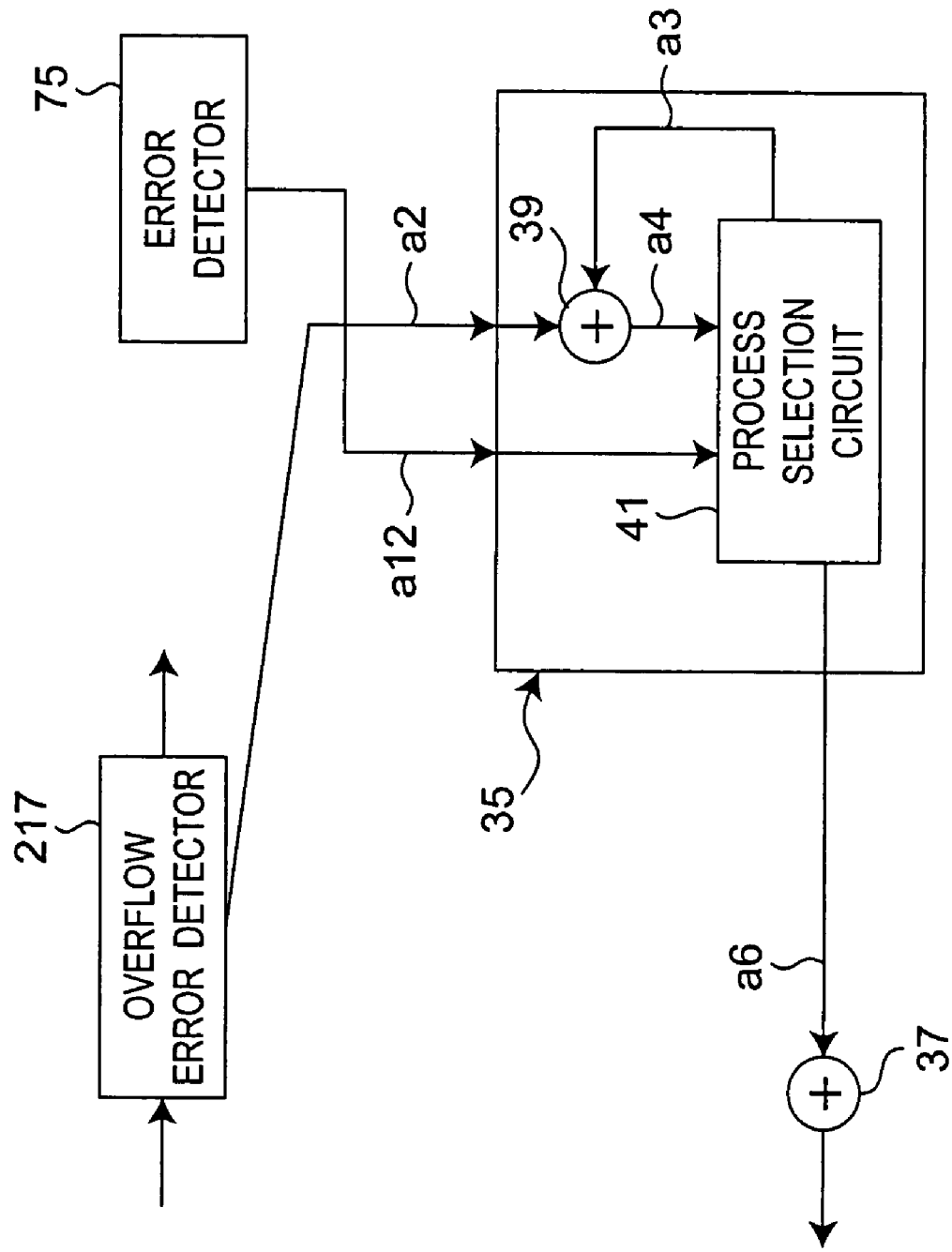
FIG. 19 is a block diagram of the single integration noise shaping quantizer in the second embodiment of the invention.

FIG. 19 is a block diagram of the error accumulator 35. Like parts in FIG. 19 and the error accumulator 35 shown in FIG. 16 are identified by the same reference numerals and further description thereof is omitted. The operation of the error accumulator 35 differs according to whether the error detector 75 detects the sign of the quantization error from the first local quantizer 15 or calculates the value of the quantization error from the first local quantizer 15. Operation of the error accumulator 35 is therefore described for both cases.

This error accumulator 35 has an adder 39 and a process selection circuit 41. This error accumulator 35 differs from the error accumulator 35 shown in FIG. 16 in that this error accumulator 35 determines the output a6 based on the output a2 from the overflow error detector 217 and the output a12 from the error detector 75.

The operation of the error accumulator 35 when the error detector 75 detects the sign of the quantization error from the first local quantizer 15 is described first. The error accumulator 35 first determines if the cumulative overflow error a3 received from the overflow error detector 217 in previous clocks equals the updated cumulative overflow error a4. If the new overflow error a2 is determined to be zero, the error accumulator 35 determines that an overflow does not occur. The error accumulator 35 then compares the sign of the updated cumulative overflow error with the sign denoted by the quantization error sign signal a12 inputted from the error detector 75 and determines if the signs are the same or different. If the signs are different, the error accumulator 35 outputs the overflow error a6 to the adder 37.

If the signs are the same or if the output a2 of the overflow error detector 217 is not zero, the error accumulator 35 does not output the overflow error a6 to the adder 37.

Figure 12:
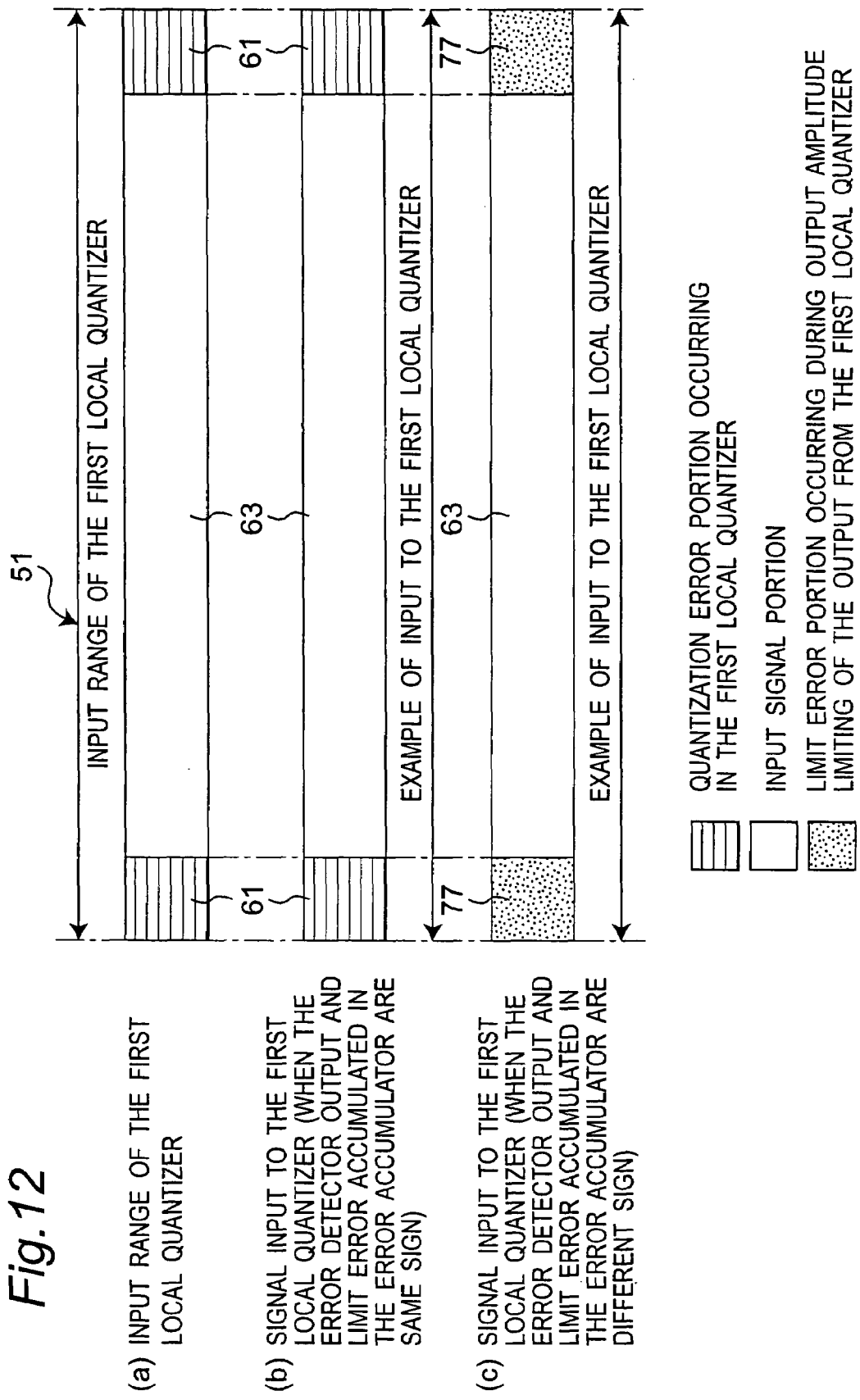
FIG. 12 describes the input/output relationship of a first local quantizer of the single integration noise shaping quantizer in the first embodiment of the invention.

If the signs are different, the value of the overflow error a6 outputted by the error accumulator 35 to the adder 37 is less than or equal to the quantization error portion 77 (see FIG. 12). Note that the process determining if the overflow error detector 217 operated or not is not essential.

Figure 20:
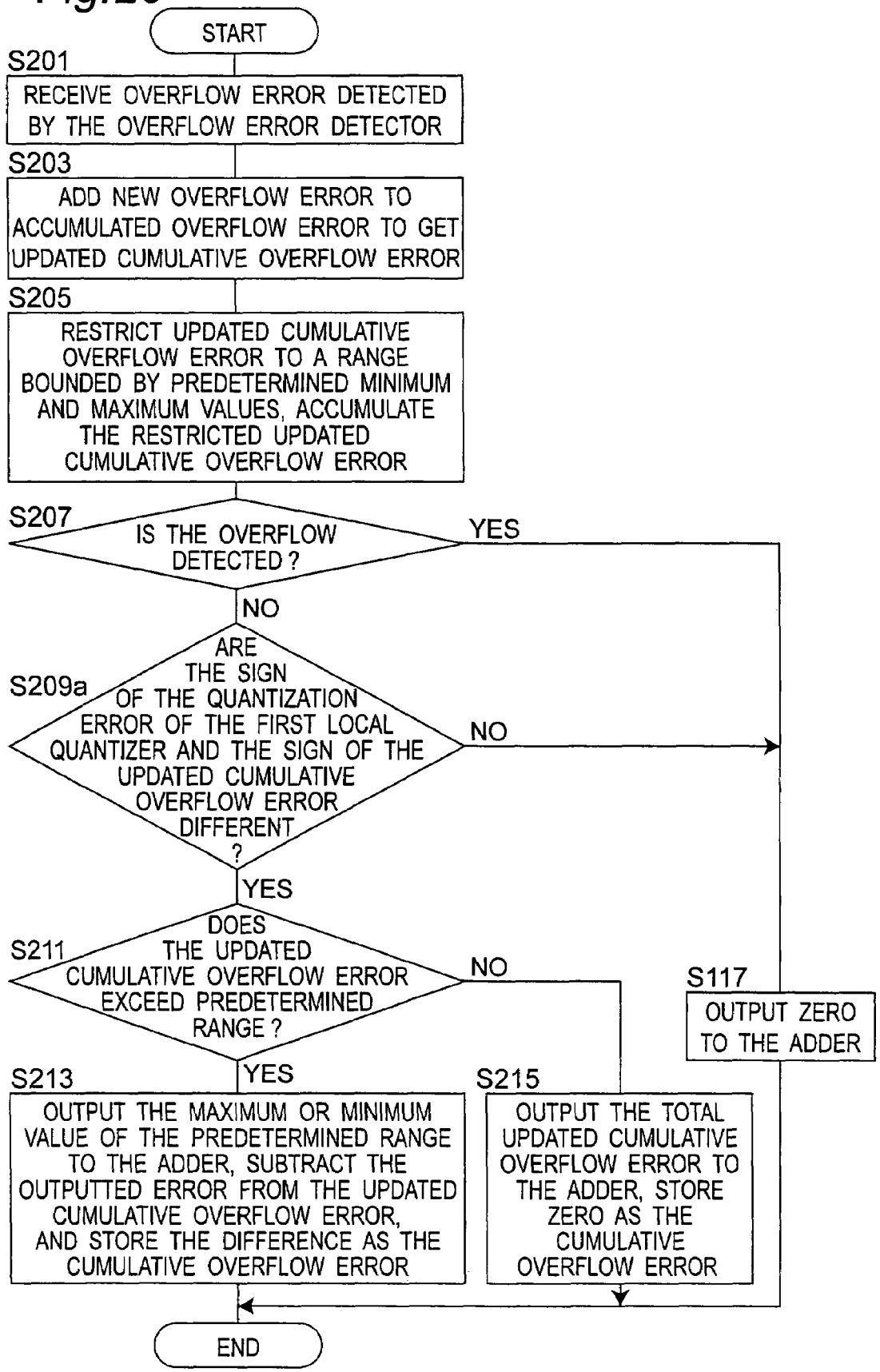
FIG. 20 is a flow chart describing the operation of the single integration noise shaping quantizer in the second embodiment of the invention.

FIG. 20 is a flow chart describing the operation of the error accumulator 35 when the error detector 75 detects the sign of the quantization error from the first local quantizer 15.

In step S209a, the error accumulator 35 compares the sign denoted by the quantization error sign signal received from the error detector 75 and the sign of the updated cumulative overflow error. If the signs are the same (step S209a returns No), control goes to step S117. If the signs are different (step S209a returns Yes), control goes to step S211.

Step S209a more specifically compares the sign of the overflow error accumulated in the process selection circuit 41 (either the updated cumulative overflow error or the cumulative overflow error) and the sign of the quantization error from the first local quantizer 15, and determines if the quantization error portion 61 of the input range 51 is used.

Figure 17:
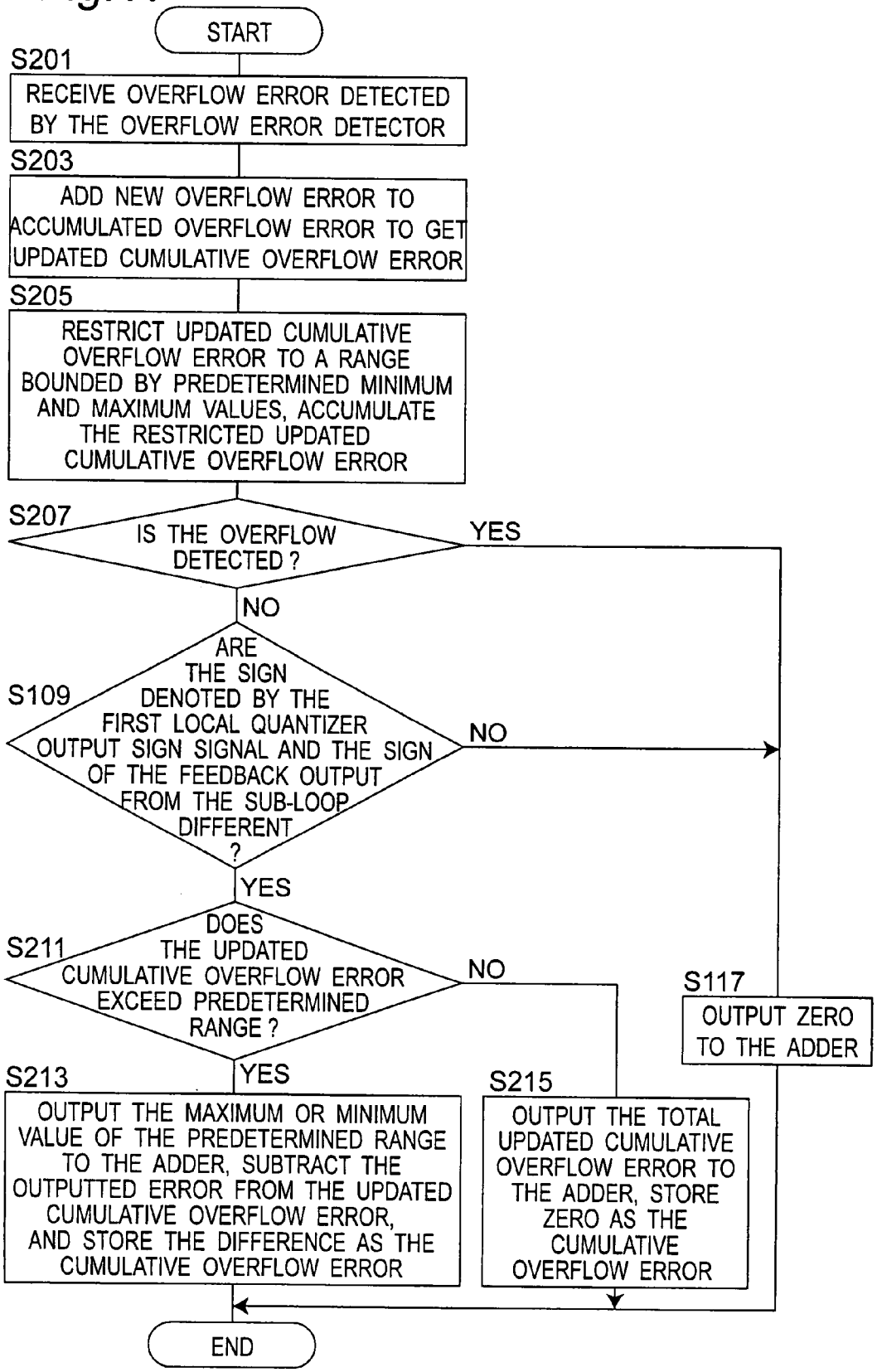
FIG. 17 is a flow chart describing the operation of the multi stage noise shaping quantizer according to the second embodiment of the invention.

The steps other than step S109a are the same as shown in FIG. 17.

The operation of the error accumulator 35 when the error detector 75 calculates the value of the quantization error from the first local quantizer 15 is described next. The margin is again assumed to be zero in this case.

Figure 21:
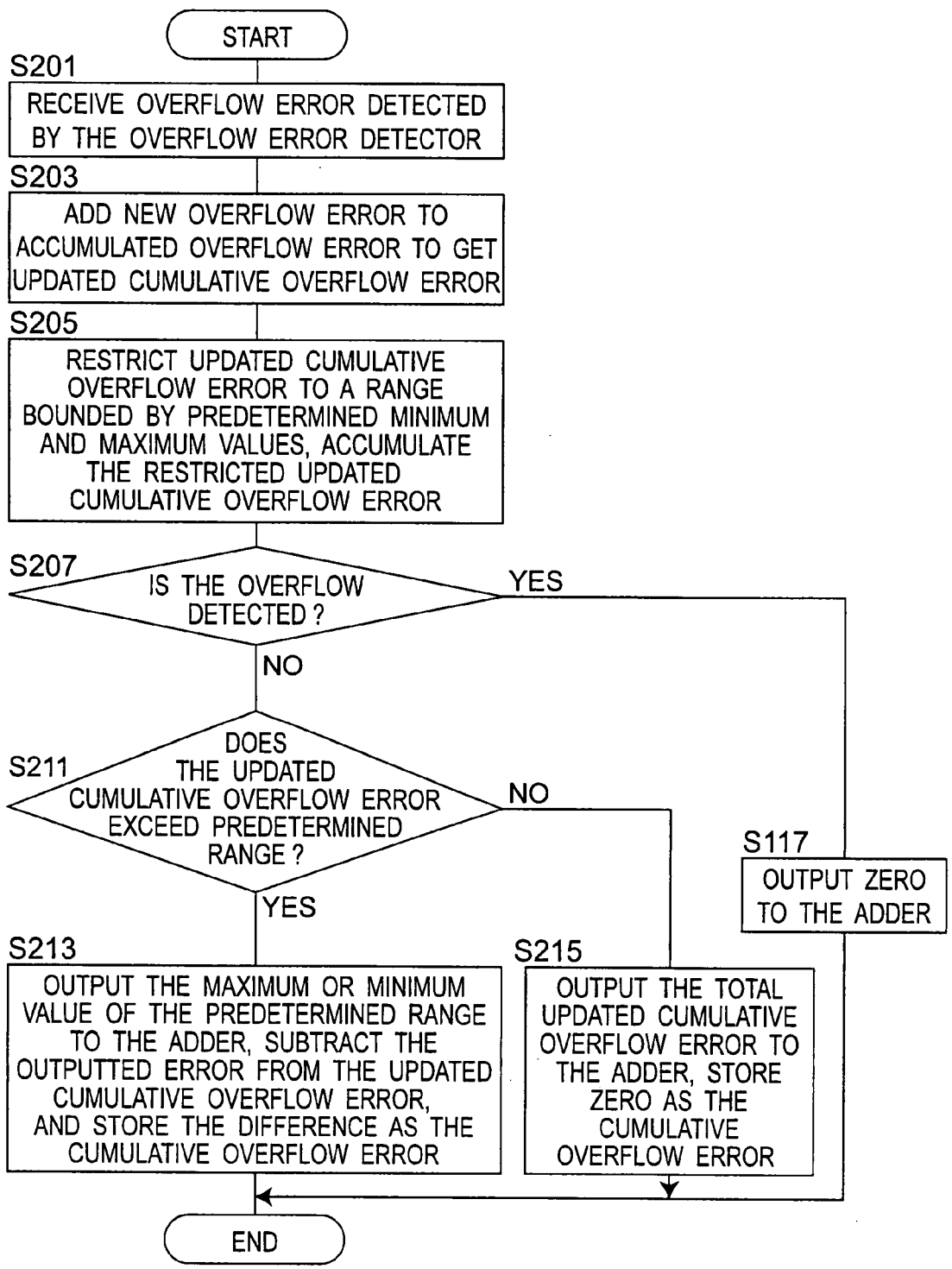
FIG. 21 is a flow chart describing the operation of the single integration noise shaping quantizer in the second embodiment of the invention.

FIG. 21 is a flow chart describing the operation of the error accumulator 35 when the error detector 75 calculates the value of the quantization error from the first local quantizer 15.

This flow chart is the same as the flow chart in FIG. 20 except that step S209a is omitted. The error accumulator 35 determines the output a6 to the adder 37 based on the output a2 of the overflow error detector 217 and the value a12 of the quantization error from the first local quantizer 15.

As described above, the error accumulator 35 in the single integration noise shaping quantizer 201s according to this second embodiment of the invention can accumulate the overflow error outputted by the overflow error detector 217. In addition, the error accumulator 35 returns the accumulated overflow error to the first local quantizer 15 based on the sign of the accumulated overflow error, the sign or value of the quantization error, and the operating condition of the overflow error detector 217. Stable loop operation can therefore be maintained and a drop in the signal distortion factor can be suppressed by feeding back the overflow error at a later clock.

In addition, by controlling the error that is fed back and stabilizing the loop, the margin portion of the input range 51 to the first local quantizer 15 can also be eliminated, or the size of the margin relative to the input range 51 can be minimized. The proportion of the input range 51 to the first local quantizer 15 that is allocated to the input signal portion 63 can therefore be increased, and the dynamic range of the input signal, such as an audio signal, can be increased.

Third Embodiment

This embodiment of the invention includes a multi stage noise shaping quantizer, variations thereof, and a single integration noise shaping quantizer.

(Multi Stage Noise Shaping Quantizer)

Figure 22:
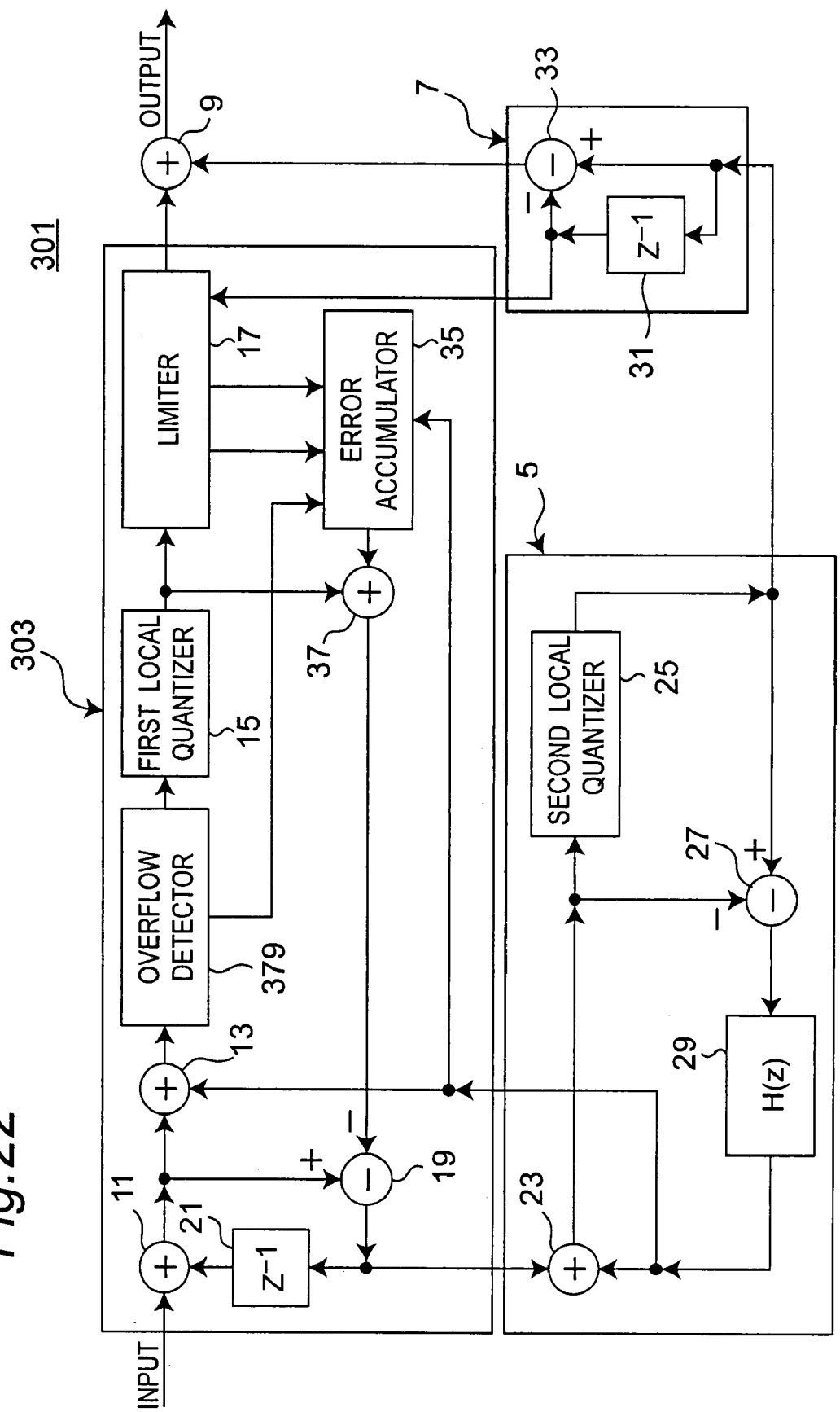
FIG. 22 is a block diagram of a multi stage noise shaping quantizer according to a third embodiment of the invention.

FIG. 22 is a block diagram of a multi stage noise shaping quantizer 301 according to a third embodiment of the invention. This multi stage noise shaping quantizer 301 has a main loop 303, a sub-loop 5, a differentiator 7, and an adder 9.

The main loop 303 includes an adder 11, an adder 13, an overflow detector (overflow detection circuit) 379, a first local quantizer 15, a limiter 17, an error accumulator 35, an adder 37, a subtractor 19, and a delay element 21, and renders a single integration noise shaping quantizer affording first-order noise shaping (a first noise shaping quantization unit).

The multi stage noise shaping quantizer 301 thus arranged is a multi stage noise shaping quantizer affording (the noise shaping order of the sub-loop 5+1)-order noise shaping.

The overflow detector 379 in the main loop 303 takes the output from the adder 13 to detect whether the first local quantizer 15 will overflow based on the adder 13 output in advance of the overflow in the first local quantizer 15. More specifically, the overflow detector 379 determines that the first local quantizer 15 will overflow if the output of the adder 13 exceeds the input range 51 (see FIG. 5) of the first local quantizer 15. If the overflow detector 379 determines that the first local quantizer 15 will overflow, the overflow detector 379 outputs an overflow detection signal to the error accumulator 35. This overflow detection signal only needs to indicate whether the quantizer will overflow, and can therefore be a two-value signal. The overflow detector 379 differs from the overflow error detector 217 described above in this respect.

The operation of the error accumulator 35 is described next. The feedback output from the sub-loop 5 to the main loop 303 is also inputted to the error accumulator 35, which determines the value of the output to the adder 37 based on the feedback output inputted to the error accumulator 35. As a result, the limit error produced by the output amplitude limiting of the limiter 17 can be appropriately fed back to the main loop 303 and the sub-loop 5 so that the first local quantizer 15 and the second local quantizer 25 do not overflow. The first and second local quantizers 15 and 25 are thus prevented from overflowing, and the dynamic range of the input signal (such as an audio signal) that is quantized by the first local quantizer 15 can be increased.

The error accumulator 35 takes the limit error from the limiter 17 and outputs the received limit error to the adder 37 at a later clock. The error accumulator 35 can adjust the amount of limit error outputted to the adder 37 at each clock. To make this adjustment, the error accumulator 35 can temporarily store the limit error produced by the limiter 17, and determines the sign of the output from the overflow detector 379, the output from the limiter 17 and the feedback output from the feedback circuit 29 in the sub-loop 5. Based on these signs, the error accumulator 35 determines at each clock whether to output the accumulated limit error to the adder 37 and determines the output level if the limit error is to be outputted, and then outputs accordingly to the adder 37. The error accumulator 35 thus temporarily stores the limit error, determines the output level of the limit error at each clock, and outputs the limit error to the adder 37 accordingly.

The operation of the error accumulator 35 is described in further detail below with reference to FIG. 22, FIG. 23, and FIG. 5.

Figure 23:
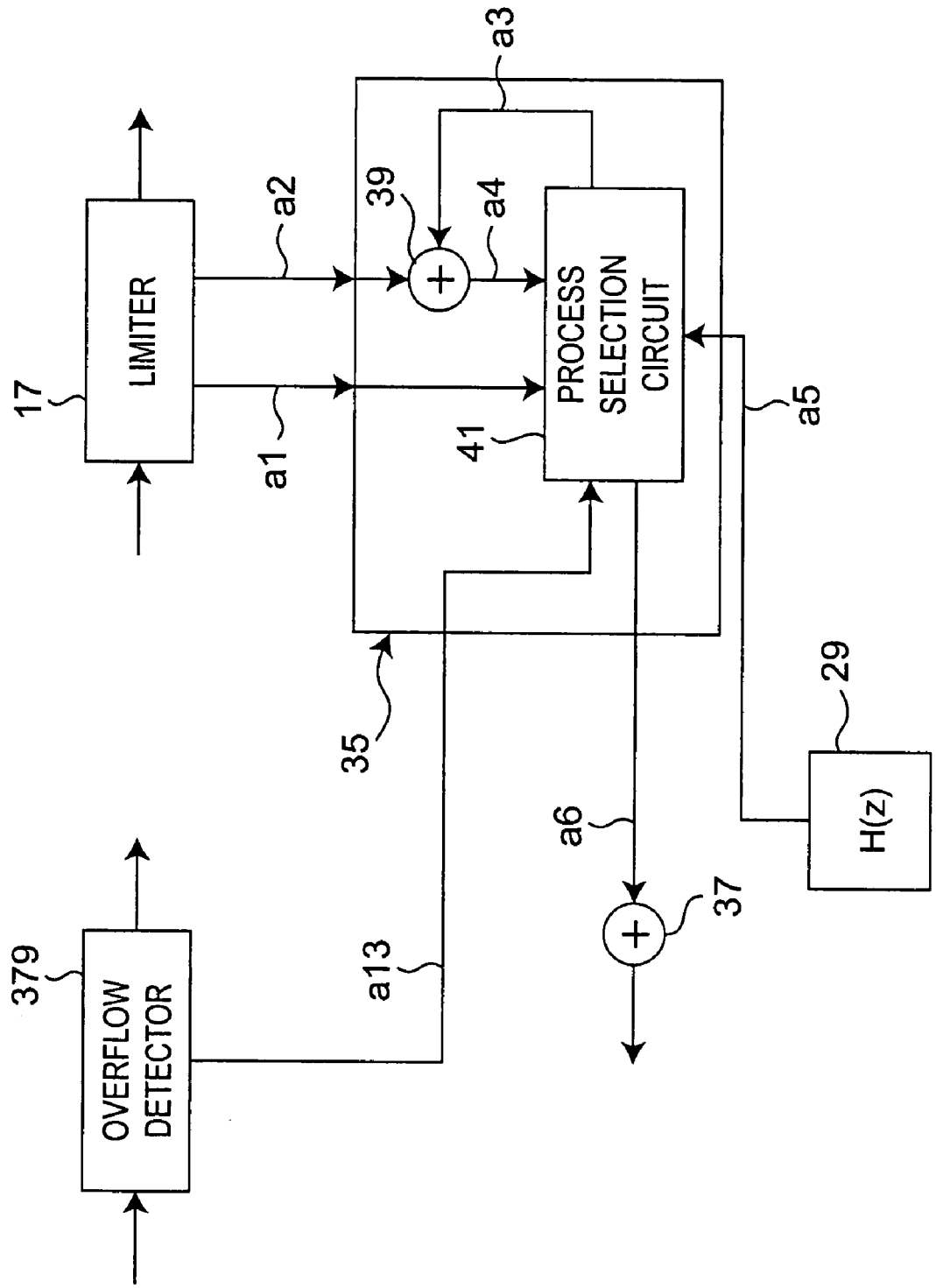
FIG. 23 is a block diagram of the error accumulator in the third embodiment of the invention.

FIG. 23 is a block diagram showing the error accumulator 35 in detail. As shown in FIG. 23, the error accumulator 35 has an adder 39 and a process selection circuit 41. The limit error (new limit error) a2 outputted from the limiter 17 and the limit error (cumulative limit error) a3 currently stored by the process selection circuit 41 are inputted to the adder 39, which adds the inputs and outputs the sum as the updated cumulative limit error a4 to the process selection circuit 41. The first local quantizer output sign signal a1 outputted from the limiter 17, the feedback output a5 of the sub-loop 5, the updated cumulative limit error a4 outputted from the adder 39, and the overflow detection signal outputted from the overflow detector 379 (a first local quantizer 15 operating condition signal) are inputted to the process selection circuit 41. Based on these inputs the process selection circuit 41 determines the level of limit error a6 outputted to the adder 37, and based on this level outputs the limit error a6 to the adder 37.

Referring to FIG. 5(b), when the feedback output from the sub-loop 5 and the output from the adder 11 are the same sign, the input to the first local quantizer 15 includes the input signal portion 63 such as an audio signal, a quantization error portion 61, and a feedback output portion 59 from the sub-loop 5. The input range 51 is filled by these three portions. If limit error caused by the output amplitude limiting by the limiter 17 is then additionally inputted to the first local quantizer 15, the first local quantizer 15 will overflow. To prevent the first local quantizer 15 from overflowing in this case, the error accumulator 35 therefore outputs zero to the adder 37 or does not output.

If the feedback output from the sub-loop 5 and the output from the adder 11 are opposite sign, the feedback output from the sub-loop 5 is added to the output from the adder 11 by the adder 13 and the resulting sum is within the bounds of the input signal portion 63. The feedback output portion 59 is therefore not used in this case and is left. To prevent the first local quantizer 15 from overflowing in this case, the error accumulator 35 outputs limit error within the bounds of the feedback output portion 59 from the accumulated limit error to the adder 37. Therefore, as shown in FIG. 5(c), when the feedback output from the sub-loop 5 and the output from the adder 11 are opposite sign, the input to the first local quantizer 15 includes the input signal portion 63 such as an audio signal, the quantization error portion 61, and a limit error portion 55.

In addition, if the overflow detection signal a13 outputted from the overflow detector 379 indicates a first local quantizer 15 overflow, the quantization error portion 61 may be greater than the normal operating condition. In this case the process selection circuit 41 outputs zero a5 to the adder 37.

If the overflow detection signal a13 outputted from the overflow detector 379 does not indicate a first local quantizer 15 overflow, the process selection circuit 41 determines the output a6 to the adder 37 based on the sign of the first local quantizer output sign signal a1 and the feedback output a5 from the sub-loop 5.

Conditions determining the output level from the error accumulator 35 to the adder 37 in order to prevent the first local quantizer 15 from overflowing are considered above. Conditions determining the output level from the error accumulator 35 to the adder 37 in order to prevent the second local quantizer from overflowing are considered below.

The magnitude of the value (the output of the subtractor 19 in the main loop 303 (that is, the sum of the quantization error of the main loop 303 and the limit error outputted from the error accumulator 35 (referred to below as the "sub-loop input range"))) that can be inputted from the main loop 303 to the adder 23 without causing the second local quantizer 25 to overflow can be determined by a value which is obtained by dividing the input range to the second local quantizer 25 by the gain of the feedback circuit 29 of the sub-loop 5.

The error accumulator 35 determines the output level to the adder 37 that will not cause the second local quantizer 25 to overflow based on a predetermined sub-loop input range and whether the sign denoted by the first local quantizer output sign signal (the sign of the output of the first local quantizer 15) and the sign of the feedback output from the sub-loop 5 are the same or different.

If the sign denoted by the first local quantizer output sign signal and the sign of the feedback output from the sub-loop 5 are the same, the limit error occurring from output amplitude limiting by the limiter 17 and the feedback output from the sub-loop 5 are the same polarity. The error accumulator 35 can therefore determine the level of the outputted limit error based on the feedback output from the sub-loop 5 so that the limit error outputted to the adder 37 does not exceed the range obtained by subtracting the feedback output from the sub-loop input range.

If the sign denoted by the first local quantizer output sign signal and the sign of the feedback output from the sub-loop 5 are different, the limit error occurring from output amplitude limiting by the limiter 17 and the feedback output from the sub-loop 5 are opposite polarity. In this case it is not necessary to consider the feedback output from the sub-loop 5, and the error accumulator 35 can determine the level of the outputted limit error so that the limit error outputted to the adder 37 does not exceed the sub-loop input range.

Based on these conditions, the error accumulator 35 (more particularly the process selection circuit 41) determines the range of outputs to the adder 37 that will not cause the first local quantizer 15 to overflow and the range of outputs to the adder 37 that will not cause the second local quantizer 25 to overflow.

If the first and second local quantizers 15 and 25 are determined to be stable (the sign denoted by the first local quantizer output sign signal and the sign of the feedback output from the sub-loop 5 are opposite), the process selection circuit 41 determines whether the absolute value of the output to the adder 37 that prevents the first local quantizer 15 from overflowing or the absolute value of the output to the adder 37 that prevents the second local quantizer 25 from overflowing is smaller, sets the output a6 to the lesser of these absolute values, and then outputs this limit error a6 to the adder 37. The process selection circuit 41 thus determines the range of outputs a6 to the adder 37 based on the sign denoted by the first local quantizer output sign signal and the sign of the feedback output a5 from the sub-loop 5 so that neither of the first and second local quantizers 15 and 25 overflows, and determines the output a6 from the error accumulator 35 to the adder 37.

This embodiment of the invention determines the output a6 from the error accumulator 35 to the adder 37 using values that can be predetermined when designing the circuit. However, if the process selection circuit 41 is arranged so that the process selection circuit 41 can determine the range of outputs a6 to the adder 37 at each clock by referencing the actual value of the feedback output a5 from the sub-loop 5, the range of values that can be outputted to the adder 37 can be determined more precisely. This is because the margin of the feedback output portion 59 of the first local quantizer 15 in the main loop 303 can be more accurately determined by using the actual feedback output a5 of the sub-loop 5. At the same time, the range of values that can be outputted from the main loop 303 to the adder 23 of the sub-loop 5 can also be determined more precisely.

The operation of the error accumulator 35 is described in further detail below with reference to the flow chart in FIG. 24. Like steps in this and the preceding embodiments are identified by the same reference numerals and further description thereof is omitted.

In step S308, the error accumulator 35 determines if a first local quantizer 15 overflow will occur based on the overflow detection signal. If an overflow will occur (step S308 returns Yes), control goes to step S117. If an overflow will not occur (step S308 returns No), control goes to step S109.

The steps other than step S308 are as already described above.

By arranging the error accumulator 35 to operate in this way, the first local quantizer 15 can be prevented from overflowing as a result of output amplitude limiting by the limiter 17, and the main loop 303 can be kept stable. The new limit error a2 produced by the output amplitude limiting of the limiter 17 is temporarily stored by the error accumulator 35 and outputted appropriately at a later clock. Deterioration in the distortion factor of the signal outputted from the adder 9 is thus also prevented.

This aspect of the invention effectively prevents the first local quantizer 15 from overflowing. A predetermined value determined by the value of the feedback output a5 from the feedback circuit 29 in the sub-loop 5 is therefore added or subtracted from the output of the adder 11 to optimize the value outputted from the main loop 303 to the adder 23 and thereby enable the sub-loop 5 to operate normally. The stability of the main loop 303 and the sub-loop 5 is thus dramatically improved.

Furthermore, by suitably limiting the value outputted from the main loop 303 to the adder 23 in the sub-loop 5, the second noise shaping quantization unit (sub-loop 5) can operate stably.

This aspect of the invention also stabilizes the main loop 303 by appropriately controlling the limit error and quantization error fed back to the main loop 303. The margin portion of the input range 51 of the first local quantizer 15 can also be eliminated, or the size of the margin relative to the input range 51 can be minimized. The proportion of the input range 51 to the first local quantizer 15 that is allocated to the input signal portion 63 (such as an audio signal) can therefore be increased, and the dynamic range of the input signal can be increased.

The results of a simulation are described for reference below. The output amplitude of a multi stage noise shaping quantizer in which the present invention is not used is used as 100%. When a 0-dB, 1-kHz input signal was applied to the multi stage noise shaping quantizer (multi stage noise shaping quantizer 301, for example) of the invention, the output amplitude was 115.384%. When a 0-dB, 10-kHz input signal was applied, the output amplitude was 115.345%. The output amplitude was 115.384% when an input signal outside the operating range of the limiter 17 was applied. This confirmed a substantially uniform increase in the output signal amplitude using a variety of input signals as a result of eliminating the margin portion of the input signal.

In another simulation the distortion factor to a 0-dB, 1-kHz input signal was 6.4% and the distortion factor to a 0-dB, 10-kHz input signal was 5.1% using a multi stage noise shaping quantizer that did not incorporate the present invention. When the multi stage noise shaping quantizer (multi stage noise shaping quantizer 301, for example) of the invention was used, the distortion factor to a 0-dB, 1-kHz input signal was 0.36% and the distortion factor to a 0-dB, 10-kHz input signal was 0.27%. This confirmed that the invention also improves the signal distortion factor.

(Variation of a Multi Stage Noise Shaping Quantizer)

Figure 25:
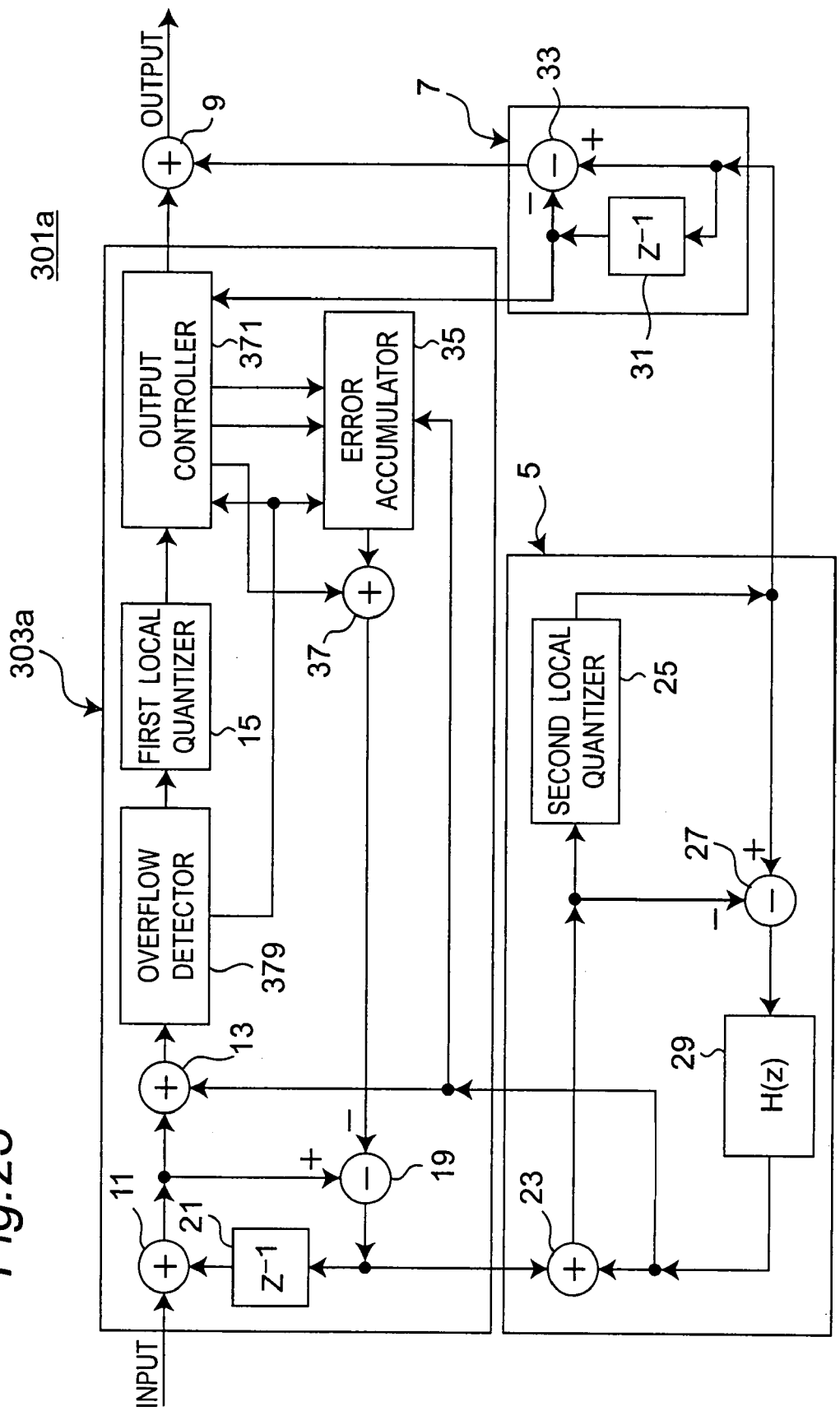
FIG. 25 is a block diagram describing a variation of the third embodiment of the invention.

FIG. 25 is a block diagram of a multi stage noise shaping quantizer 301$a$ according to a variation of the third embodiment of the invention. This multi stage noise shaping quantizer 301$a$ is described below with reference to FIG. 25. The main loop 303$a$ of this multi stage noise shaping quantizer 301$a$ uses an output controller 371 instead of a limiter 17. Similarly to the output controller 71 described above, this output controller 371 has a limiter 17 and an amplitude controller 373. Relative to the object of this invention, this multi stage noise shaping quantizer 301$a$ is as effective or is more effective than the multi stage noise shaping quantizer 301 described above.

Figure 26:
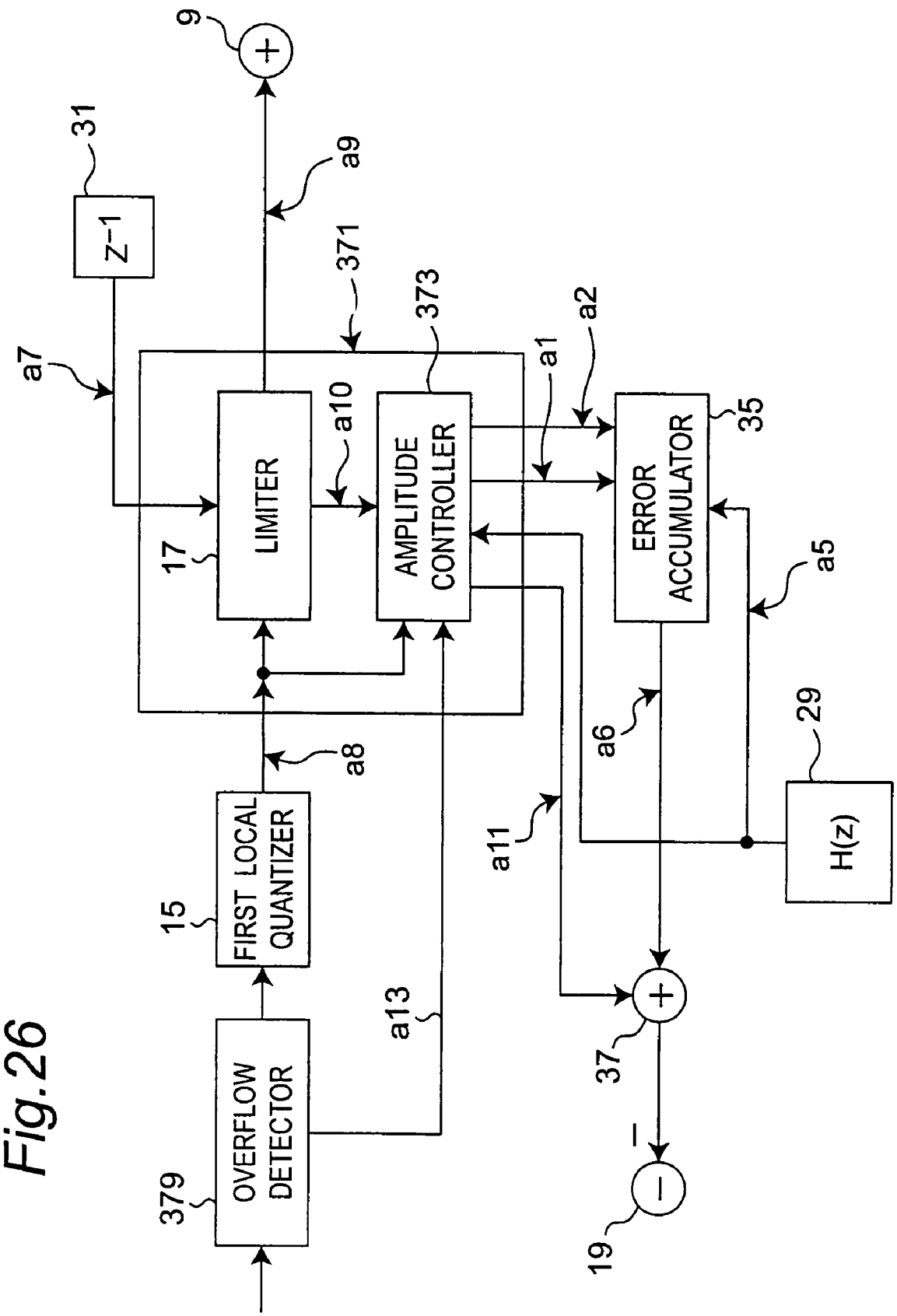
FIG. 26 is a block diagram of the output controller in a variation of the third embodiment of the invention.

FIG. 26 is a detailed block diagram of the output controller 371. As shown in FIG. 26, the output controller 371 has a limiter 17 and an amplitude controller 373.

The limiter 17 limits the output amplitude of the output a8 of the first local quantizer 15 based on the output a7 from the differentiator 7 or the delay element 31 to determine the output a9 to the adder 9. Based on the condition a7 of the differentiator 7 (the value from the delay element 31), the limiter 17 controls the maximum and minimum of the values inputted from the first local quantizer 15 and outputs the controlled value to the adder 9 so that the sum of the output value from the differentiator 7 and the output a9 to the adder 9 does not exceed the output resolution of the multi stage noise shaping circuit. As a result, the output of the first local quantizer 15 can be variably expanded according to the output value of the differentiator 7.

The input a8 to the limiter 17, a signal a10 denoting the operating condition of the limiter 17, the feedback output as from the sub-loop 5, and the overflow detection signal a13 from the overflow detector 379 are inputted to the amplitude controller 373. The amplitude controller 373 computes the limit error produced by the limiter 17 from the input a8 to the limiter 17 and the signal a10 denoting the operating condition of the limiter 17. The amplitude controller 373 also gets information relating to the sign of the feedback output a5 from the feedback output a5 inputted from the sub-loop 5. Based on the overflow detection signal a13, the first local quantizer output sign signal a10, and the feedback output a5 from the sub-loop 5, the amplitude controller 373 then determines if an overflow will occur if the limit error is applied to the main loop 303$a$ and the sub-loop 5. Based on the result, the amplitude controller 373 outputs limit error within the range that will not cause the main loop 303$a$ and the sub-loop 5 to overflow as the output a11 to the adder 37, and outputs the remaining limit error to the error accumulator 35 as the new limit error a2.

The amplitude controller 373 determines the limit error all output to the adder 37 using the same basic process determining the limit error output of the error accumulator 35 in the multi stage noise shaping quantizer 301 described above. More specifically, the amplitude controller 373 outputs (a11) limit error to the adder 37 in a range of values that will not cause the main loop 303$a$ and sub-loop 5 to overflow based on whether the sign of the feedback output a5 of the sub-loop 5 and the sign of the output from the adder 11 are the same or different. The limit error not outputted from the amplitude controller 373 to the adder 37 is outputted to the error accumulator 35 as the new limit error (a2) as in the multi stage noise shaping quantizer 301 described above.

Figure 27:
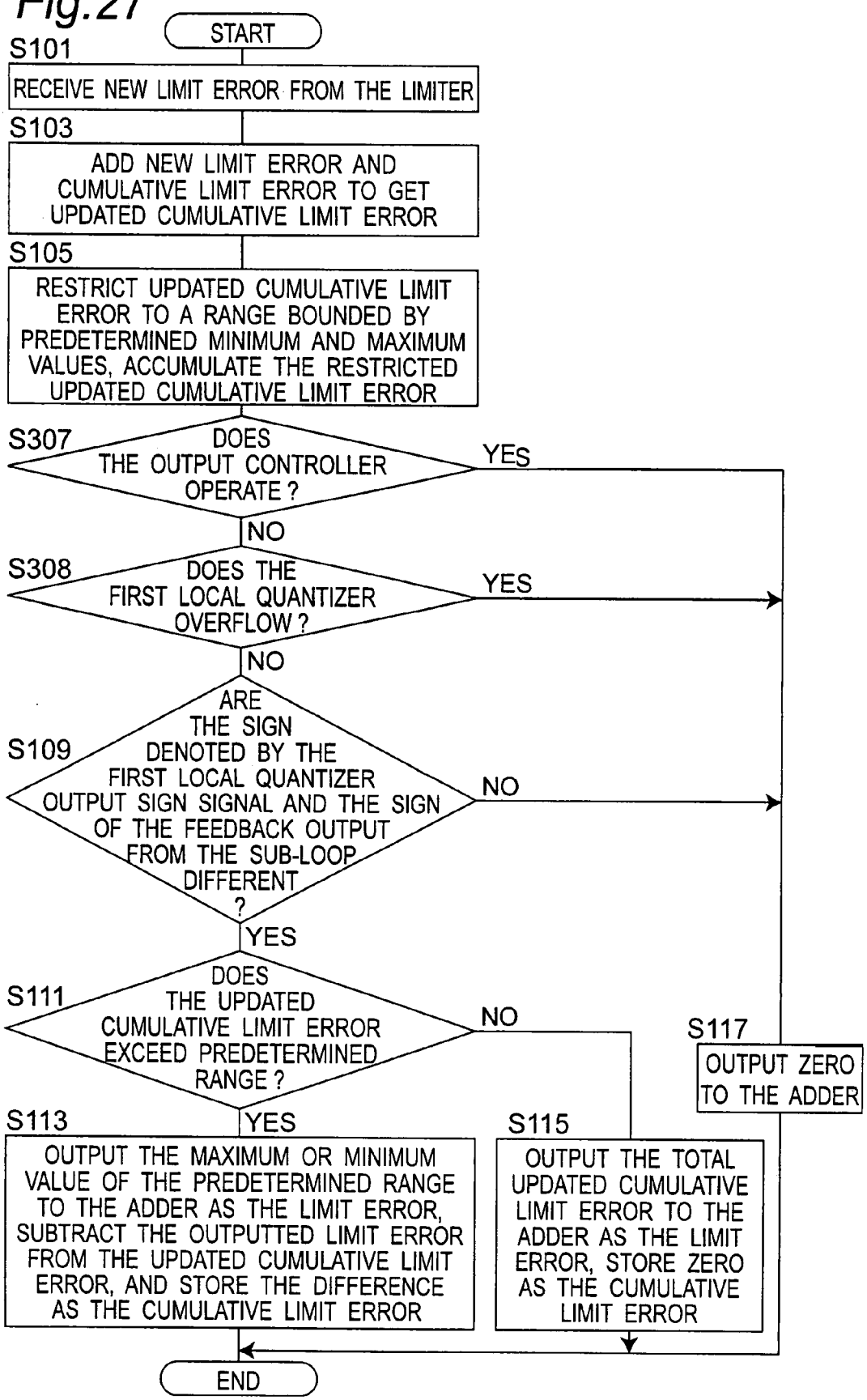
FIG. 27 is a flow chart describing the operation of a variation of the third embodiment of the invention.

FIG. 27 is a flow chart describing the operation of the error accumulator 35 in this multi stage noise shaping quantizer 301$a$. Steps that are the same as in this flow chart and the flow charts described above are identified by the same reference numerals and further description thereof is omitted.

In step S307 the error accumulator 35 compares the updated cumulative limit error and the cumulative limit error to determine the new limit error. If the difference between the updated cumulative limit error and the cumulative limit error is zero, the process selection circuit 41 determines that the output controller 371 does not operate (step S307 returns No) and control goes to step S308. If this difference is a non-zero value, the process selection circuit 41 determines that the output controller 371 operates (step S307 returns Yes), and control goes to step S117.

By using an output controller 371 having an amplitude controller 373, the multi stage noise shaping quantizer 301$a$ according to this embodiment of the invention outputs a part of the limit error resulting from output amplitude limiting by the limiter 17 according to the condition of the main loop 303$a$ and the sub-loop 5. The amount of limit error accumulated in the error accumulator 35 can therefore be reduced and a good signal distortion factor can be maintained.

(Single-integration Noise Shaping Quantizer)

This embodiment of the invention has been described using multi stage noise shaping quantizers 301 and 301$a$ by way of example, but the invention can also be used in a single integration noise shaping quantizer having a single loop.

Figure 28:
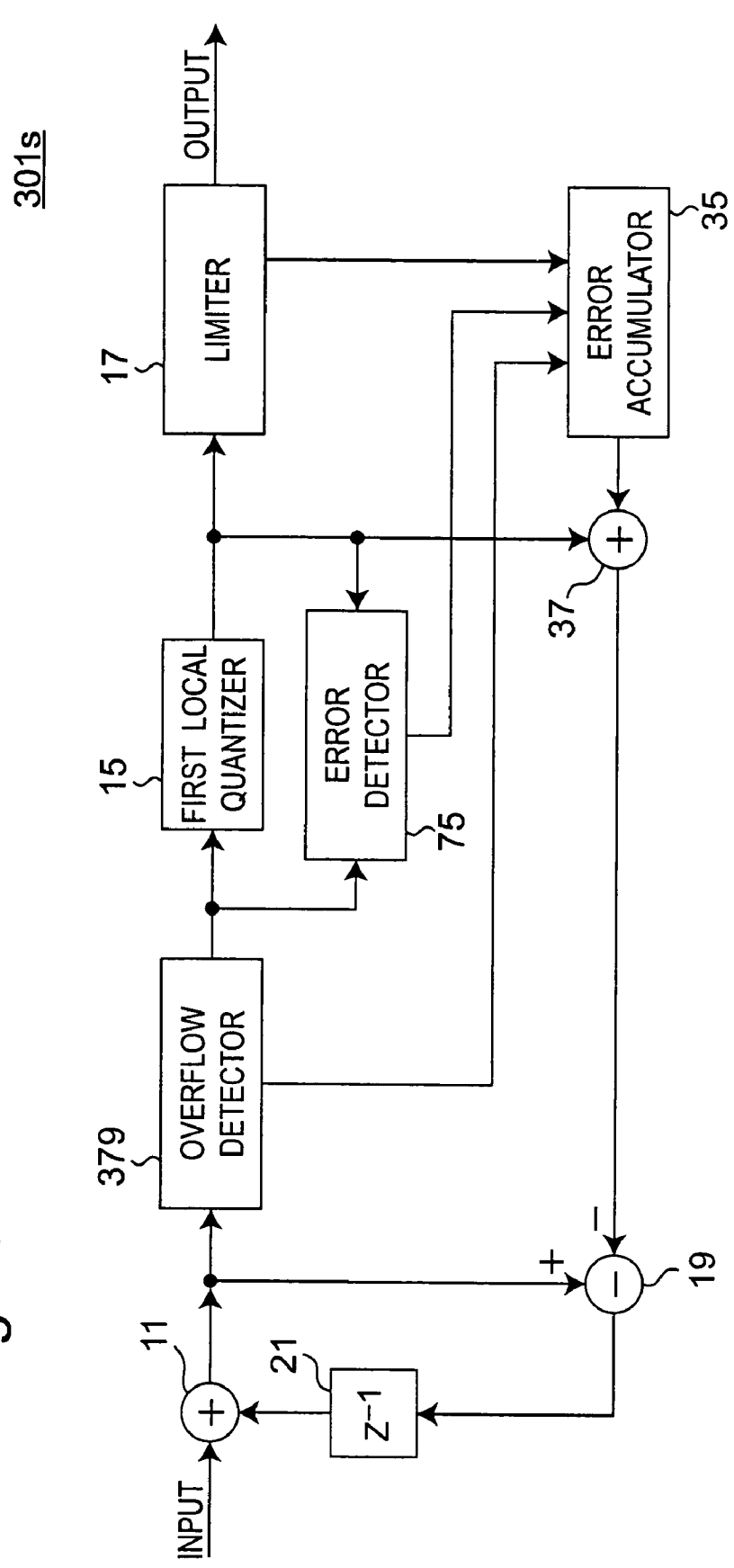
FIG. 28 is a block diagram of the single integration noise shaping quantizer in the third embodiment of the invention.

FIG. 28 is a block diagram of a single integration noise shaping quantizer 301$s$. This single integration noise shaping quantizer 301$s$ has the same effect as the multi stage noise shaping quantizers 301 and 301$a$ described above with respect to the object of the invention. This single integration noise shaping quantizer 301$s$ is described below. Note that like parts in this and the preceding embodiments are identified by the same reference numerals and further description thereof is omitted.

The single integration noise shaping quantizer 301$s$ shown in FIG. 28 differs from the multi stage noise shaping quantizer 301 shown in FIG. 22 in that there is no sub-loop and no feedback from a sub-loop to the error accumulator 35, an error detector 75 for detecting quantization error occurring during quantization by the first local quantizer is added, the output from the error detector 75 is inputted to the error accumulator 35, and the limiter 17 does not input a first local quantizer output sign signal to the error accumulator 35.

This single integration noise shaping quantizer 301$s$ has an adder 11, an overflow detector 379, a first local quantizer 15, a limiter 17, an error accumulator 35, an error detector 75, an adder 37, a subtractor 19, and a delay element 21, and is a single integration noise shaping quantizer affording first-order noise shaping.

The operation of the error detector 75 is as described above and further description thereof is omitted here.

Figure 29:
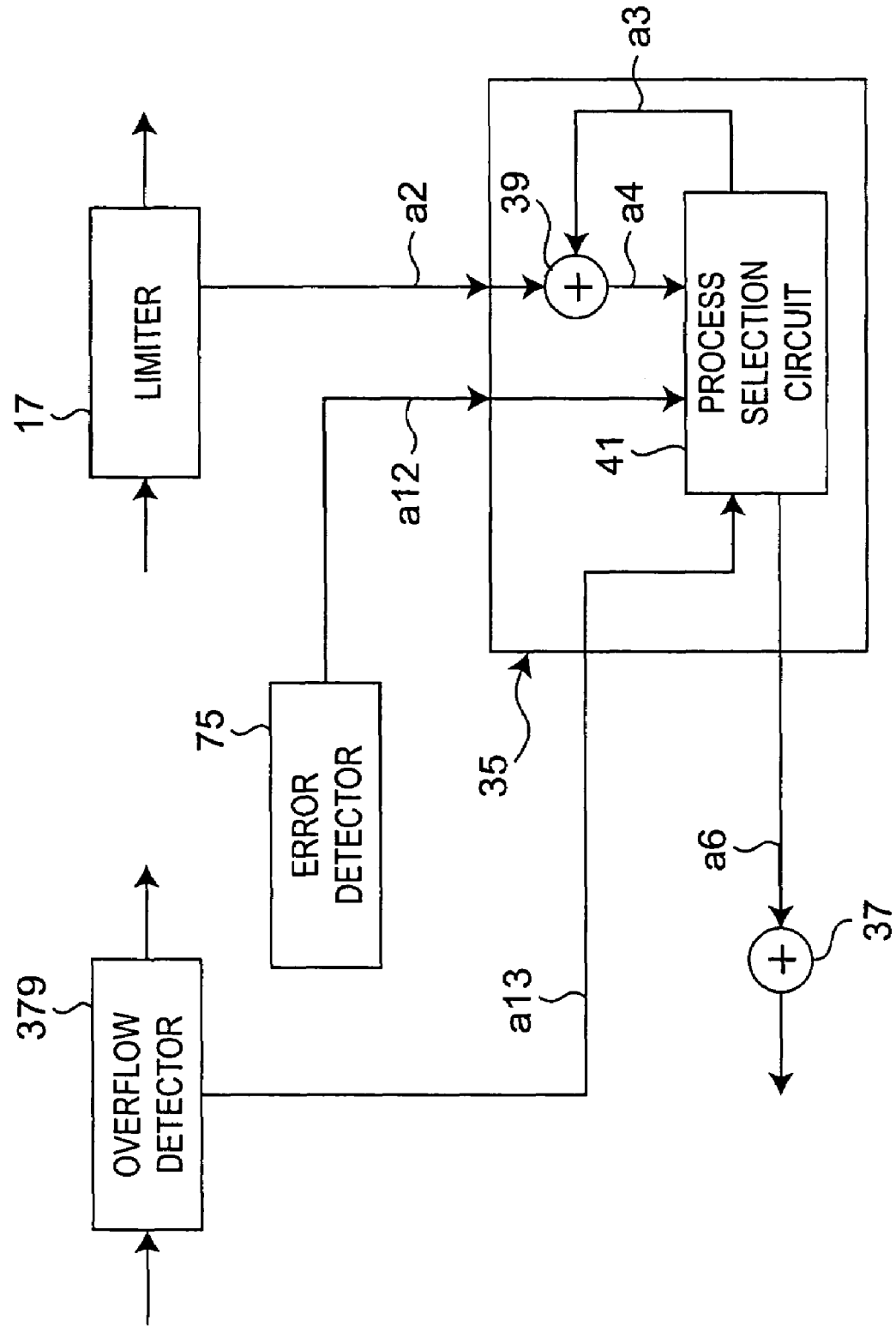
FIG. 29 is a block diagram of the error accumulator in the single integration noise shaping quantizer according to the third embodiment of the invention.

FIG. 29 is a block diagram of the error accumulator 35. Like parts in FIG. 29 and the error accumulator 35 shown in FIG. 23 are identified by the same reference numerals and further description thereof is omitted. The operation of the error accumulator 35 differs according to whether the error detector 75 detects the sign of the quantization error from the first local quantizer 15 or calculates the value of the quantization error from the first local quantizer 15. Operation of the error accumulator 35 is therefore described for both cases.

The operation of the error accumulator 35 when the error detector 75 detects the sign of the quantization error from the first local quantizer 15 is described first. The error accumulator 35 first determines if the cumulative limit error a3 accumulated from the limiter 17 in previous clocks equals the updated cumulative limit error a4. If the new limit error a2 is determined to be zero, the error accumulator 35 determines that the limiter 17 is not operating. Based on the overflow detection signal a13, the error accumulator 35 determines if the first local quantizer 15 is in an overflow condition. The error accumulator 35 then compares the sign of the updated cumulative limit error with the sign denoted by the quantization error sign signal a12 inputted from the error detector 75 and determines if the signs are the same or different. The error accumulator 35 determines the output (limit error a6) to the adder 37 based on whether these compared signs are the same or different, and whether the first local quantizer 15 is in an overflow condition. If the first local quantizer 15 is overflowing, the error accumulator 35 does not output to the adder 37. If a first local quantizer 15 overflow is not detected, the new limit error a2 is zero, and the compared signs are different, the error accumulator 35 outputs the limit error a6 to the adder 37.

If the signs are different, a first local quantizer 15 overflow condition is not detected, and the new limit error a2 is zero, the limit error a6 outputted by the error accumulator 35 to the adder 37 is less than or equal to the quantization error portion 77 (see FIG. 12). Note that the step of determining whether the limiter 17 is operating is not essential.

Figure 30:
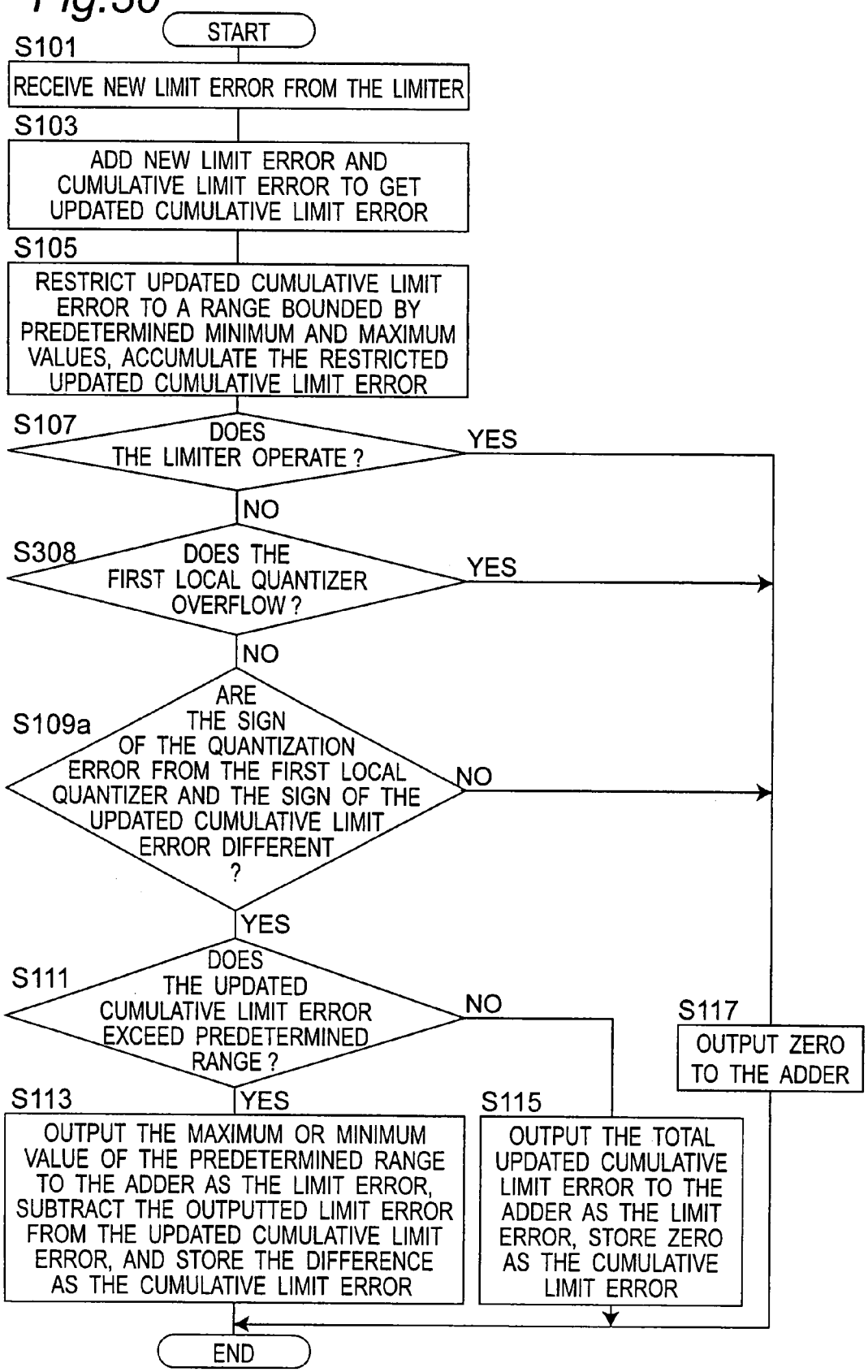
FIG. 30 is a flow chart describing the operation of the single integration noise shaping quantizer in the third embodiment of the invention.

FIG. 30 is a flow chart describing the operation of the error accumulator 35 when the error detector 75 detects the sign of the quantization error from the first local quantizer 15. Identical steps in FIG. 30 and the previously described flow charts are identified by the same reference numerals and further description thereof is omitted.

In step S109a, the error accumulator 35 compares the sign denoted by the quantization error sign signal received from the error detector 75 and the sign of the updated cumulative limit error. If the signs are the same (step S109a returns No), control goes to step S117. If the signs are different (step S109a returns Yes), control goes to step S111.

Step S109a more specifically compares the sign of the limit error accumulated in the process selection circuit 41 (either the updated cumulative limit error or the cumulative limit error) and the sign of the quantization error from the first local quantizer 15, and determines if the quantization error portion 61 of the input range 51 is used.

Figure 24:
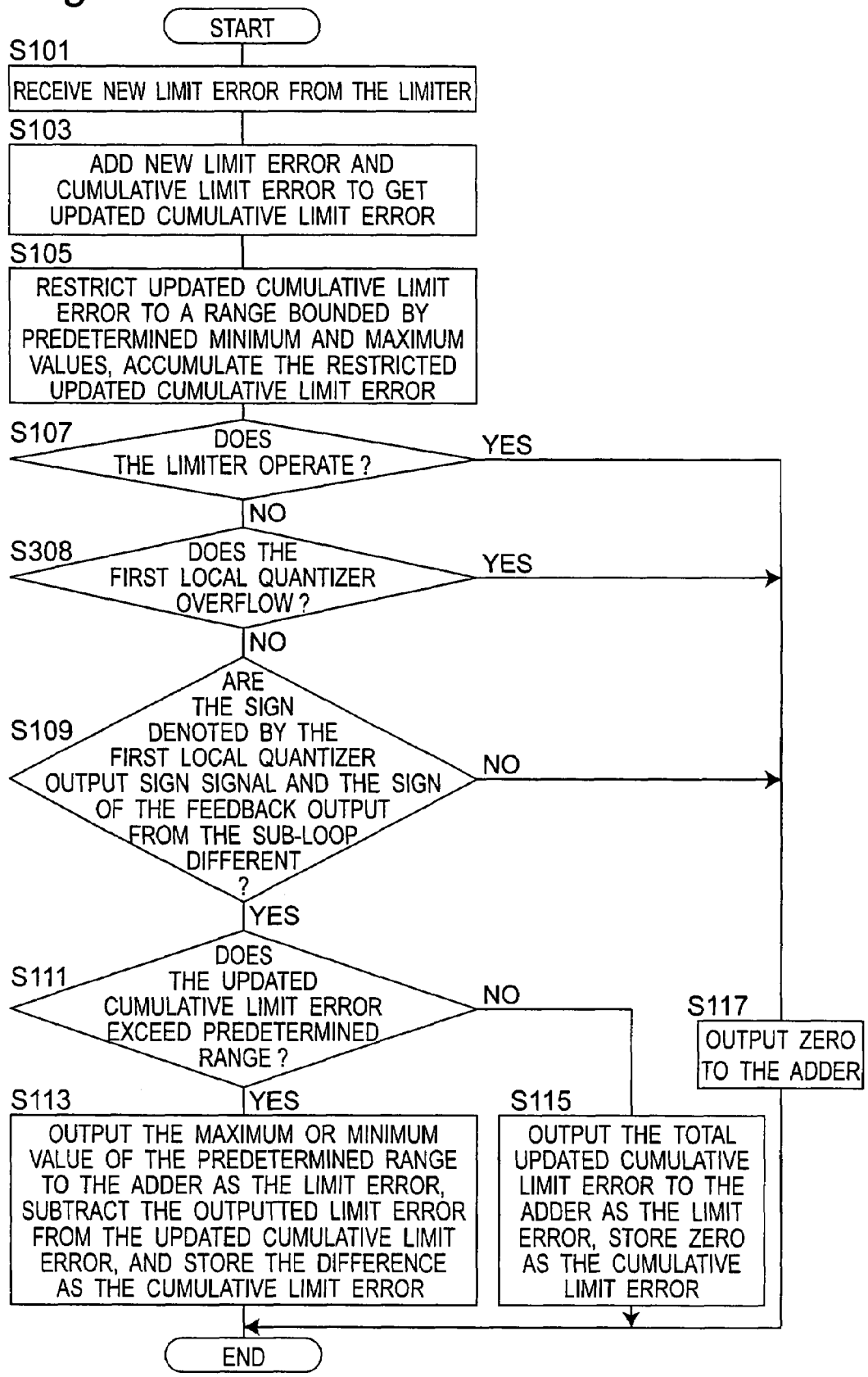
FIG. 24 is a flow chart describing the operation of the multi stage noise shaping quantizer according to the third embodiment of the invention.

The steps other than step S109a are the same as shown in FIG. 24.

The operation of the error accumulator 35 when the error detector 75 calculates the value of the quantization error from the first local quantizer 15 is described next. The margin is again assumed to be zero in this case.

If the overflow detection signal a13 indicates that the first local quantizer 15 will overflow, the error accumulator 35 outputs a compensation output to the adder 37 so that the quantization error of the first local quantizer 15 is within the bounds of the quantization error portion 61, and adds a value corresponding to this compensation output to the limit error accumulated by the error accumulator 35. The value of this compensation output is determined by subtracting the quantization error portion 61 from the quantization error of the first local quantizer 15.

If the overflow detection signal a13 indicates that the first local quantizer 15 will not overflow, the error accumulator 35 subtracts the quantization error denoted by the quantization error sign signal a12 from the quantization error portion 61 to determine how much limit error can be outputted to the adder 37, and outputs limit error a6 within the limit that will not exceed the updated cumulative limit error to the adder 37.

Figure 31:
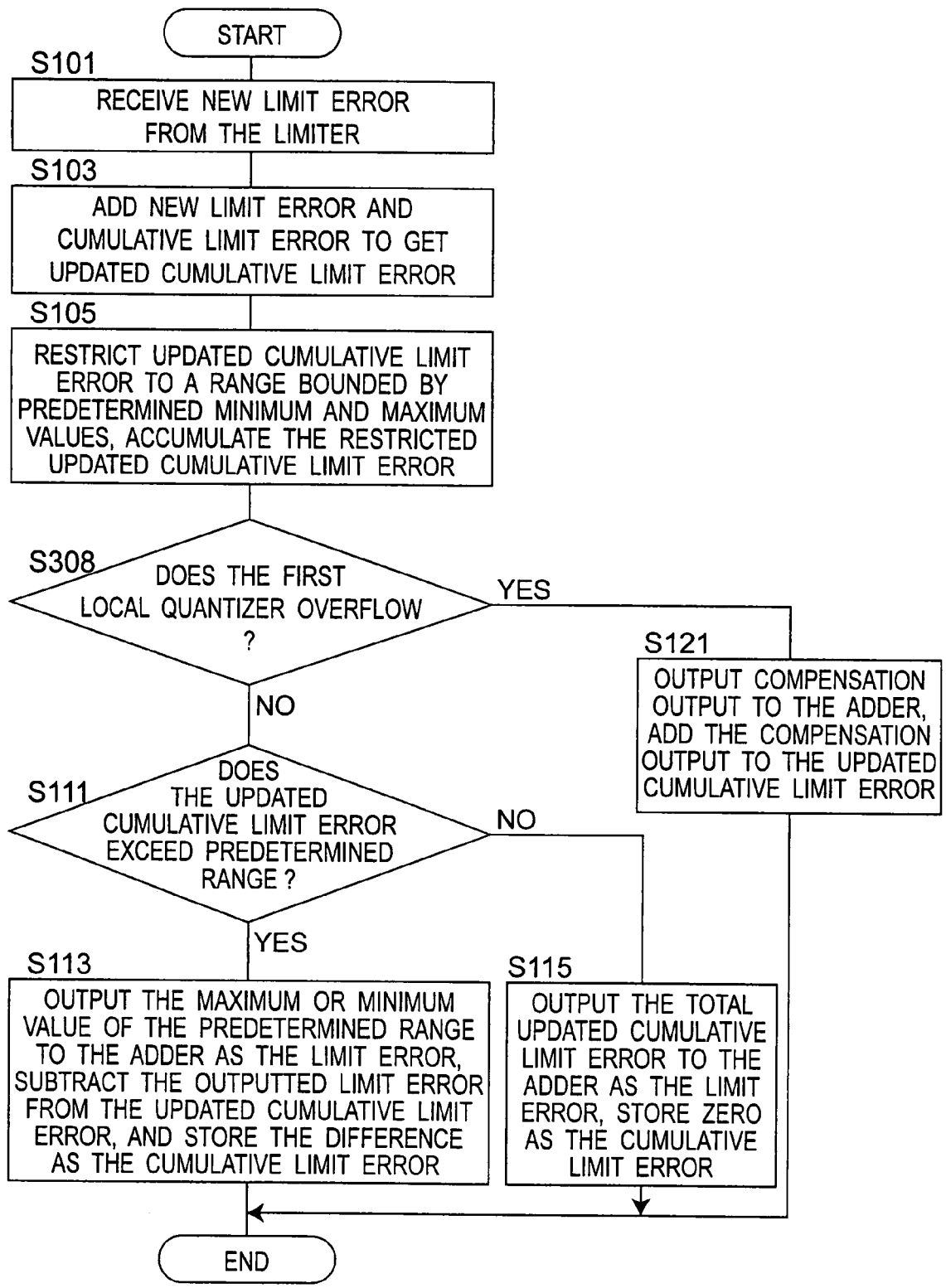
FIG. 31 is a flow chart describing the operation of the single integration noise shaping quantizer in the third embodiment of the invention.

FIG. 31 is a flow chart describing the operation of the error accumulator 35 when the error detector 75 calculates the value of the quantization error from the first local quantizer 15. Steps that are the same in this flow chart and the previously described flow charts are identified by the same reference numerals and further description thereof is omitted.

Step S107 and step S109 in FIG. 24 are omitted from the flow chart in FIG. 31.

In step S121, the error accumulator 35 outputs a compensation output to the adder 37 so that the quantization error of the first local quantizer 15 is within the limits of the quantization error portion 61, and adds a value corresponding to the compensation output to the updated cumulative error.

Steps other than step S121 are the same as shown in the flow chart in FIG. 24.

As described above, the error accumulator 35 in this single integration noise shaping quantizer 301s can accumulate the limit error resulting from output amplitude limiting by the limiter 17 and the quantization error produced by the first local quantizer 15. Based on the overflow detection signal a13, the sign of the accumulated error, and the sign or value of the quantization error, the accumulated error is then fed back to the first local quantizer 15. As a result, the loop can be kept stable and a drop in the signal distortion factor can be suppressed by appropriately feeding back the error caused by output amplitude limiting or the compensation output at a later clock.

In addition, by controlling the error that is fed back and stabilizing the loop, the margin portion of the input range 51 to the first local quantizer 15 can also be eliminated, or the size of the margin relative to the input range 51 can be minimized. The proportion of the input range 51 to the first local quantizer 15 that is allocated to the input signal portion 63 can therefore be increased, and the dynamic range of the input signal, such as an audio signal, can be increased.

Fourth Embodiment

This embodiment of the invention includes a multi stage noise shaping quantizer, variations thereof, and a single integration noise shaping quantizer.

(Multi Stage Noise Shaping Quantizer)

Figure 32:
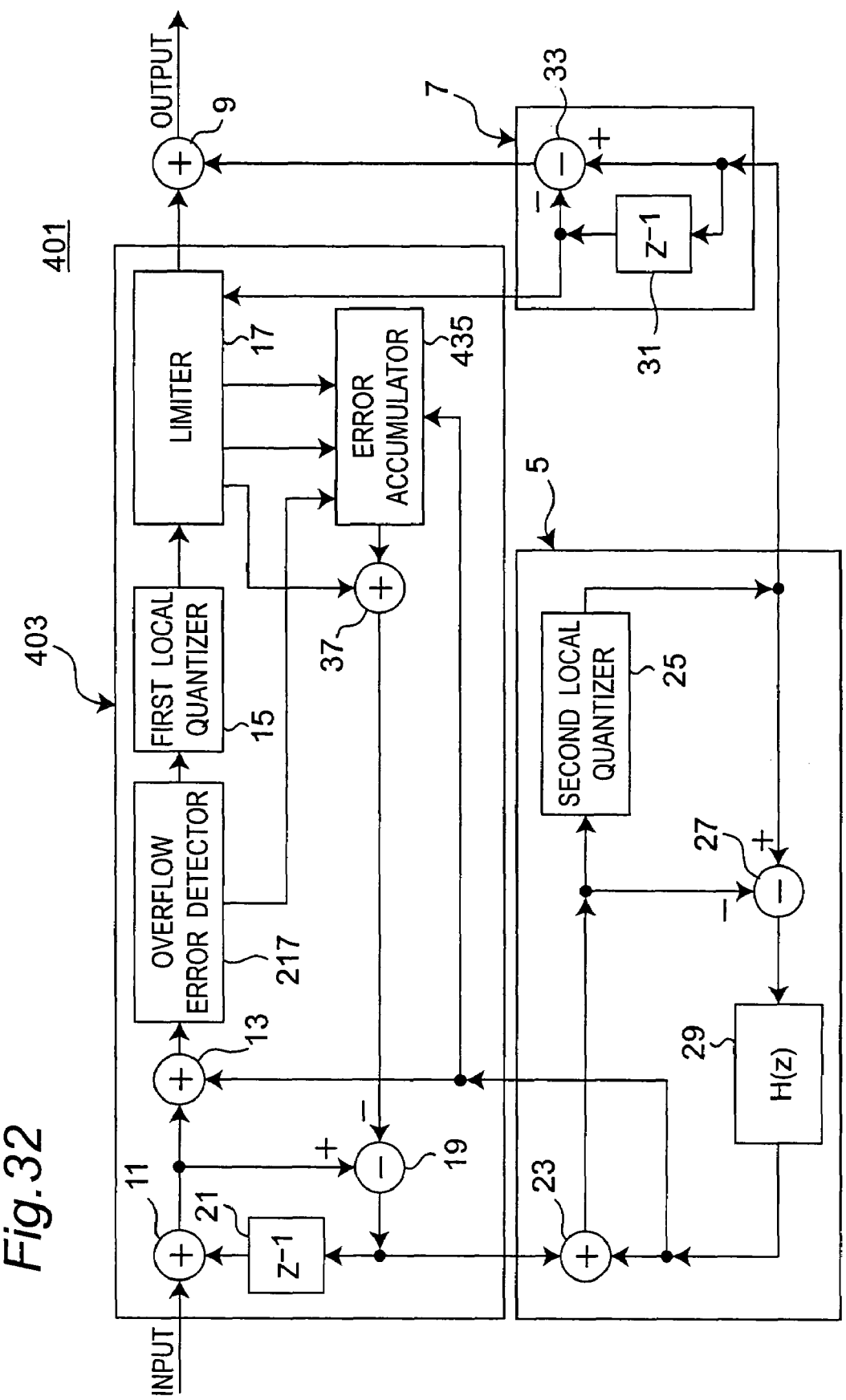
FIG. 32 is a block diagram of a multi stage noise shaping quantizer according to a fourth embodiment of the invention.

FIG. 32 is a block diagram showing a multi stage noise shaping quantizer 401 according to this fourth embodiment of the invention. This multi stage noise shaping quantizer 401 has a main loop 403, a sub-loop 5, a differentiator 7, and an adder 9.

The main loop 403 includes an adder 11, an adder 13, an overflow error detector 217, a first local quantizer 15, a limiter 17, an error accumulator 435, an adder 37, a subtractor 19, and a delay element 21, and renders a single integration noise shaping quantizer affording first-order noise shaping (a first noise shaping quantization unit).

The multi stage noise shaping quantizer 401 thus arranged is a multi stage noise shaping quantizer affording (the noise shaping order of the sub-loop 5+1)-order noise shaping.

The overflow error detector 217 is arranged as described in a previous embodiment above. The error accumulator 435 determines the sign of the output from the first local quantizer 15 based on either or both the output from the limiter 17 and the output from the overflow error detector 217.

In this embodiment of the invention the error accumulator 435 accumulates the overflow error outputted by the overflow error detector 217. In addition, the error accumulator 435 also accumulates the limit error outputted by the limiter 17. Based on the operating condition of the first local quantizer 15 (the first local quantizer output sign signal and the overflow error), operating condition of the limiter 17, and the sign of the feedback output from the feedback circuit 29 of the sub-loop 5, the error accumulator 435 appropriately controls and outputs accumulated overflow error and limit error (the bothe errors are referred below to as error, simply) to the adder 37.

The operation of the error accumulator 435 is described in further detail below with reference to FIG. 32, FIG. 33, and FIG. 5.

Figure 33:
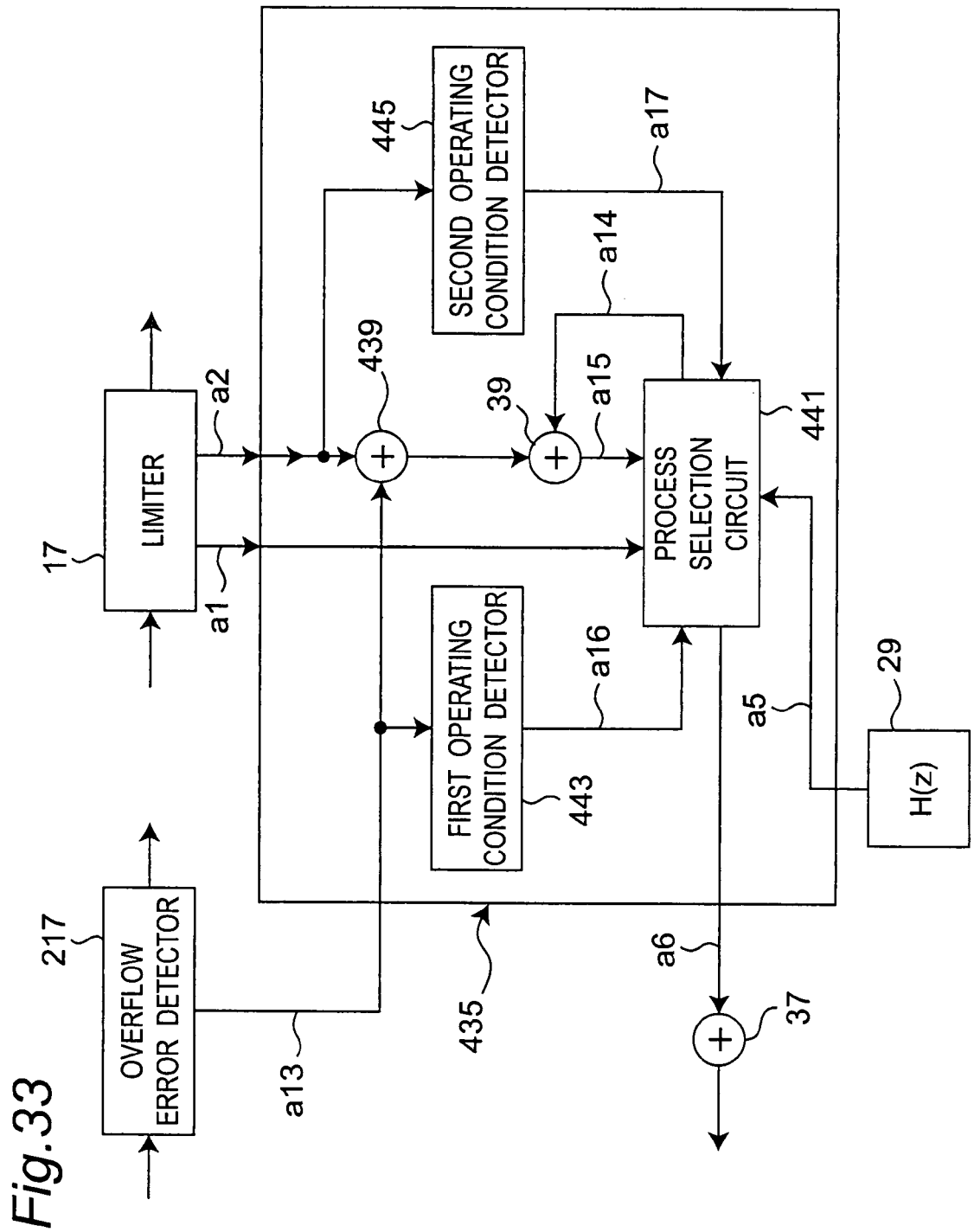
FIG. 33 is a block diagram of the error accumulator in a fourth embodiment of the invention.

FIG. 33 is a block diagram showing the error accumulator 435 in detail. As shown in FIG. 33 the error accumulator 435 has an adder 39, a process selection circuit 441, an adder 439, a first operating condition detector (first operating condition detection circuit) 443, and a second operating condition detector (second operating condition detection circuit) 445. In this error accumulator 435 the overflow error a13 and new limit error a2 are added by the adder 439 and outputted to the adder 39. The operation of the adder 39 is as described in the preceding embodiments.

The first operating condition detector 443 detects whether the overflow error a13 is zero or not. The first operating condition detector 443 thus detects if the overflow error detector 217 operates, and outputs the overflow detection signal a16 of the first local quantizer 15 to the process selection circuit 441.

The second operating condition detector 445 detects whether the new limit error a2 is zero or not. The second operating condition detector 445 thus determines if the limiter 17 operates and outputs the limiter operating condition signal a17.

The process selection circuit 441 outputs a6 to the adder 37 based on the first local quantizer output sign signal a1, the overflow detection signal a16, the feedback output a5 from the sub-loop 5, and the limiter operating condition signal a17.

Determining the value of the output a6 from the error accumulator 435 to the adder 37, and more particularly the value of the output a6 from the process selection circuit 441 to the adder 37, is described next.

The condition that the output a6 to the adder 37 will not cause the first local quantizer 15 to overflow is first determined.

The case in which the overflow detection signal a16 indicates an occurrence of overflow in the first local quantizer 15 is considered first. In this case the quantization error of the first local quantizer 15 is probably greater than the quantization error during normal operation. The output a6 to the adder 37 must therefore be zero regardless of whether the first local quantizer output sign signal a1 and the feedback output a5 from the sub-loop 5 are the same sign or different in order to stabilize the operation of the first local quantizer 15.

The case in which the overflow detection signal a16 does not indicate an occurrence of overflow in the first local quantizer 15 is considered next. If the sign of the first local quantizer output sign signal a1 and the sign of the feedback output a5 from the sub-loop 5 are also different in this case, the accumulated limit error that is outputted a6 to the adder 37 is limited to the bounds of the feedback output portion 59. If the sign of the first local quantizer output sign signal a1 and the sign of the feedback output a5 from the sub-loop 5 are the same, the output a6 to the adder 37 is zero.

Conditions determining the output a6 from the error accumulator 435 to the adder 37 in order to prevent the first local quantizer 15 from overflowing are considered above. Conditions determining the output level from the error accumulator 435 to the adder 37 in order to prevent the second local quantizer from overflowing are considered below.

The magnitude of the value (the output of the subtractor 19 in the main loop 403 (that is, the sum of the quantization error of the main loop 403 and the limit error outputted from the error accumulator 435 (referred to below as the "sub-loop input range"))) that can be inputted from the main loop 403 to the adder 23 without causing the second local quantizer 25 to overflow can be determined by a value which is obtained by dividing the input range to the second local quantizer 25 by the gain of the feedback circuit 29 of the sub-loop 5.

The error accumulator 435 determines the output level to the adder 37 that will not cause the second local quantizer 25 to overflow based on a predetermined sub-loop input range and whether the sign denoted by the first local quantizer output sign signal (the sign of the output of the first local quantizer 15) and the sign of the feedback output from the sub-loop 5 are the same or different.

If the sign denoted by the first local quantizer output sign signal a1 and the sign of the feedback output a5 from the sub-loop 5 are the same, the polarities of the overflow error a13 and the limit error a2 resulting from output amplitude limiting by the limiter 17 will be the same as the polarity of the feedback output a5 of the sub-loop 5. The error accumulator 435 therefore considers the feedback output a5 of the sub-loop 5 to determine the output error level a6 so that the error outputted to the adder 37 does not exceed the values in the range of the sub-loop input range minus the feedback output from the sub-loop.

If the sign denoted by the first local quantizer output sign signal a1 and the sign of the feedback output a5 from the sub-loop 5 are different, the polarities of the overflow error a13 and the limit error a2 resulting from output amplitude limiting by the limiter 17 will be different from the polarity of the feedback output a5 of the sub-loop 5. The feedback output a5 from the sub-loop 5 therefore does not need to be considered, and the error accumulator 435 determines the output error level a6 so that the error output a6 to the adder 37 does not exceed the sub-loop input range.

Based on these conditions, the error accumulator 435 (more particularly the process selection circuit 441) determines the range of outputs to the adder 37 that will not cause the first local quantizer 15 to overflow and the range of outputs to the adder 37 that will not cause the second local quantizer 25 to overflow.

If the first and second local quantizers 15 and 25 are determined to be stable (the sign denoted by the first local quantizer output sign signal a1 and the sign of the feedback output a5 from the sub-loop 5 are opposite) the process selection circuit 441 determines whether the absolute value of the output to the adder 37 that prevents the first local quantizer 15 from overflowing or the absolute value of the output to the adder 37 that prevents the second local quantizer 25 from overflowing is smaller, sets the error output a6 to the lesser of these absolute values, and then outputs this error a6 to the adder 37. The process selection circuit 441 thus determines the range of outputs a6 to the adder 37 based on the sign denoted by the first local quantizer output sign signal a1 and the sign of the feedback output a5 from the sub-loop 5 so that neither of the first and second local quantizers 15 and 25 overflows, and determines the output a6 from the error accumulator 435 to the adder 37.

This embodiment of the invention determines the output a6 from the error accumulator 435 to the adder 37 using values that can be predetermined when designing the circuit. However, if the process selection circuit 441 is arranged so that the process selection circuit 441 can determine the range of outputs a6 to the adder 37 at each clock by referencing the actual value of the feedback output a5 from the sub-loop 5, the range of values that can be outputted to the adder 37 can be determined more precisely. This is because the margin of the feedback output portion 59 of the first local quantizer 15 in the main loop 403 can be more accurately determined by using the actual feedback output as of the sub-loop 5. At the same time, the range of values that can be outputted from the main loop 403 to the adder 23 of the sub-loop 5 can also be determined more precisely.

The operation of the error accumulator 435 is described in further detail below with reference to the flow chart in FIG. 34.

In step S401, the error accumulator 435 receives and adds the overflow error a13 and the limit error resulting from output amplitude limiting by the limiter 17, and determines the new error.

In step S403, the error accumulator 435 adds this new error and the currently accumulated error (cumulative error) a14 to determine the updated cumulative error a15.

In step S405, the error accumulator 435 limits the updated cumulative error a15 to a predetermined range of values, and stores this limited updated cumulative error. The predetermined value range used here is the range from the maximum value to the minimum value that can be stored by the process selection circuit 441. The limiting operation of this step can be skipped if the updated cumulative error a15 is within this predetermined range of values.

In step S308, the process selection circuit 441 determines if the first local quantizer 15 overflowed based on the overflow detection signal a16. If the first local quantizer 15 overflowed (step S308 returns Yes), control goes to step S117. If the overflow does not occur (step S308 returns No), control goes to step S107.

In step S107, the process selection circuit 441 determines if the limiter 17 operates based on the limiter operating condition signal a17. If the limiter 17 operates (step S107 returns Yes), control goes to step S117. If the limiter 17 does not operate (step S107 returns No), control goes to step S109.

Step S109 operates as described in the preceding embodiments.

In step S411, the error accumulator 435 compares the range of output values to the adder 37 that will not cause the first local quantizer 15 and the second local quantizer 25 to overflow in the case that the sign denoted by the first local quantizer output sign signal a1 and the sign of the feedback output a5 from the sub-loop 5 are different with the updated cumulative error. If the updated cumulative error is outside this range of outputs to the adder 37 (step S411 returns Yes), control goes to step S413. If the updated cumulative error is not outside the range of outputs to the adder 37 (step S411 returns No), control goes to step S415.

In step S413, the error accumulator 435 outputs as the error a6 outputted to the adder 37 the value that is closest to the updated cumulative error and is in the range of output values to the adder 37 that will not cause the first local quantizer 15 and the second local quantizer 25 to overflow when the sign denoted by the first local quantizer output sign signal a1 and the sign of the feedback output a5 from the sub-loop 5 are opposite. The process selection circuit 441 also stores the difference of the updated cumulative error minus the output value as the cumulative error.

In step S415, the error accumulator 435 outputs the total updated cumulative error as the output a6 to the adder 37. The process selection circuit 441 also stores zero as the cumulative error.

In step S117, the error accumulator 435 outputs zero to the adder 37 or does not output. This is because if step S117 is called the first and second local quantizers 15 and 25 are unstable and could overflow. Note that the decision of step S107 is not essential.

By arranging the error accumulator 435 to operate in this way, the first local quantizer 15 can be prevented from overflowing as a result of overflow error and output amplitude limiting by the limiter 17, and the main loop 403 can be kept stable. The new error a2 (=output a13+output a2) resulting from the overflow error a13 and the output amplitude limiting of the limiter 17 is temporarily stored by the error accumulator 435 and output appropriately at a later clock. Deterioration in the distortion factor of the signal outputted from the adder 9 is thus also prevented.

The process of limiting the value range of the updated cumulative error in step S405 is to prevent from delaying the timing at which the accumulated error is returned to the adder 37 due to the frequent operating of the limiter 17 and causing the error a6 to become noise. The quantizer 401 can operate normally without running the process of step S405 as long as the limiter 17 does not operate frequently.

This aspect of the invention effectively prevents the first local quantizer 15 from overflowing. A predetermined value determined by the value of the feedback output a5 from the feedback circuit 29 in the sub-loop 5 is therefore added or subtracted from the output of the adder 11 to optimize the value output from the main loop 403 to the adder 23 and thereby enable the sub-loop 5 to operate normally. The stability of the main loop 403 and the sub-loop 5 is thus dramatically improved.

Furthermore, by suitably limiting the value outputted from the main loop 403 to the adder 23 in the sub-loop 5, the second noise shaping quantization unit (sub-loop 5) can operate stably.

This aspect of the invention also stabilizes the main loop 403 by appropriately controlling the limit error and quantization error fed back to the main loop 403. The margin portion of the input range 51 to the first local quantizer 15 can also be eliminated, or the size of the margin relative to the input range 51 can be minimized. The proportion of the input range 51 to the first local quantizer 15 that is allocated to the input signal portion 63 (such as an audio signal) can therefore be increased, and the dynamic range of the input signal can be increased.

(Variation of the Multi Stage Noise Shaping Quantizer)

Figure 35:
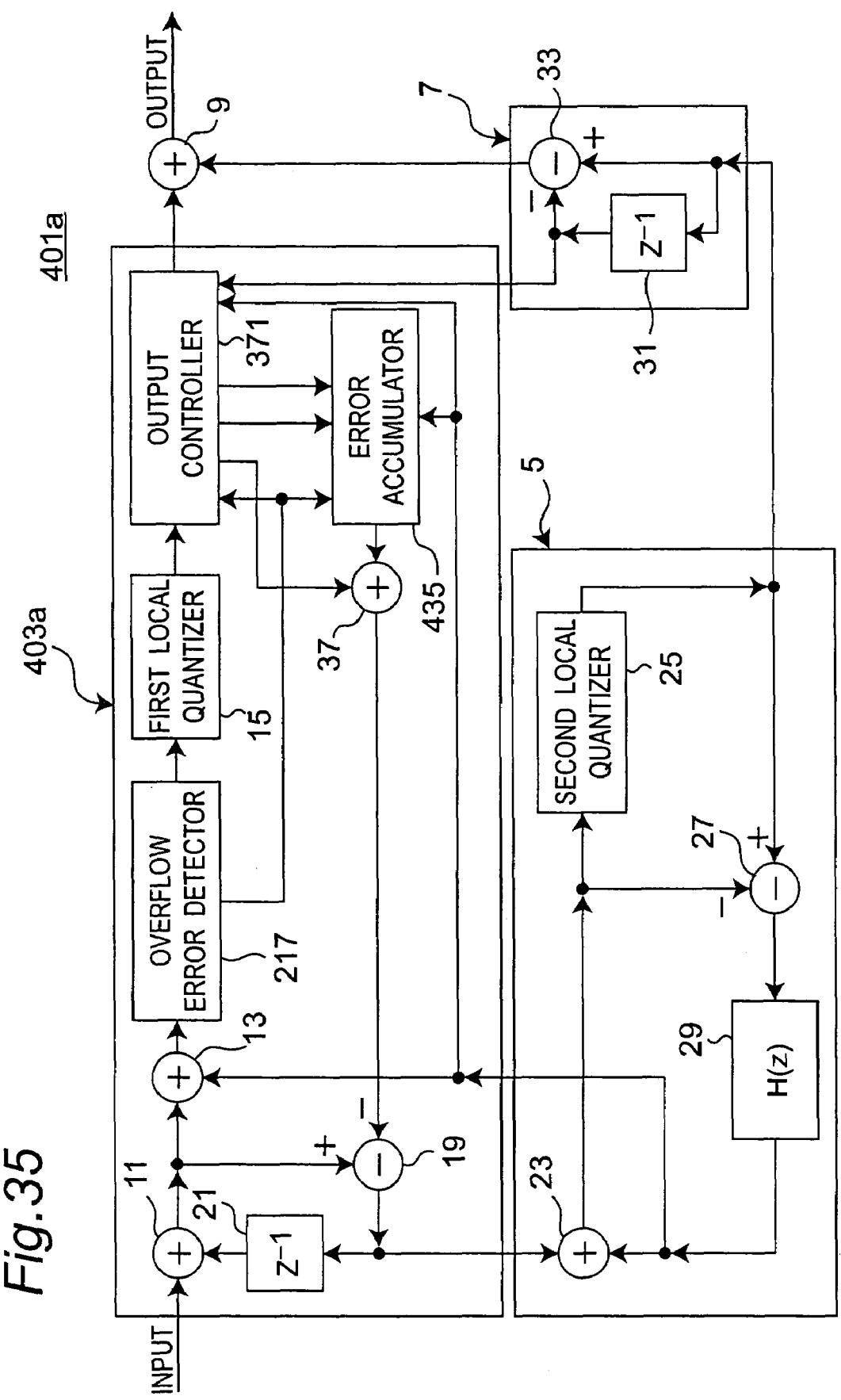
FIG. 35 is a block diagram of a variation of the fourth embodiment of the invention.

FIG. 35 is a block diagram of a multi stage noise shaping quantizer 401a according to a variation of the fourth embodiment of the invention. This multi stage noise shaping quantizer 401a is described below with reference to FIG. 35. The main loop 403a of this multi stage noise shaping quantizer 401a uses an output controller 371 instead of a limiter 17. This output controller 371 has a limiter 17 and an amplitude controller 373. Relative to the object of this invention, this multi stage noise shaping quantizer 401a is as effective or is more effective than the multi stage noise shaping quantizer 401 described above.

Figure 36:
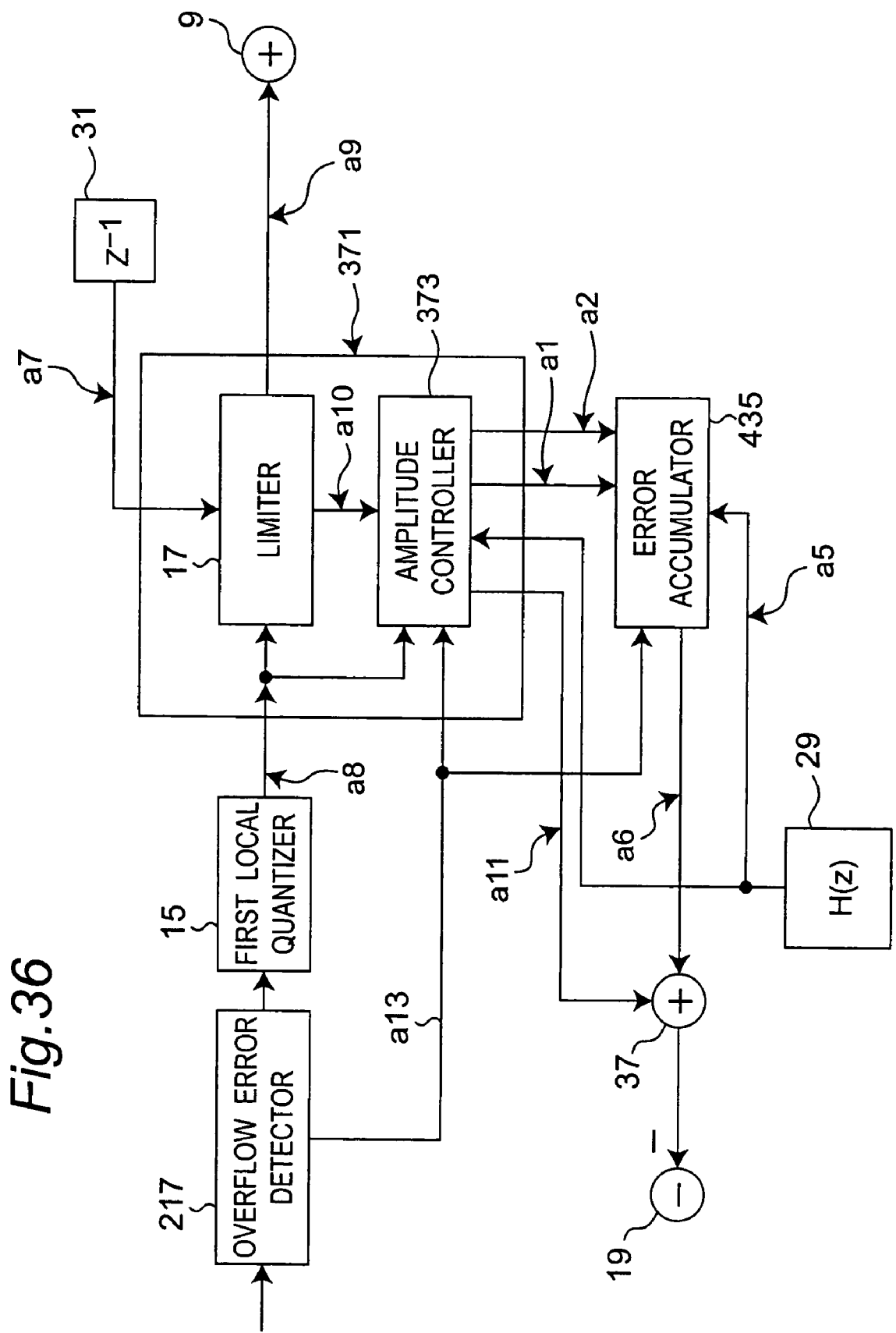
FIG. 36 is a block diagram of the output controller in a variation of the fourth embodiment of the invention.

FIG. 36 is a detailed block diagram of the output controller 371. The output controller 371 has a limiter 17 and an amplitude controller 373. The output controller 371 in this embodiment of the invention differs from the output controller 371 shown in FIG. 26 in that this output controller 371 in this embodiment receives the overflow error a13 from the overflow detector 379, and is otherwise the same as the output controller 371 in FIG. 26.

The input a8 to the limiter 17, a signal a10 denoting the operating condition of the limiter 17, the feedback output a5 from the sub-loop 5, and the overflow error a13 from the overflow error detector 217 are inputted to the amplitude controller 373. The amplitude controller 373 computes the limit error produced by the limiter 17 from the input a8 to the limiter 17 and the signal a10 denoting the operating condition of the limiter 17. The amplitude controller 373 also gets information relating to the sign of the feedback output a5 from the feedback output a5 inputted from the sub-loop 5. Based on the overflow error a13, the first local quantizer output sign signal a10, and the feedback output a5 from the sub-loop 5, the amplitude controller 373 then determines if an overflow will occur if the limit error is applied to the main loop 403a and the sub-loop 5. Based on the result, the amplitude controller 373 outputs limit error within the range that will not cause the main loop 403a and the sub-loop 5 to overflow as the output a11 to the adder 37, and outputs the remaining limit error to the error accumulator 35 as the new limit error a2.

The amplitude controller 373 determines the error all output to the adder 37 using the same basic process determining the error output of the error accumulator 435 in the multi stage noise shaping quantizer 401 described above. More specifically, the amplitude controller 373 outputs (a11) error to the adder 37 in a range of values that will not cause the main loop 403a and sub-loop 5 to overflow based on whether the sign of the feedback output a5 of the sub-loop 5 and the sign of the output from the adder 11 are the same or different. The error not outputted from the amplitude controller 373 to the adder 37 is outputted to the error accumulator 435 as the new error (a2) as in the multi stage noise shaping quantizer 401 described above. Note that the amplitude controller 373 may be configured with units which correspond to the first and second operating condition detectors 443 and 445 in the error accumulator 435 (FIG. 33) so that the amplitude controller 373 can get information on operating conditions of the overflow error detector 217 and the limiter 17, respectively.

Figure 37:
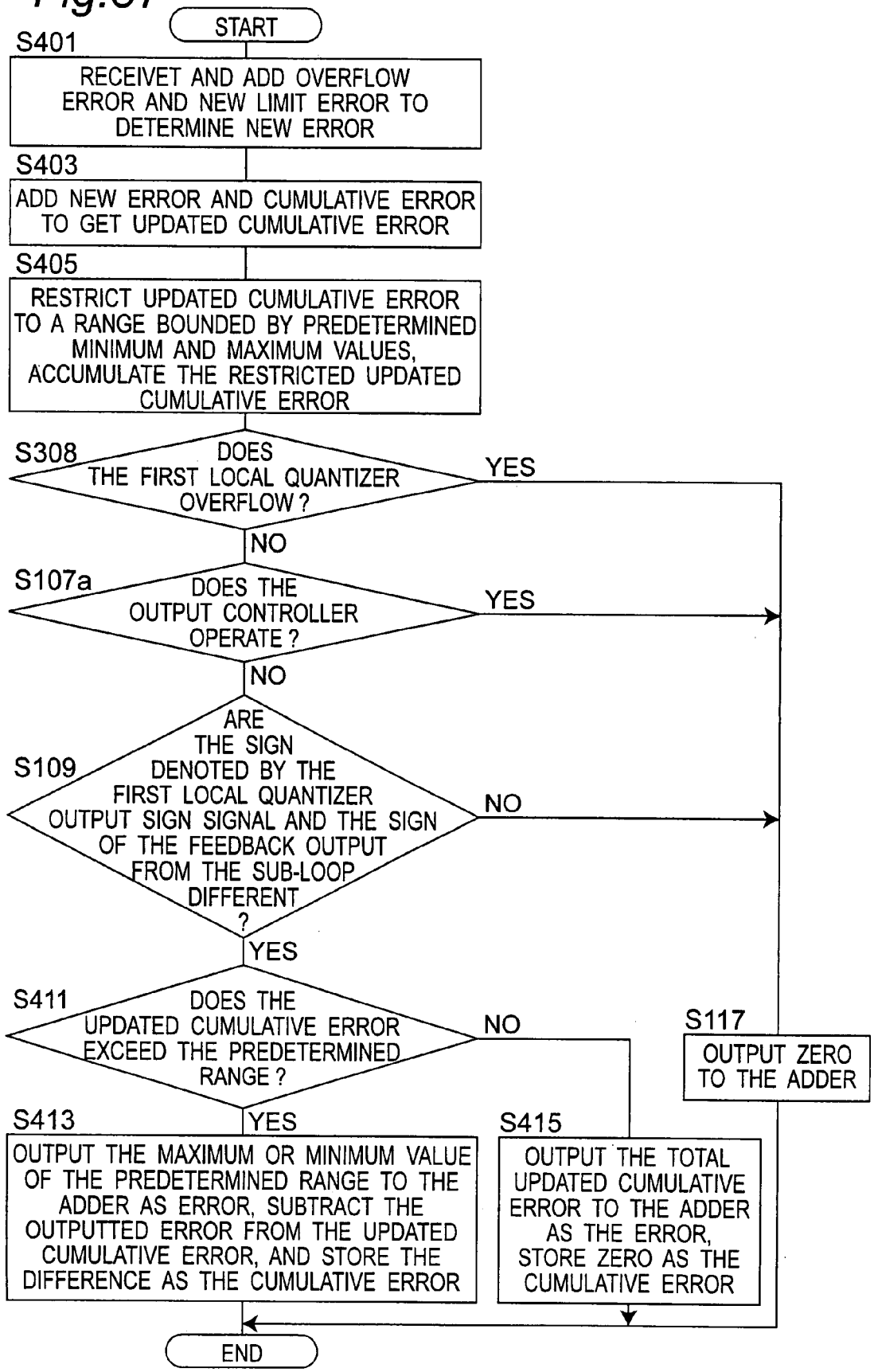
FIG. 37 is a flow chart describing the operation of the variation of the fourth embodiment of the invention.

FIG. 37 is a flow chart describing the operation of the error accumulator 435 in this multi stage noise shaping quantizer 401a. Steps that are the same as in this flow chart and the flow charts described above are identified by the same reference numerals and further description thereof is omitted.

In step S107a the error accumulator 435 determines the operating condition of the output controller 371. If the error accumulator 435 determines that the output controller 371 operates (step S107a returns Yes), control goes to step S117. If the error accumulator 435 determines that the output controller 371 does not operate (step S107a returns No), control goes to step S109.

By using an output controller 371 having an amplitude controller 373, the multi stage noise shaping quantizer 401a according to this embodiment of the invention outputs a part of the limit error resulting from output amplitude limiting by the limiter 17 according to the condition of the main loop 403a and the sub-loop 5. The amount of error accumulated in the error accumulator 435 can therefore be reduced and a good signal distortion factor can be maintained.

(Single-integration Noise Shaping Quantizer)

This embodiment of the invention has been described using multi stage noise shaping quantizers 401 and 401a by way of example, but the invention can also be used in a single integration noise shaping quantizer having a single loop.

Figure 38:
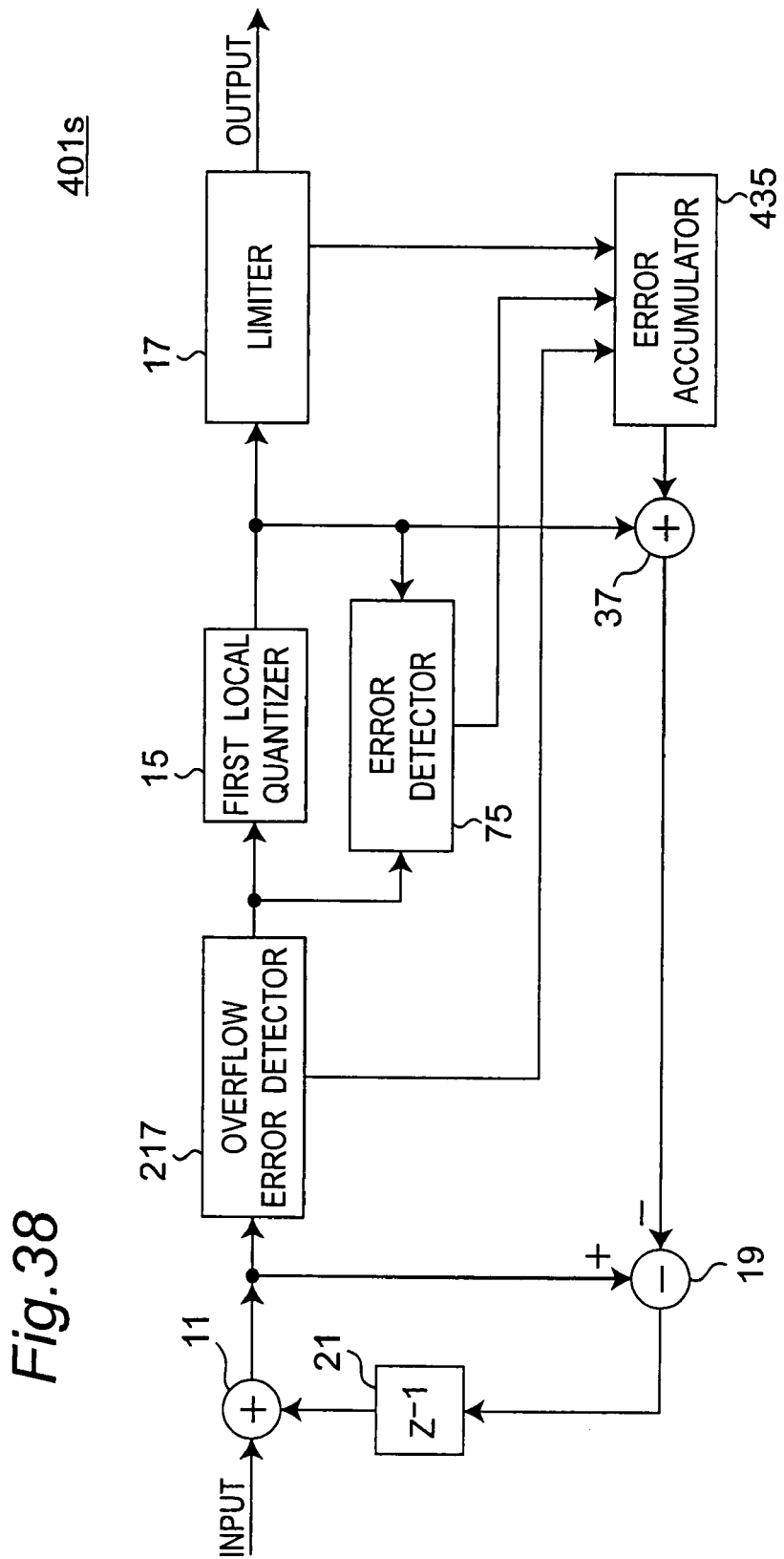
FIG. 38 is a block diagram of the single integration noise shaping quantizer in the fourth embodiment of the invention.

FIG. 38 is a block diagram of a single integration noise shaping quantizer 401s. This single integration noise shaping quantizer 401s has the same effect as the multi stage noise shaping quantizers 401 and 401a described above with respect to the object of the invention. This single integration noise shaping quantizer 401s is described below. Note that like parts in this and the preceding embodiments are identified by the same reference numerals and further description thereof is omitted.

The single integration noise shaping quantizer 401s shown in FIG. 38 differs from the multi stage noise shaping quantizer 401 shown in FIG. 32 in that there is no sub-loop and no feedback from a sub-loop to the error accumulator 435, an error detector 75 for detecting quantization error occurring during quantization by the first local quantizer is added, the output from the error detector 75 is inputted to the error accumulator 435, and the limiter 17 does not input a first local quantizer output sign signal to the error accumulator 435.

This single integration noise shaping quantizer 401s has an adder 11, an overflow error detector 217, a first local quantizer 15, a limiter 17, an error accumulator 435, an error detector 75, an adder 37, a subtractor 19, and a delay element 21, and is a single integration noise shaping quantizer affording first-order noise shaping.

The operation of the error detector 75 and the overflow error detector 217 are as described above and further description thereof is omitted here.

Figure 39:
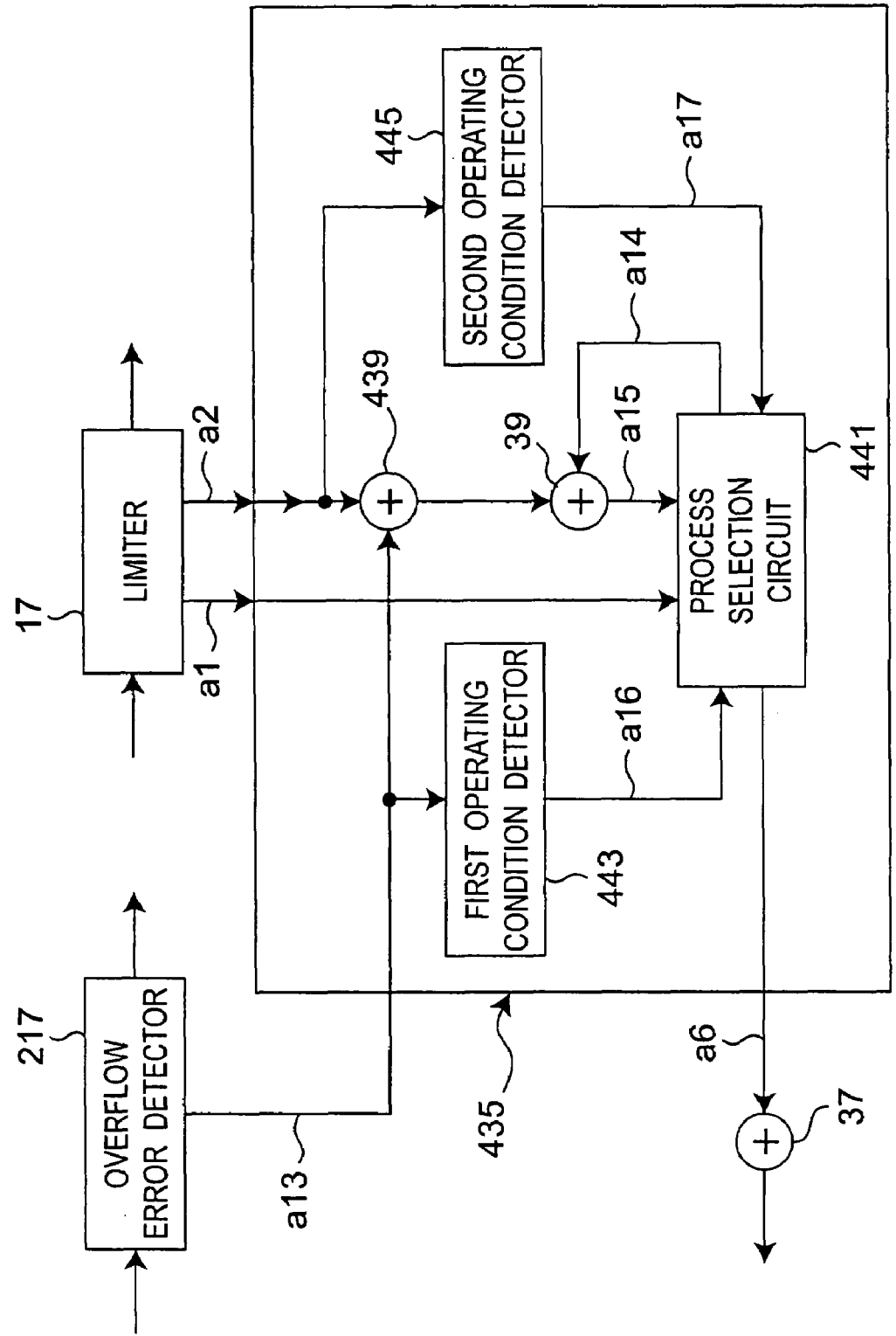
FIG. 39 is a block diagram of the error accumulator in the single integration noise shaping quantizer according to the fourth embodiment of the invention.

FIG. 39 is a block diagram of the error accumulator 435. Like parts in FIG. 39 and the error accumulator 435 shown in FIG. 33 are identified by the same reference numerals and further description thereof is omitted. The operation of the error accumulator 435 differs according to whether the error detector 75 detects the sign of the quantization error from the first local quantizer 15 or calculates the value of the quantization error from the first local quantizer 15. Operation of the error accumulator 435 is therefore described for both cases.

The operation of the error accumulator 435 when the error detector 75 detects the sign of the quantization error from the first local quantizer 15 is described first. The error accumulator 435 reads the limiter operating condition signal a17 outputted by the second operating condition detector 445 to determine if the limiter 17 is operating. The error accumulator 435 also reads the overflow detection signal a16 outputted by the first operating condition detector 443 to determine if the first local quantizer 15 is in an overflow condition. The error accumulator 435 then compares the sign of the updated cumulative error with the sign denoted by the quantization error sign signal a12 inputted from the error detector 75 and determines if the signs are the same or different. The error accumulator 435 determines the output (error a6) to the adder 37 based on whether these compared signs are the same or different, and whether the first local quantizer 15 is in an overflow condition. If the first local quantizer 15 is overflowing, the error accumulator 435 does not output to the adder 37. If a first local quantizer 15 overflow is not detected, the new error is zero, and the compared signs are different, the error accumulator 435 outputs the error a6 to the adder 37.

If the signs are different, a first local quantizer 15 overflow condition is not detected, and the new error is zero, the error a6 outputted by the error accumulator 435 to the adder 37 is less than or equal to the quantization error portion 77 (see FIG. 12). Note that the step of determining whether the limiter 17 is operating is not essential.

Figure 40:
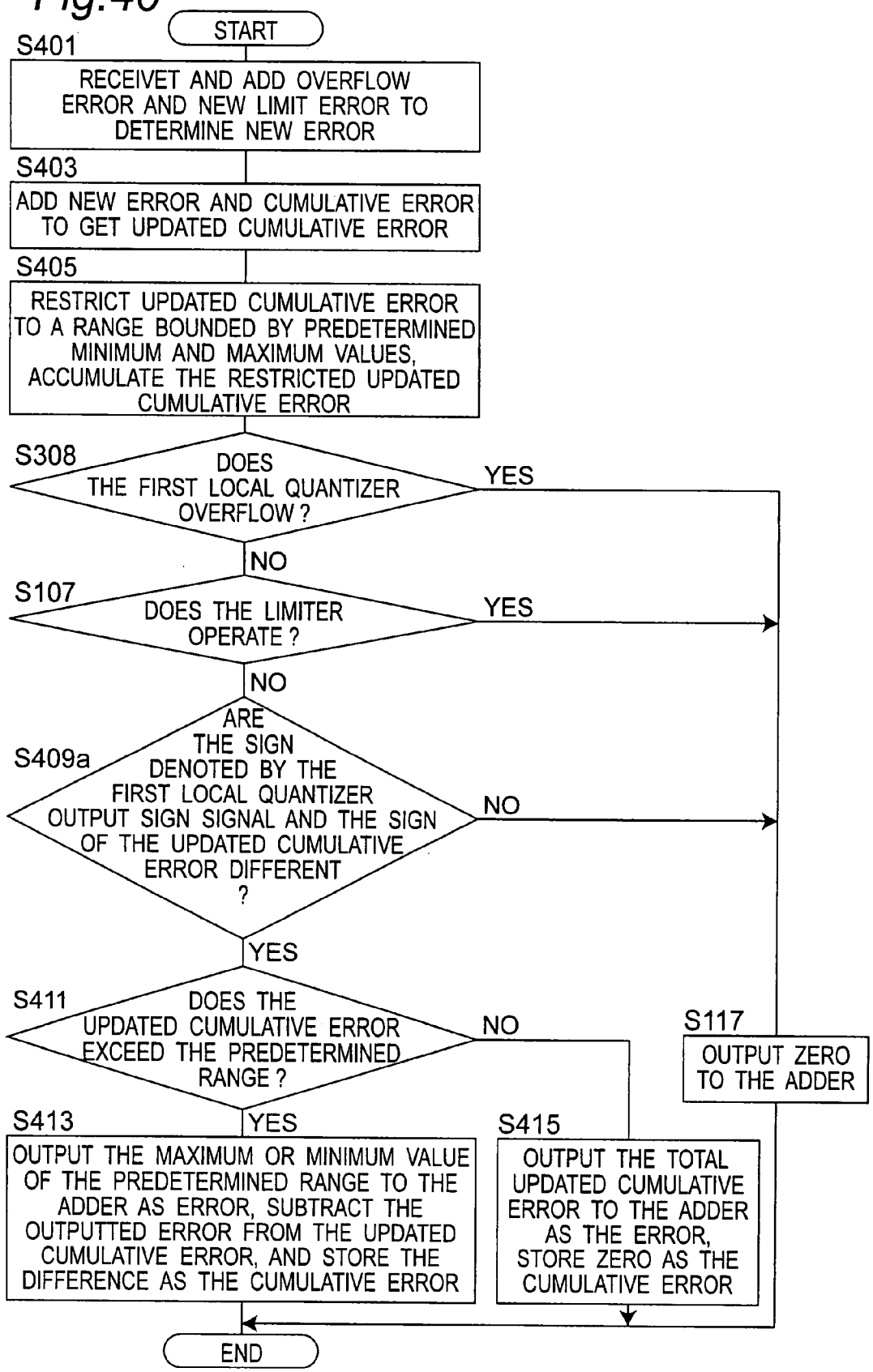
FIG. 40 is a flow chart describing the operation of the single integration noise shaping quantizer according to the fourth embodiment of the invention.

FIG. 40 is a flow chart describing the operation of the error accumulator 435 when the error detector 75 detects the sign of the quantization error from the first local quantizer 15. Identical steps in this and the previously described flow charts are identified by the same reference numerals and further description thereof is omitted.

In step S409a, the error accumulator 435 compares the sign denoted by the quantization error sign signal received from the error detector 75 and the sign of the updated cumulative error. If the signs are the same (step S409a returns No), control goes to step S117. If the signs are different (step S409a returns Yes), control goes to step S411.

Step S409a more specifically compares the sign of the error accumulated in the process selection circuit 441 (either the updated cumulative error or the cumulative error) and the sign of the quantization error from the first local quantizer 15, and determines if the quantization error portion 61 of the input range 51 is used.

Figure 34:
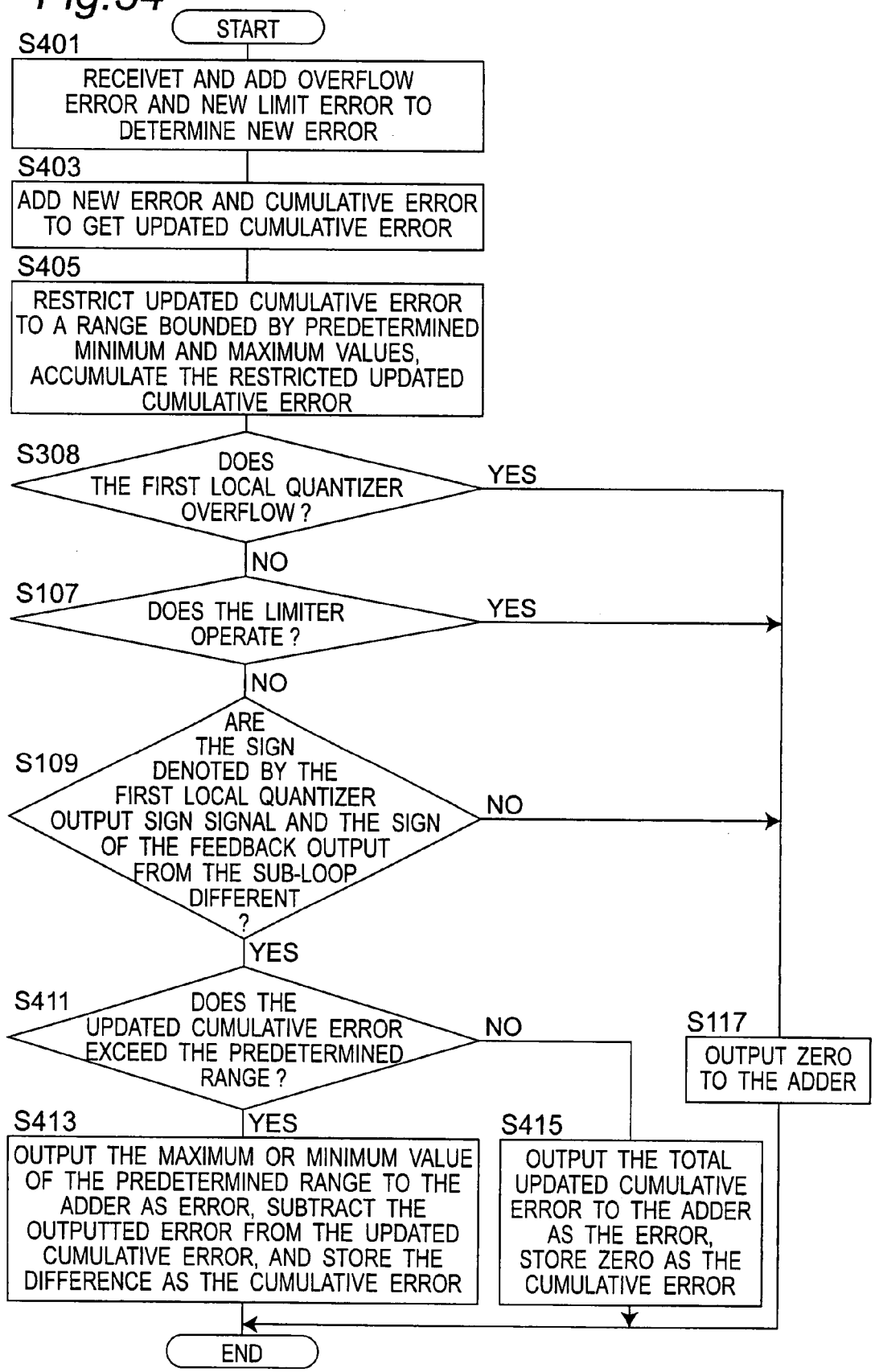
FIG. 34 is a flow chart describing the operation of the multi stage noise shaping quantizer according to the fourth embodiment of the invention.

The steps other than step S409a are the same as shown in FIG. 34.

The operation of the error accumulator 435 when the error detector 75 calculates the value of the quantization error from the first local quantizer 15 is described next. The margin portion is again assumed to be zero in this case.

The error accumulator 435 references the overflow detection signal a16 to determine if the first local quantizer 15 will overflow, and does not output error a6 to the adder 37 if the first local quantizer 15 will overflow.

If the error accumulator 435 determines that the first local quantizer 15 will not overflow based on the overflow detection signal a16, the error accumulator 435 subtracts the quantization error denoted by signal a13 from the quantization error portion 61 to determine the amount of error that can be outputted to the adder 37, and outputs error a6 to the adder 37 within the limits of the updated cumulative error.

Figure 41:
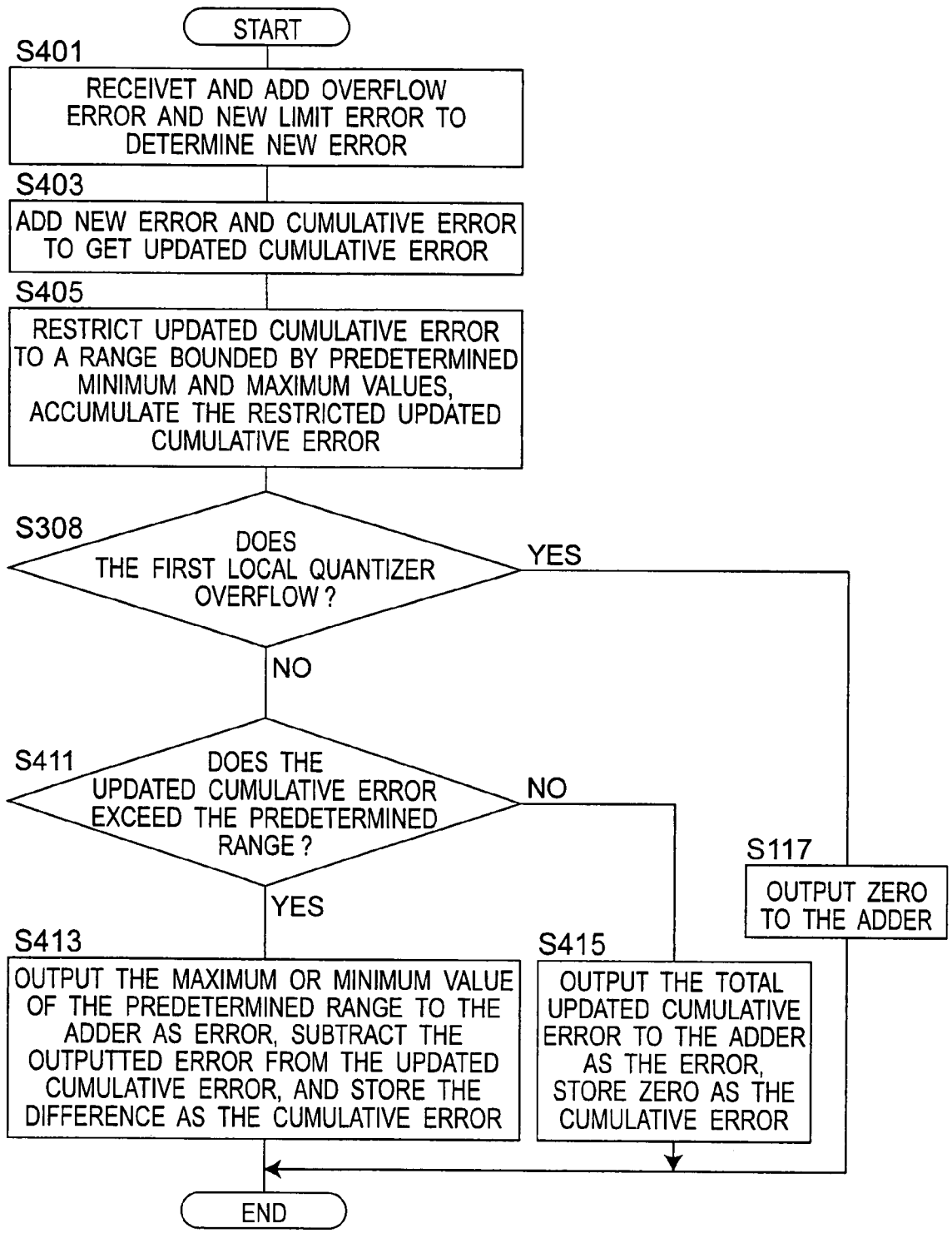
FIG. 41 is a flow chart describing the operation of the single integration noise shaping quantizer according to the fourth embodiment of the invention.

FIG. 41 is a flow chart describing the operation of the error accumulator 435 when the error detector 75 calculates the value of the quantization error from the first local quantizer 15. Steps that are the same in this flow chart and the previously described flow charts are identified by the same reference numerals and further description thereof is omitted.

Step S107 and step S109 in FIG. 34 are omitted from the flow chart in FIG. 41.

The other steps are the same as in the flow chart in FIG. 34.

The error accumulator 435 determines output a6 based on the overflow error a13 outputted from the overflow error detector 217 (that is, the operating condition of the first local quantizer 15) and the limit error a2 produced by the limiter 17.

As described above, the error accumulator 435 in this single integration noise shaping quantizer 401s can accumulate the limit error resulting from output amplitude limiting by the limiter 17 and the overflow error outputted from the overflow error detector 217. Based on the newly introduced error, the sign of the accumulated error, and the sign or value of the quantization error, the accumulated error is then fed back to the first local quantizer 15. As a result, the loop can be kept stable and a drop in the signal distortion factor can be suppressed by appropriately feeding back the error caused by output amplitude limiting or the compensation output at a later clock.

In addition, by controlling the error that is fed back and stabilizing the loop, the margin portion of the input range 51 to the first local quantizer 15 can also be eliminated, or the size of the margin relative to the input range 51 can be minimized. The proportion of the input range 51 to the first local quantizer 15 that is allocated to the input signal portion 63 can therefore be increased, and the dynamic range of the input signal, such as an audio signal, can be increased.

The invention is described above using a single integration quantizer by way of example, but the same method can be applied in a second-order or higher order noise shaping quantizer that does not have a sub-loop.

The invention is not limited to the arrangements described above and can be applied to any limiter that produces error, any overflow error detector that limits and divides signals at a predetermined level, and any error accumulator that accumulates error produced by a limiter or an overflow error detector.

A noise shaping quantizer according to the present invention improves stability, increases the output signal amplitude, and reduces the distortion factor. The processing method of the invention when there is an input overload effectively improves the stability of the noise shaping quantizer and suppresses deterioration in the distortion factor of the output signal when the input signal level is high. The invention is particularly well suited to controlling headphone output in portable audio devices, for example.

This application references the patent application titled "Multi Stage Noise Shaping Quantizer" which was filed by the present applicant on Jan. 19, 2007 claiming priority based on Japanese Patent Application JP-2006-011978, further references Japanese Patent Application JP-2006-076319 filed in Japan on Mar. 20, 2006, and incorporates by reference in entirety the patent application filed on Jan. 19, 2007 and Japanese Patent Application JP-2006-076319. Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A noise shaping quantizer comprising:
a first noise shaping quantization unit that applies a first noise shaping operation on an input signal;
said first noise shaping quantization unit includes:
a local quantizer that quantizes the input signal and outputs an output signal;
an error accumulator that accumulates at least a part of a value based on the output signal based on at least one of a value based on the input signal and a value based on the output signal, outputs the remaining part, and outputs at least a part of the accumulated value which is based on the output value based on at least one of a value based on another input signal and a value based on another output signal at a later clock;
a subtractor to which the input signal and the output of said error accumulator are inputted;
a delay element to which the output of said subtractor is inputted; and
a first adder that adds the output of said delay element and an input from external, and outputs the sum to said local quantizer.

2. The noise shaping quantizer according to claim 1, wherein:
said first noise shaping quantization unit further includes an error detector that detects quantization error occurring during quantization by said local quantizer; and
the value based on the output signal includes the quantization error in the quantization by said local quantizer, the quantization error being detected by said error detector.

3. The noise shaping quantizer according to claim 2, wherein:
said first noise shaping quantization unit further includes a limiter that limits an output amplitude of the output signal; and the value based on the output signal includes limit error from output amplitude limiting by said limiter.

4. The noise shaping quantizer according to claim 1, wherein:
said first noise shaping quantization unit further includes an overflow error detector that checks the input signal, subtracts an overflow amount which causes said local quantizer to overflow from the input signal, outputs the subtracted input signal to said local quantizer, and outputs the overflow amount to said error accumulator; and
the value based on the input signal includes the overflow amount.

5. The noise shaping quantizer according to claim 1, wherein:
said first noise shaping quantization unit further includes an overflow detector that checks the input signal and outputs to said error accumulator a signal denoting whether said local quantizer is in an overflow condition; and
the value based on the input signal includes the signal denoting whether said local quantizer is in the overflow condition.

6. The noise shaping quantizer according to claim 1, further comprising:
a second noise shaping quantization unit to which error occurring in the first noise shaping operation is inputted and that applies a second noise shaping operation to the inputted error;
a differentiator that differentiates an output of said second noise shaping quantization unit according to the shaping order of said first noise shaping quantization unit; and
a second adder that adds an output of said first noise shaping quantization unit and an output of said differentiator, and outputs a result;
wherein said second noise shaping quantization unit outputs as feedback output to said first noise shaping quantization unit a value based on the second noise shaping operation;
said first noise shaping quantization unit further includes a limiter that limits an output amplitude of the output signal,
said limiter limits an output amplitude of the value based on the output signal based on the output of the differentiator; and
the value based on the output signal includes limit error produced by output amplitude limiting by said limiter, and the feedback output.

7. The noise shaping quantizer according to claim 6, wherein:
said first noise shaping quantization unit further includes an overflow error detector that checks the input signal, subtracts an overflow amount which causes said local quantizer to overflow from the input signal, outputs the subtracted input signal to said local quantizer, and outputs the overflow amount to said error accumulator; and
the value based on the input signal includes the overflow amount.

8. The noise shaping quantizer according to claim 6, wherein:
said first noise shaping quantization unit further includes an overflow detector that checks the input signal and outputs to said error accumulator a signal denoting whether said local quantizer is in an overflow condition; and
the value based on the input signal includes the signal denoting whether said local quantizer is in the overflow condition.

9. The noise shaping quantizer according to claim 6, wherein:
said first noise shaping quantization unit further includes an amplitude controller that limits a size of a portion of the limit error occurring during output amplitude limiting by said limiter that is inputted to said second noise shaping quantization unit based on the output of said differentiator and the feedback output.

* * * * *